(12) United States Patent
Park et al.

(10) Patent No.: US 12,426,308 B2
(45) Date of Patent: Sep. 23, 2025

(54) SEMICONDUCTOR DEVICE

(71) Applicant: Samsung Electronics Co., Ltd., Suwon-si (KR)

(72) Inventors: Beomjin Park, Hwaseong-si (KR); Myung Gil Kang, Suwon-si (KR); Dongwon Kim, Seongnam-si (KR); Keun Hwi Cho, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 633 days.

(21) Appl. No.: 17/651,623

(22) Filed: Feb. 18, 2022

(65) Prior Publication Data

US 2022/0399452 A1 Dec. 15, 2022

(30) Foreign Application Priority Data

Jun. 14, 2021 (KR) .......................... 10-2021-0076436

(51) Int. Cl.
*H01L 29/423* (2006.01)
*H01L 29/06* (2006.01)
(Continued)

(52) U.S. Cl.
CPC ..... *H10D 30/6735* (2025.01); *H10D 30/6757* (2025.01); *H10D 62/118* (2025.01); *H10D 64/517* (2025.01)

(58) Field of Classification Search
CPC ........... H01L 29/42392; H01L 29/0665; H01L 29/42372; H01L 29/78696; H01L 29/161;
(Continued)

(56) References Cited

U.S. PATENT DOCUMENTS 7,274,051 B2  9/2007  Kim et al.
10,083,874 B1  9/2018  Yu et al.
(Continued)

FOREIGN PATENT DOCUMENTS

CN        115206976 A    10/2022
KR  10-2020-0137256 A    12/2020
(Continued)

OTHER PUBLICATIONS

Intellectual Property Office of Singapore Patent Journal, No. PT012/2022B, Nov. 29, 2022; citing SG Patent Application No. 10202112761Y, filed Nov. 17, 2021 (2 pages, with English abstract).
(Continued)

*Primary Examiner* — Tong-Ho Kim
(74) *Attorney, Agent, or Firm* — Wolf, Greenfield & Sacks, P.C.

(57) ABSTRACT

A semiconductor device may include a first active pattern on a substrate, a pair of first source/drain patterns on the first active pattern and a first channel pattern between the first source/drain patterns, the first channel pattern including first semiconductor patterns, which are spaced apart from each other in a stacked formation, a gate electrode on the first channel pattern, a first gate cutting pattern adjacent to the first channel pattern that penetrates the gate electrode, and a first spacer pattern between the first gate cutting pattern and the first channel pattern. The first spacer pattern may include a first remaining pattern adjacent to an outermost side surface of at least one of the first semiconductor patterns and a second remaining pattern on the first remaining pattern. The second remaining pattern may be spaced apart from the first gate cutting pattern.

19 Claims, 44 Drawing Sheets

(51) Int. Cl.
*H01L 29/786* (2006.01)
*H10D 30/67* (2025.01)
*H10D 62/10* (2025.01)
*H10D 64/27* (2025.01)

(58) Field of Classification Search
CPC .......... H01L 21/823437; H01L 27/088; H01L 29/0673; H01L 29/0847; H01L 29/41766; H01L 29/66439; H01L 29/66545; H01L 29/7848; H01L 21/823481; H01L 21/823864; H01L 29/165; H01L 29/775; H01L 23/481; H01L 21/76895; H01L 23/5226; H01L 23/5283; H01L 21/823468; H01L 21/823412; H01L 21/823418; H01L 29/4983; B82Y 10/00
USPC ........................................................ 257/401
See application file for complete search history.

(56) References Cited

U.S. PATENT DOCUMENTS

| | | | |
|---|---|---|---|
| 10,510,620 B1 | 12/2019 | Chanemougame et al. | |
| 10,586,860 B2 | 3/2020 | Shu et al. | |
| 10,672,910 B2 | 6/2020 | Zhou et al. | |
| 10,832,916 B1 | 11/2020 | Xie et al. | |
| 2019/0348414 A1 | 11/2019 | Hong et al. | |
| 2020/0066725 A1 | 2/2020 | Bhuwalka et al. | |
| 2021/0028068 A1 | 1/2021 | Dentoni Litta et al. | |
| 2021/0118875 A1* | 4/2021 | Wu | H01L 21/0228 |
| 2021/0343600 A1* | 11/2021 | Chen | H10D 62/121 |
| 2022/0328496 A1* | 10/2022 | Kang | H01L 21/823481 |

FOREIGN PATENT DOCUMENTS

| | | |
|---|---|---|
| KR | 1020220141944 A | 10/2022 |
| TW | 202240857 A | 10/2022 |

OTHER PUBLICATIONS

Official Journal of the Indian Patent Office, Issue No. 41/2022, Oct. 14, 2022; citing IN Patent Application No. 202124049496 A, filed Oct. 29, 2021 (2 pages, with English abstract).

* cited by examiner

FIG. 1
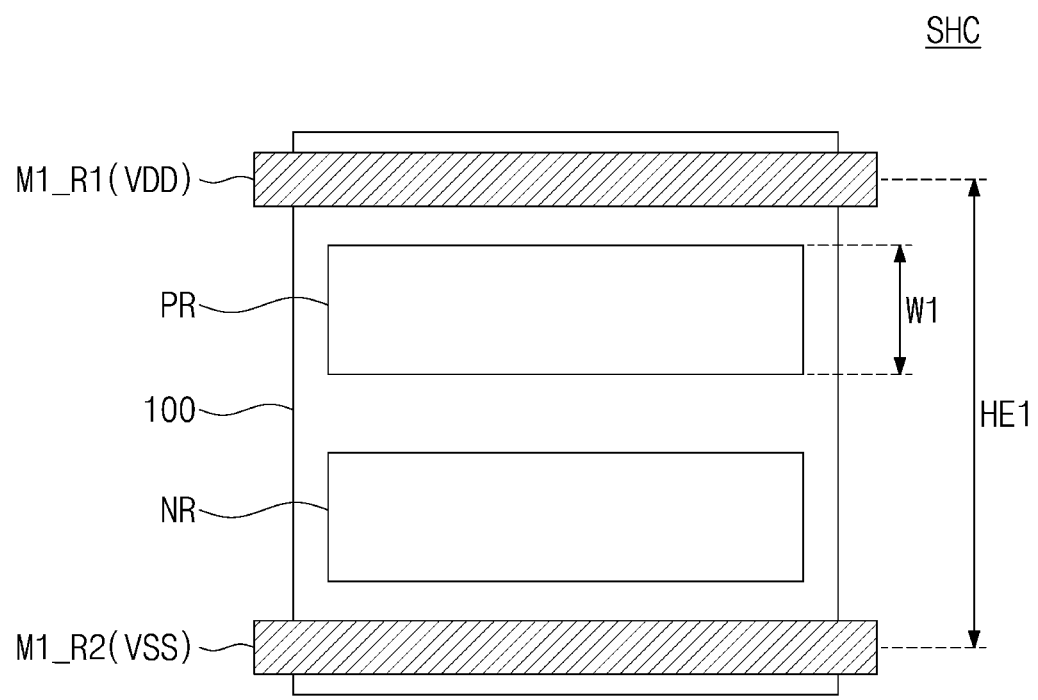
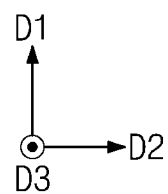

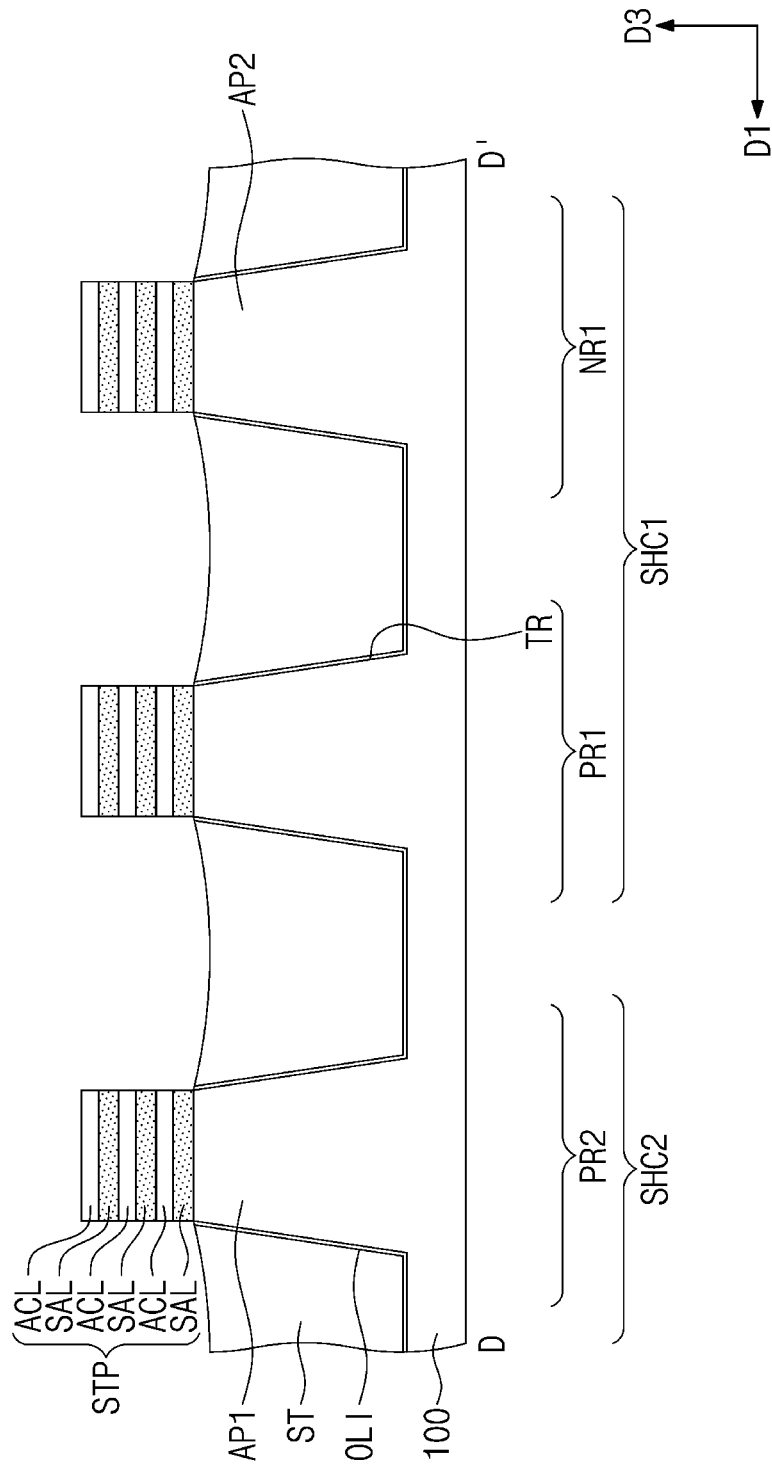

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2021-0076436, filed on Jun. 14, 2021, in the Korean Intellectual Property Office, the entire contents of which are hereby incorporated by reference.

BACKGROUND OF THE INVENTION

The present disclosure relates to a semiconductor device, and in particular, to a semiconductor device including a field effect transistor.

A semiconductor device may include an integrated circuit consisting of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to address technical limitations associated with the scale-down of the semiconductor device and to realize high-performance semiconductor devices.

SUMMARY

An embodiment of the inventive concept may provide a semiconductor device with improved electrical characteristics.

According to an embodiment of the inventive concept, a semiconductor device may include a first active pattern on a substrate, a pair of first source/drain patterns on the first active pattern and a first channel pattern between the first source/drain patterns, the first channel pattern including first semiconductor patterns, which are spaced apart from each other in a stacked formation, a gate electrode on the first channel pattern, a first gate cutting pattern adjacent to the first channel pattern that penetrates the gate electrode, and a first spacer pattern between the first gate cutting pattern and the first channel pattern. The first spacer pattern may include a first remaining pattern adjacent to an outermost side surface of at least one of the first semiconductor patterns and a second remaining pattern on the first remaining pattern. The second remaining pattern may be spaced apart from the first gate cutting pattern.

According to an embodiment of the inventive concept, a semiconductor device may include a first active pattern and a second active pattern on a substrate, a pair of first source/drain patterns on the first active pattern and a first channel pattern between the first source/drain patterns, a pair of second source/drain patterns on the second active pattern and a second channel pattern between the second source/drain patterns, each of the first and second channel patterns including semiconductor patterns, which are spaced apart from each other in a stacked formation, a gate electrode on the first and second channel patterns, a first gate cutting pattern adjacent to the first channel pattern that penetrates the gate electrode, and a first spacer pattern between the first gate cutting pattern and the first channel pattern. The first spacer pattern may include a first remaining pattern adjacent to an outermost side surface of at least one of the semiconductor patterns and a second remaining pattern on the first remaining pattern. The first and second remaining patterns may include different materials from each other, and the gate electrode may include a first extended portion, which is in an upper portion thereof and overlaps the first spacer pattern in a direction generally perpendicular to a plane defined by the substrate.

According to an embodiment of the inventive concept, a semiconductor device may include a first active pattern and a second active pattern on a substrate, a pair of first source/drain patterns on the first active pattern and a first channel pattern between the first source/drain patterns, a pair of second source/drain patterns on the second active pattern and a second channel pattern between the second source/drain patterns, each of the first and second channel patterns including semiconductor patterns, which are spaced apart from each other in a stacked formation, a gate electrode on the first and second channel patterns, a gate insulating layer interposed between the first and second channel patterns and the gate electrode, a gate spacer on at least one side surface of the gate electrode, a first gate cutting pattern provided adjacent to the first channel pattern that penetrates the gate electrode, a second gate cutting pattern adjacent to the second channel pattern that penetrates the gate electrode, a first spacer pattern between the first gate cutting pattern and the first channel pattern, a gate capping pattern on the gate electrode and the first and second gate cutting patterns, an interlayer insulating layer on the gate capping pattern, an active contact that penetrates the interlayer insulating layer and electrically connected to at least one of the first and second source/drain patterns, a gate contact that penetrates the interlayer insulating layer and the gate capping pattern and electrically connected to the gate electrode, a first metal layer on the interlayer insulating layer, the first metal layer including first and second power lines, which are on the first and second gate cutting patterns, respectively, and first interconnection lines, which are provided between the first and second power lines, the first interconnection lines being electrically connected to the active contact and the gate contact, and a second metal layer on the first metal layer. The second metal layer may include second interconnection lines, which are electrically connected to the first metal layer. The first spacer pattern may include a first remaining pattern adjacent to an outermost side surface of at least one of the semiconductor patterns of the first channel pattern, and a second remaining pattern on the first remaining pattern. The first and second remaining patterns may include different materials from each other, and the second remaining pattern may be spaced apart from the first gate cutting pattern.

BRIEF DESCRIPTION OF THE DRAWINGS

FIGS. 1 to 3 are conceptual diagrams illustrating logic cells of a semiconductor device according to an embodiment of the inventive concept.

FIGS. 9A to 19D are sectional views illustrating a method of fabricating a semiconductor device according to an embodiment of the inventive concept.

DETAILED DESCRIPTION

Example embodiments of the inventive concepts will now be described more fully with reference to the accompanying drawings, in which example embodiments are shown. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 2:
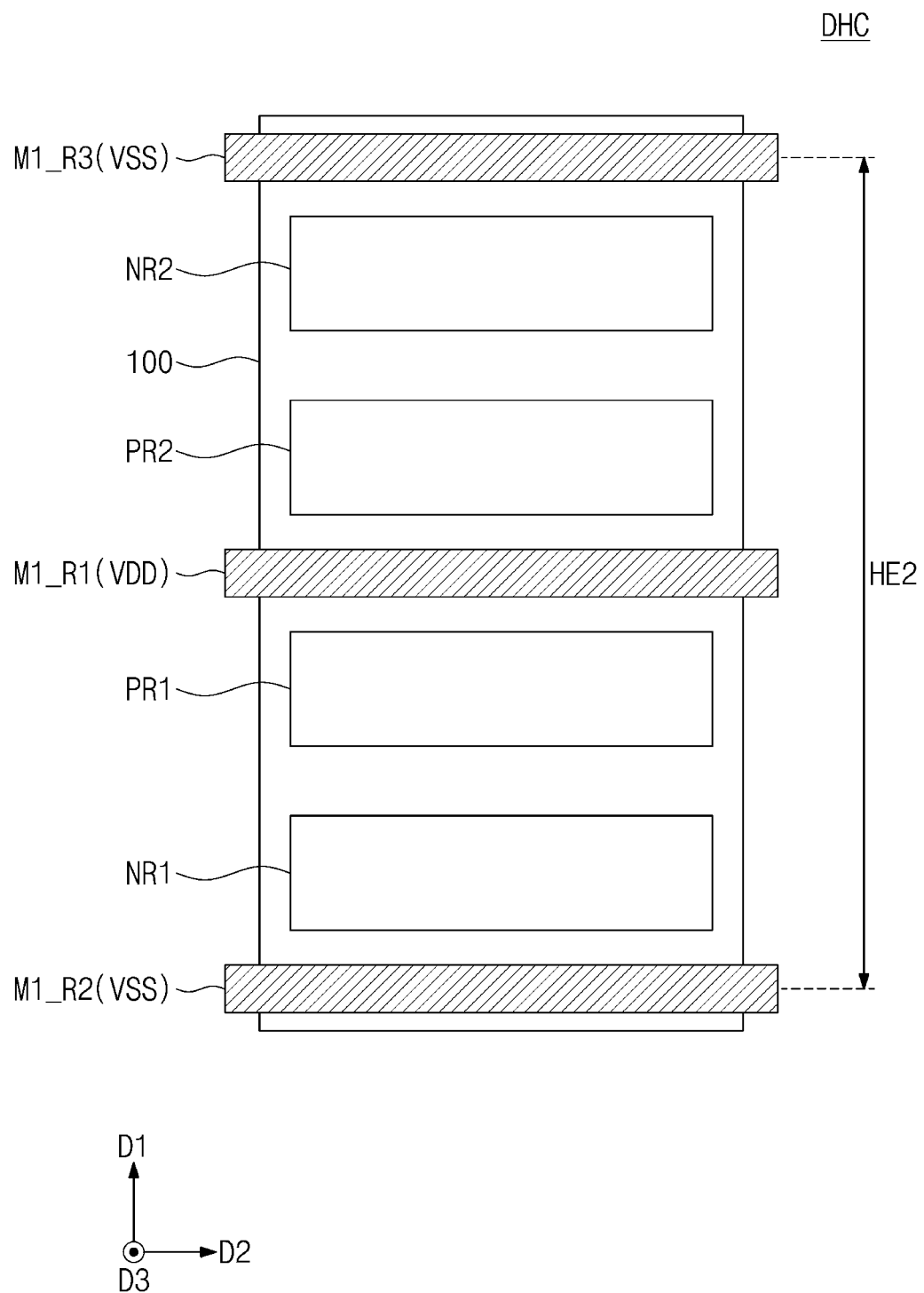
Figure 3:
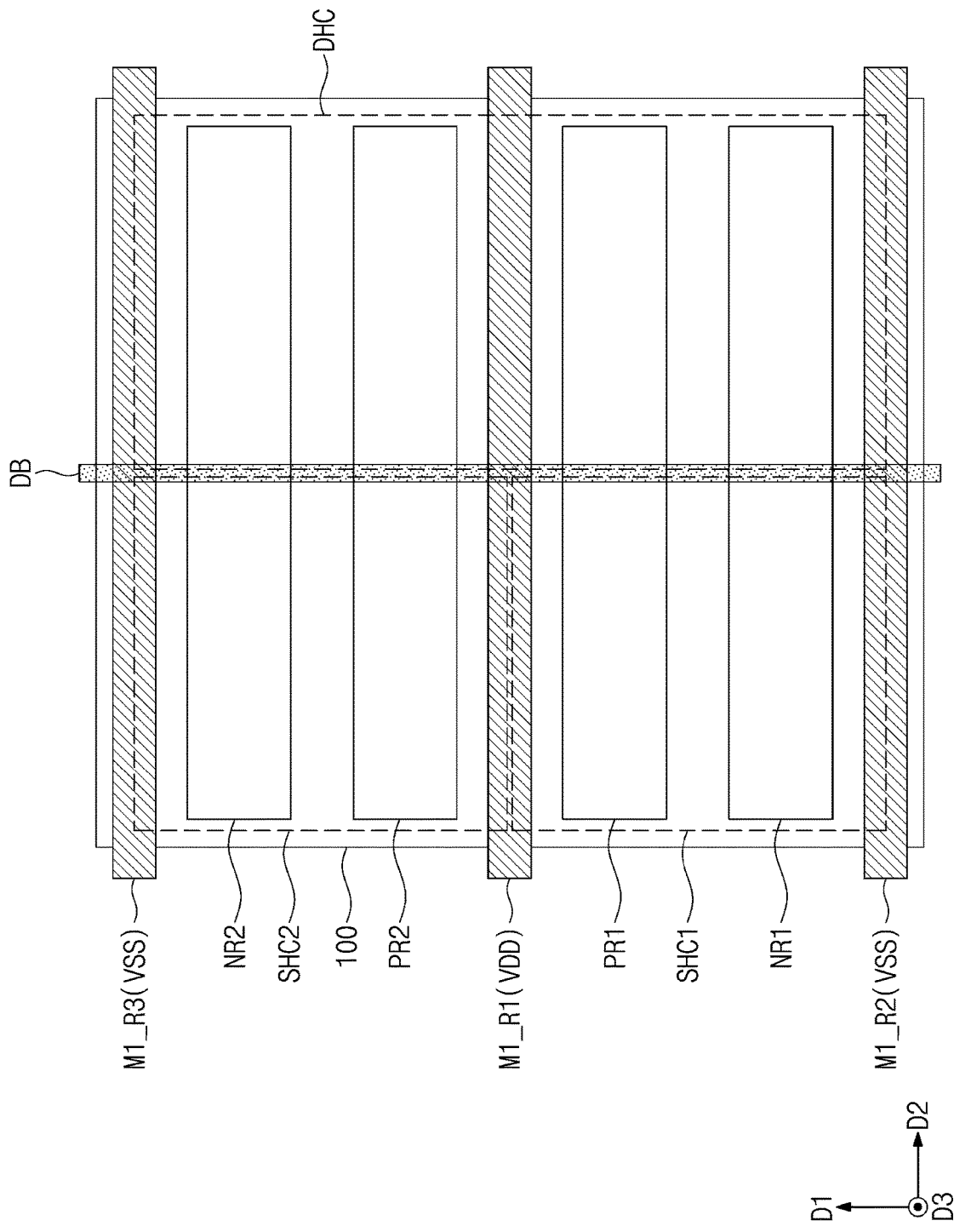

FIGS. 1 to 3 are conceptual diagrams illustrating logic cells of a semiconductor device according to an embodiment of the inventive concept.

Referring to FIG. 1, a single height cell SHC may be provided. In detail, a first power line M1_R1 and a second power line M1_R2 may be provided on a substrate 100. The first power line M1_R1 may be a conduction path, to which a drain voltage VDD (e.g., a power voltage) is provided. The second power line M1_R2 may be a conduction path, to which a source voltage VSS (e.g., a ground voltage) is provided.

The single height cell SHC may be defined between the first and second power lines M1_R1 and M1_R2. The single height cell SHC may include one PMOSFET region PR and one NMOSFET region NR. In other words, the single height cell SHC may have a CMOS structure provided between the first and second power lines M1_R1 and M1_R2.

Each of the PMOSFET and NMOSFET regions PR and NR may have a first width W1 in a first direction D1. A length of the single height cell SHC in the first direction D1 may be defined as a first height HE1. The first height HE1 may be substantially equal to a distance (e.g., a pitch) between centers of the first and second power lines M1_R1 and M1_R2.

The single height cell SHC may constitute a single logic cell. In the present specification, the logic cell may mean a logic device (e.g., AND, OR, XOR, XNOR, inverter, and so forth), which is configured to execute a specific function. In other words, the logic cell may include transistors constituting the logic device and interconnection lines connecting transistors to each other.

Referring to FIG. 2, a double height cell DHC may be provided. In detail, the first power line M1_R1, the second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the drain voltage VDD is provided.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. When viewed in a plan view, the first power line M1_R1 may be disposed between the first and second PMOSFET regions PR1 and PR2.

A length of the double height cell DHC in the first direction D1 may be defined as a second height HE2. The second height HE2 may be about two times the first height HE1 of FIG. 1. The first and second PMOSFET regions PR1 and PR2 of the double height cell DHC may be combined to serve as a single PMOSFET region.

Thus, a channel size of a PMOS transistor of the double height cell DHC may be larger than a channel size of a PMOS transistor of the single height cell SHC previously described with reference to FIG. 1. For example, the channel size of the PMOS transistor of the double height cell DHC may be about two times the channel size of the PMOS transistor of the single height cell SHC. In this case, the double height cell DHC may be operated at a higher speed than the single height cell SHC. In an embodiment, the double height cell DHC shown in FIG. 2 may be defined as a multi-height cell. Although not shown, the multi-height cell may include a triple height cell whose cell height is about three times that of the single height cell SHC.

Referring to FIG. 3, a first single height cell SHC1, a second single height cell SHC2, and the double height cell DHC may be two-dimensionally disposed on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. The active region of the double height cell DHC may be electrically separated from the active region of each of the first and second single height cells SHC1 and SHC2 by the division structure DB.

Figure 4:
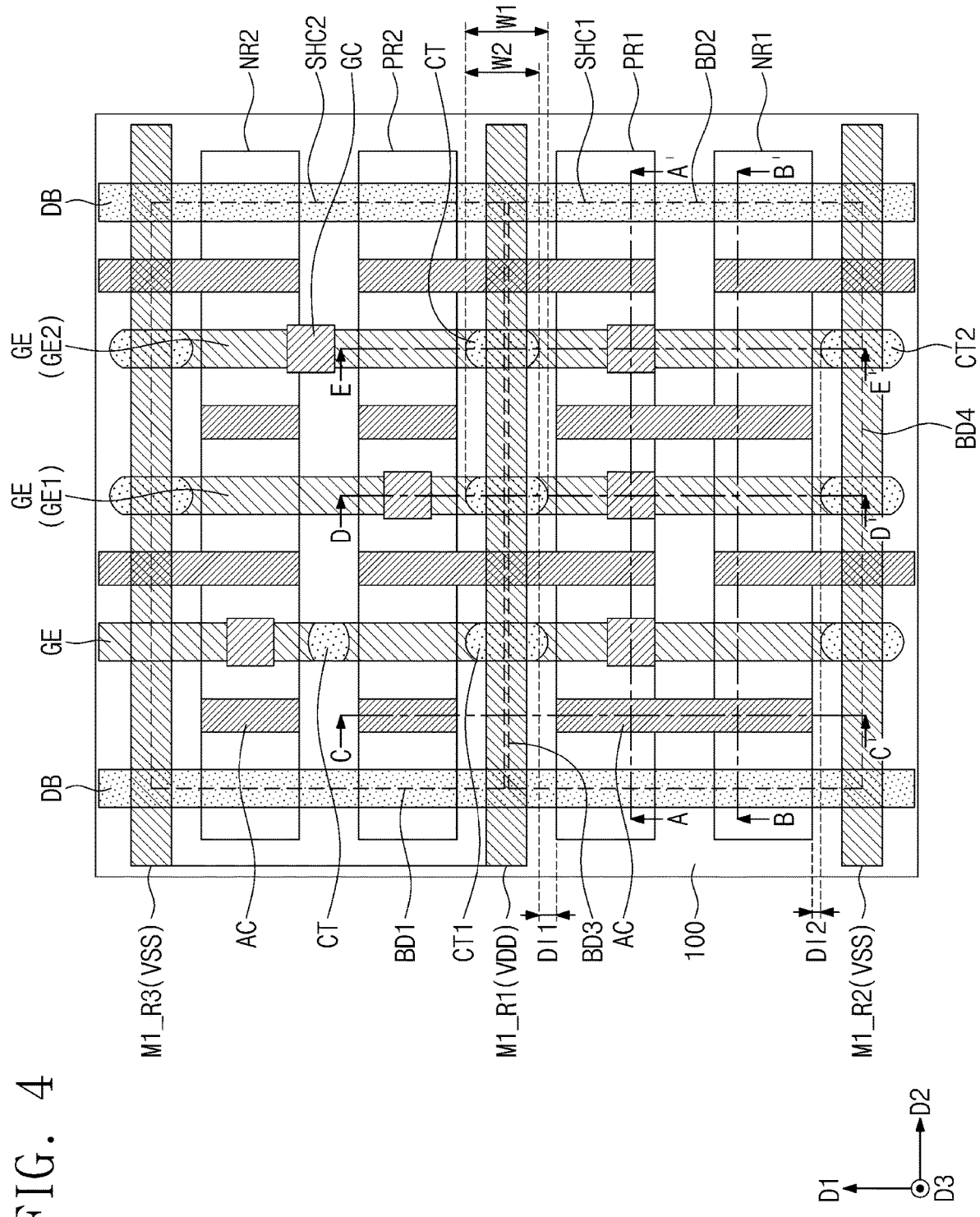
FIG. 4 is a plan view illustrating a semiconductor device according to an embodiment of the inventive concept.

FIG. 4 is a plan view illustrating a semiconductor device according to an embodiment of the inventive concept. FIGS. 5A to 5E are sectional views taken along lines A-A', B-B', C-C', D-D', and E-E' of FIG. 4. FIG. 6 is an enlarged sectional view illustrating an example of a portion 'M' of FIG. 5D. FIGS. 4 and 5A to 5E illustrate an example of a detailed structure of the first and second single height cells SHC1 and SHC2 of FIG. 3.

Referring to FIGS. 4 and 5A to 5E, the first and second single height cells SHC1 and SHC2 may be provided on the substrate 100. Logic transistors constituting the logic circuit may be disposed on each of the first and second single height cells SHC1 and SHC2. The substrate 100 may be a semiconductor substrate that is formed of or includes one or more of silicon, germanium, silicon-germanium, a compound semiconductor material, or the like. In an embodiment, the substrate 100 may be a silicon wafer.

The substrate 100 may include the first PMOSFET region PR1, the second PMOSFET region PR2, the first NMOSFET region NR1, and the second NMOSFET region NR2. Each of the first PMOSFET region PR1, the second PMOSFET region PR2, the first NMOSFET region NR1, and the second NMOSFET region NR2 may be extended in the second direction D2. The first single height cell SHC1 may include the first NMOSFET region NR1 and the first PMOSFET region PR1, and the second single height cell SHC2 may include the second PMOSFET region PR2 and the second NMOSFET region NR2.

A first active pattern AP1 and a second active pattern AP2 may be defined by a trench TR, which is formed in an upper portion of the substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may be extended in the second direction D2. Each of the first and second active patterns AP1 and AP2 may be a vertically-protruding (D3 direction) portion of the substrate 100.

A device isolation layer ST may be provided to at least partially fill the trench TR. The device isolation layer ST may be formed of or include silicon oxide. The device isolation layer ST may not be on or cover first and second channel patterns CH1 and CH2, which will be described below.

A liner layer OLI may be interposed between the first and second active patterns AP1 and AP2 and the device isolation layer ST. The liner layer OLI may be directly on and at least partially cover a side surface of each of the first and second active patterns AP1 and AP2. In other words, the liner layer OLI may be directly on and at least partially cover a side surface of the trench TR. The liner layer OLI may directly cover a bottom surface of the trench TR. For example, the liner layer OLI may include at least one of a silicon oxide layer or a silicon nitride layer. In an embodiment, the liner layer OLI may be formed of or include the same material as the device isolation layer ST, and in this case, there may be no observable interface between the liner layer OLI and the device isolation layer ST.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or include at least one of silicon (Si), germanium (Ge), and/or silicon-germanium (SiGe). In an embodiment, each of the first to third semiconductor patterns SP1, SP2, and SP3 may be formed of or include crystalline silicon.

A plurality of first source/drain patterns SD1 may be provided on the first active pattern AP1. The first source/drain patterns SD1 may be provided in first recesses RS1, respectively, which are formed in an upper portion of the first active pattern AP1. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked semiconductor patterns (i.e., the first to third semiconductor patterns SP1, SP2, and SP3).

A plurality of second source/drain patterns SD2 may be provided on the second active pattern AP2. The second source/drain patterns SD2 may be provided in second recesses RS2, respectively, which are formed in an upper portion of the second active pattern AP2. The second source/drain patterns SD2 may be impurity regions of a second conductivity type (e.g., n-type). The second channel pattern CH2 may be interposed between each pair of the second source/drain patterns SD2. In other words, the pair of the second source/drain patterns SD2 may be connected to each other by the stacked semiconductor patterns (i.e., the first to third semiconductor patterns SP1, SP2, and SP3).

The first and second source/drain patterns SD1 and SD2 may be epitaxial patterns, which are formed by a selective epitaxial growth (SEG) process. As an example, each of the first and second source/drain patterns SD1 and SD2 may have a top surface that is located at substantially the same level as a top surface of the third semiconductor pattern SP3 in a cross-sectional view. In other embodiments, the top surface of each of the first and second source/drain patterns SD1 and SD2 may be higher than the top surface of the third semiconductor pattern SP3 where the substrate 100 comprises a base reference plane.

The first source/drain patterns SD1 may be formed of or include a semiconductor material (e.g., SiGe) having a lattice constant greater than that of the substrate 100. In this case, the pair of the first source/drain patterns SD1 may exert a compressive stress on the first channel patterns CH1 therebetween. The second source/drain patterns SD2 may be formed of or include the same semiconductor material (e.g., Si) as the substrate 100.

Each of the first source/drain patterns SD1 may include a first semiconductor layer SEL1 and a second semiconductor layer SEL2, which are sequentially stacked. The first semiconductor layer SEL1 may be on and at least partially cover an inner surface of a first recess RS1. The first semiconductor layer SEL1 may have a decreasing thickness in an upward direction (D3 direction). For example, the thickness of the first semiconductor layer SEL1, which is measured in the third direction D3 at the bottom level of the first recess RS1, may be larger than the thickness of the first semiconductor layer SEL1, which is measured in the second direction D2 at the top level of the first recess RS1. The first semiconductor layer SEL1 may have a 'U'-shaped section, due to a sectional profile of the first recess RS1. The second semiconductor layer SEL2 may at least partially fill a remaining space of the first recess RS1 excluding the first semiconductor layer SELL A volume of the second semiconductor layer SEL2 may be larger than a volume of the first semiconductor layer SELL Each of the first and second semiconductor layers SEL1 and SEL2 may be formed of or include silicon-germanium (SiGe). In detail, the first semiconductor layer SEL1 may be provided to have a relatively low germanium concentration. In another embodiment, the first semiconductor layer SEL1 may contain only silicon (Si) but not germanium (Ge). The germanium concentration of the first semiconductor layer SEL1 may range from 0 at % to 10 at %.

The second semiconductor layer SEL2 may be provided to have a relatively high germanium concentration. As an example, the germanium concentration of the second semiconductor layer SEL2 may range from 30 at % to 70 at %. The germanium concentration of the second semiconductor layer SEL2 may increase in the third direction D3.

The first and second semiconductor layers SEL1 and SEL2 may include impurities (e.g., boron), allowing the first source/drain pattern SD1 to have the p-type conductivity. In an embodiment, a concentration of impurities in the second semiconductor layer SEL2 (in at %) may be greater than that in the first semiconductor layer SEL1.

The first semiconductor layer SEL1 may protect the second semiconductor layer SEL2, during a process of replacing sacrificial layers SAL with first to third portions PO1, PO2, and PO3 of a gate electrode GE, which will be described below. For example, the first semiconductor layer SEL1 may reduce the likelihood of or prevent the second semiconductor layer SEL2 from being undesirably etched by an etching material, which is used to remove the sacrificial layers SAL.

The gate electrodes GE may be provided to cross the first and second channel patterns CH1 and CH2 and to extend in the first direction D1. The gate electrodes GE may be arranged with a first pitch in the second direction D2. Each of the gate electrodes GE may vertically (D3 direction) overlap the first and second channel patterns CH1 and CH2.

The gate electrode GE may include a first portion PO1 interposed between the active pattern AP1 or AP2 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Referring back to FIG. 5A, the first to third portions PO1, PO2, and PO3 of the gate electrode GE on the PMOSFET region PR may have different widths from each other. For example, the largest width of the third portion PO3 in the second direction D2 may be larger than the largest width of the second portion PO2 in the second direction D2. The largest width of the first portion PO1 in the second direction D2 may be larger than the largest width of the third portion PO3 in the second direction D2.

Referring back to FIGS. 5D and 5E, the gate electrode GE may be provided on a top surface TS, a bottom surface BS, and one or more side surfaces SW1 and SW2 of each of the first to third semiconductor patterns SP1, SP2, and SP3. That is, the transistor according to the present embodiment may be a three-dimensional field effect transistor (e.g., MBCFET or GAAFET) in which the gate electrode GE is provided to three-dimensionally border or surround the channel pattern.

As an example, the first single height cell SHC1 may have a first border BD1 and a second border BD2, which are opposite to each other in the second direction D2. The first and second borders BD1 and BD2 may extend in the first direction D1. The first single height cell SHC1 may have a third border BD3 and a fourth border BD4, which are opposite to each other in the first direction D1. The third and fourth borders BD3 and BD4 may extend in the second direction D2.

Gate cutting patterns CT may be disposed on a border of each of the first and second single height cells SHC1 and SHC2, which is parallel to the second direction D2. For example, the gate cutting patterns CT may be disposed on the third and fourth borders BD3 and BD4 of the first single height cell SHC1. The gate cutting patterns CT may be arranged with the first pitch along the third border BD3. The gate cutting patterns CT may be arranged with the first pitch along the fourth border BD4. The gate cutting patterns CT may be formed of or include one or more insulating materials (e.g., silicon oxide, silicon nitride, or combinations thereof).

The gate electrode GE on the first single height cell SHC1 may be separated from the gate electrode GE on the second single height cell SHC2 by the gate cutting pattern CT. The gate cutting pattern CT may be interposed between the gate electrodes GE on the first and second single height cells SHC1 and SHC2, which are aligned to each other in the first direction D1. The gate electrode GE extending in the first direction D1 may be divided into a plurality of the gate electrodes GE by the gate cutting patterns CT.

Referring back to FIG. 4, at least one of the gate cutting patterns CT may be located in a cell, not on a border of the cell. For example, the gate cutting pattern CT may be disposed between the second PMOSFET and NMOSFET regions PR2 and NR2 of the second single height cell SHC2.

A distance between the gate cutting pattern CT and the active region PR1, PR2, NR1, or NR2 adjacent thereto may be variously changed. For example, the gate cutting pattern CT may include a first gate cutting pattern CT1 and a second gate cutting pattern CT2, which penetrate the second gate electrode GE2. Here, the first gate cutting pattern CT1 may be spaced apart from the first PMOSFET region PR1 adjacent thereto by a first distance DI1, and the second gate cutting pattern CT2 may be spaced apart from the first NMOSFET region NR1 adjacent thereto by a second distance DI2. The first distance DI1 may be larger than the second distance DI2.

Referring back to FIGS. 4 and 5A to 5E, a pair of gate spacers GS may be respectively disposed on opposite side surfaces of the fourth portion PO4 of the gate electrode GE. The gate spacers GS may extend along the gate electrode GE and in the first direction D1. Top surfaces of the gate spacers GS may be higher than a top surface of the gate electrode GE where the substrate 100 provides a base reference surface. The top surfaces of the gate spacers GS may be coplanar with a top surface of a first interlayer insulating layer 110, which will be described below. The gate spacers GS may be formed of or include at least one of SiCN, SiCON, and/or SiN. In an embodiment, the gate spacers GS may be a multi-layered structure, which includes at least two different materials selected from SiCN, SiCON, and SiN.

A gate capping pattern GP may be provided on the gate electrode GE. The gate capping pattern GP may extend along the gate electrode GE and in the first direction D1. The gate capping pattern GP may be formed of or include a material having an etch selectivity with respect to first and second interlayer insulating layers 110 and 120, which will be described below. For example, the gate capping pattern GP may be formed of or include at least one of SiON, SiCN, SiCON, and/or SiN.

A gate insulating layer GI may be interposed between the gate electrode GE and the first channel pattern CH1 and between the gate electrode GE and the second channel pattern CH2. The gate insulating layer GI may be on and at least partially cover at least one of the top surface TS, the bottom surface BS, and the side surfaces SW1 and SW2 of each of the first to third semiconductor patterns SP1, SP2, and SP3. The gate insulating layer GI may be on and at least partially cover a top surface of the device isolation layer ST below the gate electrode GE. The gate insulating layer GI may be on and at least partially cover a side surface of the gate cutting pattern CT (e.g., see FIGS. 5D and 5E).

In an embodiment, the gate insulating layer GI may include a silicon oxide layer, a silicon oxynitride layer, and/or a high-k dielectric layer. The high-k dielectric layer may be formed of or include one or more high-k dielectric materials whose dielectric constants are higher than that of silicon oxide. For example, the high-k dielectric materials may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of the serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have ferroelectric properties. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). In other embodiments, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the dopants (e.g., aluminum atoms) may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have paraelectric properties. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concept is not limited to these examples.

The ferroelectric layer and the paraelectric layer may be formed of or include the same material. The ferroelectric layer may have ferroelectric properties, but the paraelectric layer may not have ferroelectric properties. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit ferroelectric properties, only when its thickness is in a specific range. In an embodiment, the ferroelectric layer may have a thickness ranging from 0.5 to 10 nm, but the inventive concept is not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer may include a plurality of ferroelectric layers spaced apart from each other. The gate insulating layer GI may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work-function metal.

The first metal pattern may include a metal nitride layer. For example, the first metal pattern may include at least one metallic material, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of work-function metal layers, which are stacked.

The second metal pattern may be formed of or include a metallic material whose resistance is lower than the first metal pattern. For example, the second metal pattern may be formed of or include at least one metallic material, which is selected from the group consisting of tungsten (W), aluminum (Al), titanium (Ti), and tantalum (Ta). In an embodiment, the fourth portion PO4 of the gate electrode GE may include the first metal pattern and the second metal pattern on the first metal pattern.

Referring back to FIG. 5B, inner spacers IP may be provided on the first and second NMOSFET regions NR1 and NR2. Each of the inner spacers IP may be interposed between the second source/drain pattern SD2 and a corresponding one of the first to third portions PO1, PO2, and PO3 of the gate electrode GE. The inner spacers IP may be in direct physical contact with the second source/drain pattern SD2. Each of the first to third portions PO1, PO2, and PO3 of the gate electrode GE may be spaced apart from the second source/drain pattern SD2 by the inner spacer IP.

The first interlayer insulating layer 110 may be provided on the substrate 100. The first interlayer insulating layer 110 may be on and at least partially cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to be on and at least partially cover the gate capping pattern GP. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include a silicon oxide layer.

A pair of division structures DB, which are opposite to each other in the second direction D2, may be provided at both sides of each of the first and second single height cells SHC1 and SHC2. For example, the pair of the division structures DB may be provided on the first and second borders BD1 and BD2, respectively, of the first single height cell SHC1. The division structure DB may extend in the first direction D1 and may be parallel to the gate electrodes GE. A pitch between the division structure DB and the gate electrode GE adjacent thereto may be equal to the first pitch.

The division structure DB may penetrate the first and second interlayer insulating layers 110 and 120 and may extend into the first and second active patterns AP1 and AP2. The division structure DB may penetrate an upper portion of each of the first and second active patterns AP1 and AP2. The division structure DB may electrically separate an active region of each of the first and second single height cells SHC1 and SHC2 from an active region of a neighboring cell.

Active contacts AC may penetrate the first and second interlayer insulating layers 110 and 120 and may be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern that extends in the first direction D1.

The active contact AC may be a self-aligned contact. For example, the active contact AC may be formed by a self-alignment process using the gate capping pattern GP and the gate spacer GS. In an embodiment, the active contact AC may be on and at least partially cover at least a portion of the side surface of the gate spacer GS. Although not shown, the active contact AC may be on and at least partially cover a portion of the top surface of the gate capping pattern GP.

Silicide patterns SC may be respectively interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include one or more metal silicide materials (e.g., titanium silicide, tantalum silicide, tungsten silicide, nickel silicide, and cobalt silicide).

Referring back to FIG. 5C, at least one of the active contacts AC on the first single height cell SHC1 may be used to electrically connect the first source/drain pattern SD1 of the first PMOSFET region PR1 to the second source/drain pattern SD2 of the first NMOSFET region NR1. The active contact AC may include a first body portion BP1 on the first source/drain pattern SD1 and a second body portion BP2 on the second source/drain pattern SD2. The first body portion BP1 may be connected to the top surface of the first source/drain pattern SD1, and the second body portion BP2 may be connected to the top surface of the second source/drain pattern SD2. A first active contact AC1 may further include a protruding pattern PRP, which is interposed between the first body portion BP1 and the second body portion BP2. The protruding pattern PRP may be provided on the device isolation layer ST between the first PMOSFET and NMOSFET regions PR1 and NR1.

The protruding pattern PRP may extend from the first body portion BP1 toward the device isolation layer ST along a slanted side surface of the first source/drain pattern SD1. The protruding pattern PRP may extend from the second body portion BP2 toward the device isolation layer ST along a slanted side surface of the second source/drain pattern SD2. Due to the presence of the protruding pattern PRP, the active contact AC may be in physical contact with the first and second source/drain patterns SD1 and SD2 with an increased contact area. Thus, an electric resistance between the active contact AC and the first and second source/drain patterns SD1 and SD2 may be lowered. As a result, it may be possible to improve an operation property (e.g., an operation speed) of the semiconductor device according to an embodiment of the inventive concept.

Gate contacts GC may be provided to penetrate the second interlayer insulating layer 120 and the gate capping pattern GP and may be electrically connected to the gate electrodes GE, respectively. When viewed in a plan view, the gate contacts GC on the first single height cell SHC1 may overlap with the first PMOSFET region PR1. In other words, the gate contacts GC on the first single height cell SHC1 may be provided on the first active pattern AP1 (e.g., see FIG. 5A).

The gate contact GC may be freely disposed on the gate electrode GE, without a limitation in its position. For example, the gate contacts GC on the second single height cell SHC2 may be respectively disposed on the second PMOSFET region PR2, the second NMOSFET region NR2, and the device isolation layer ST at least partially filling the trench TR (e.g., see FIG. 4).

Figure 5A:
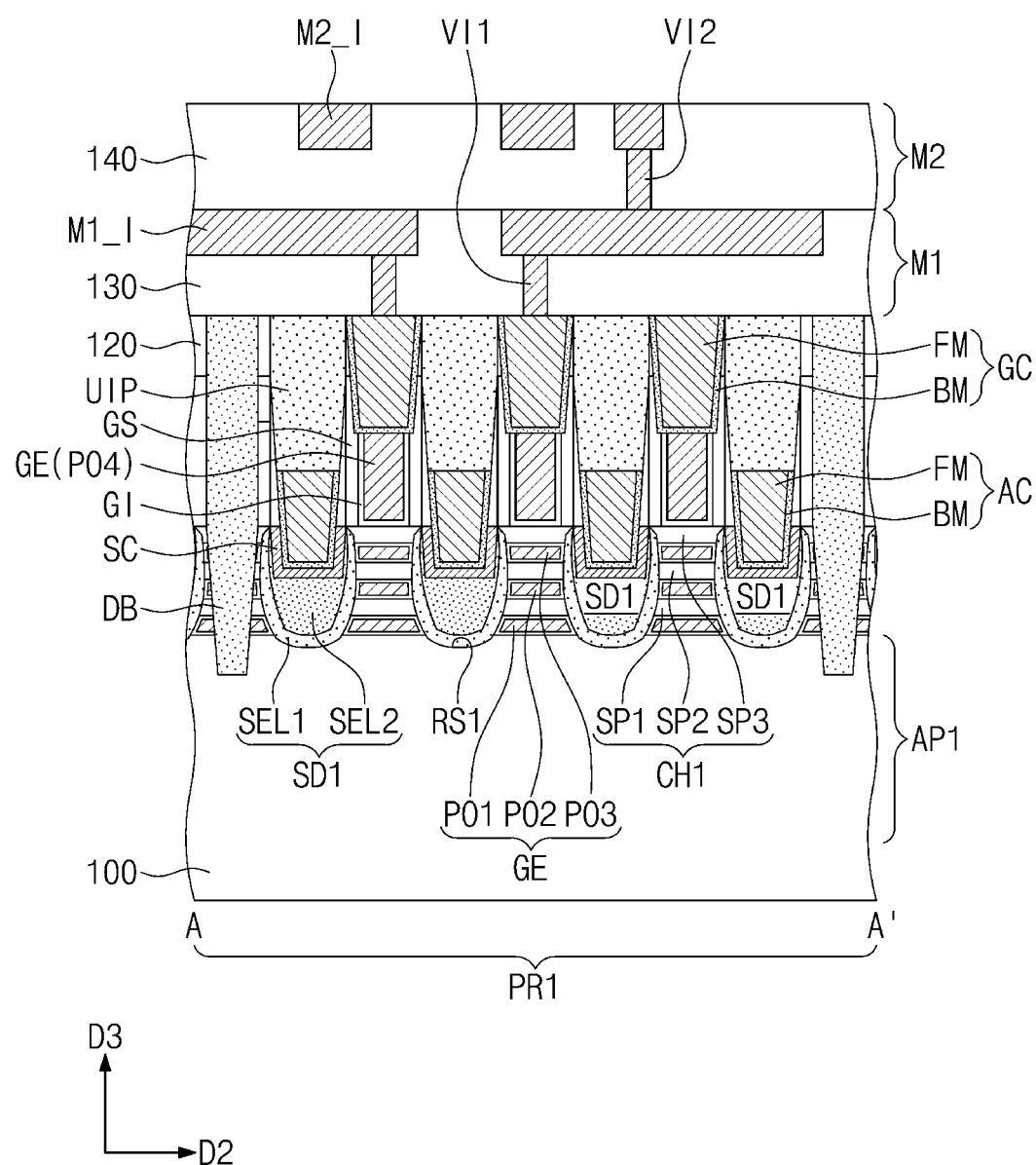
FIGS. 5A to 5E are sectional views taken along lines A-A', B-B', C-C', D-D', and E-E' of FIG. 4.
Figure 5B:
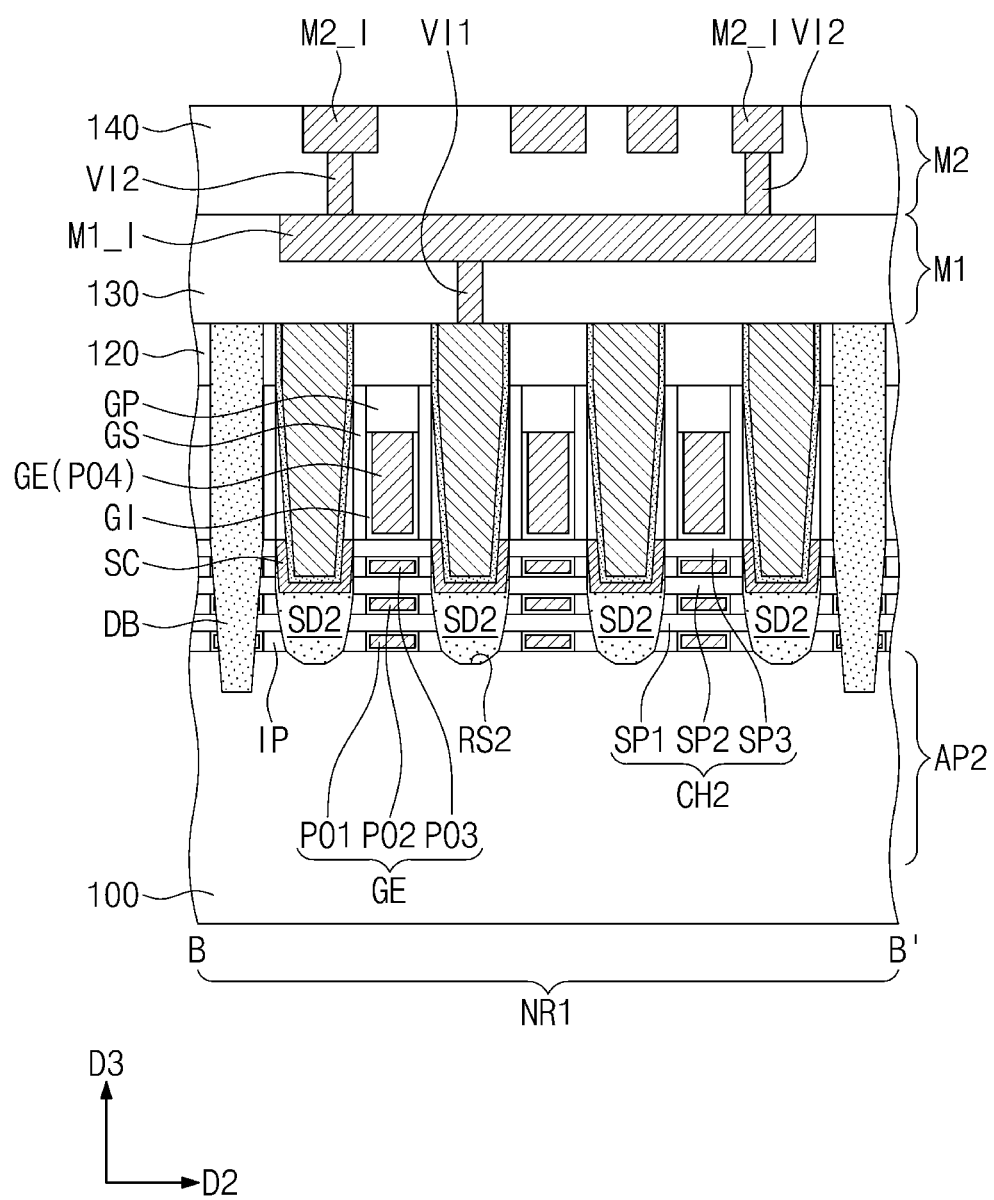
Figure 5C:
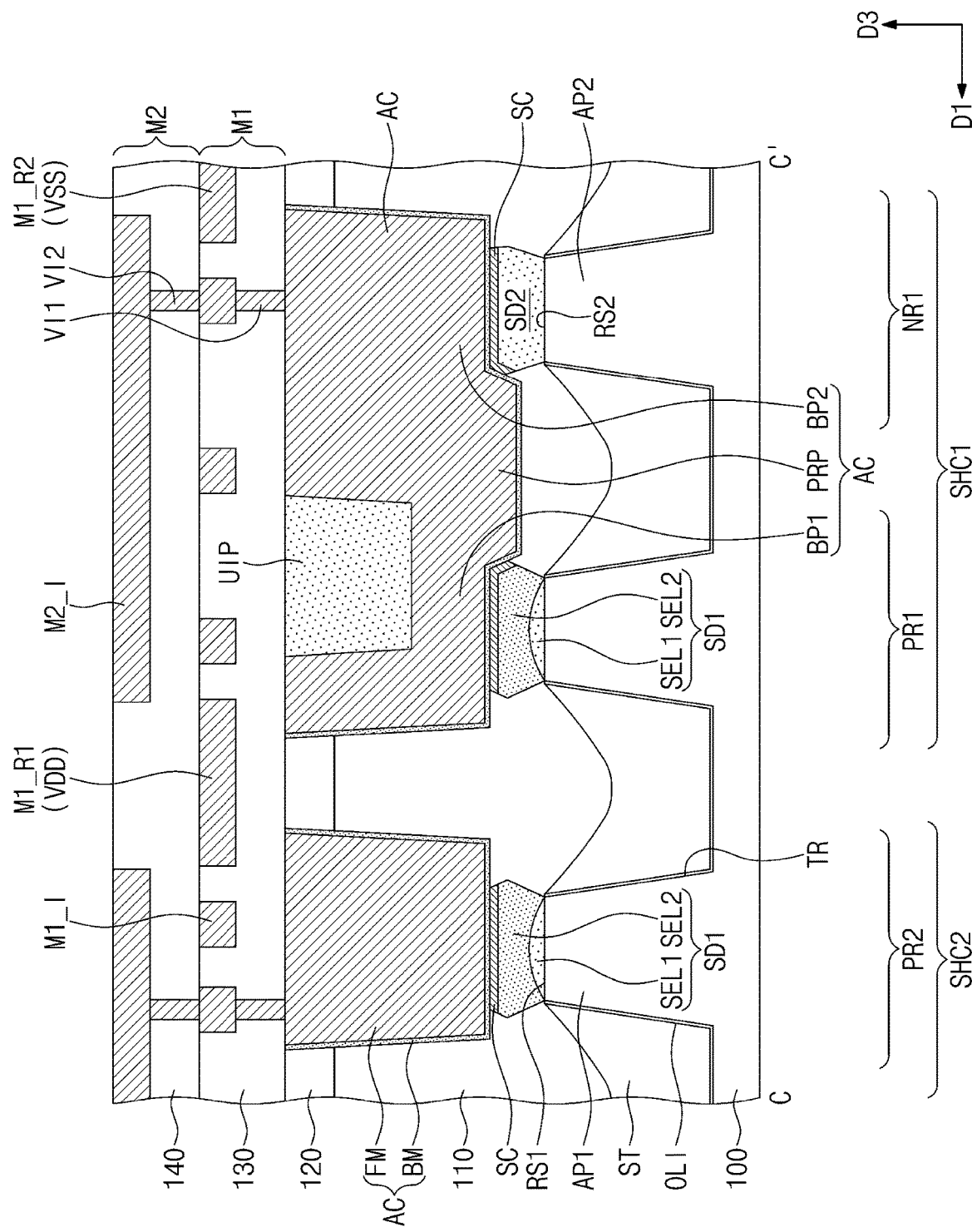
Figure 6:
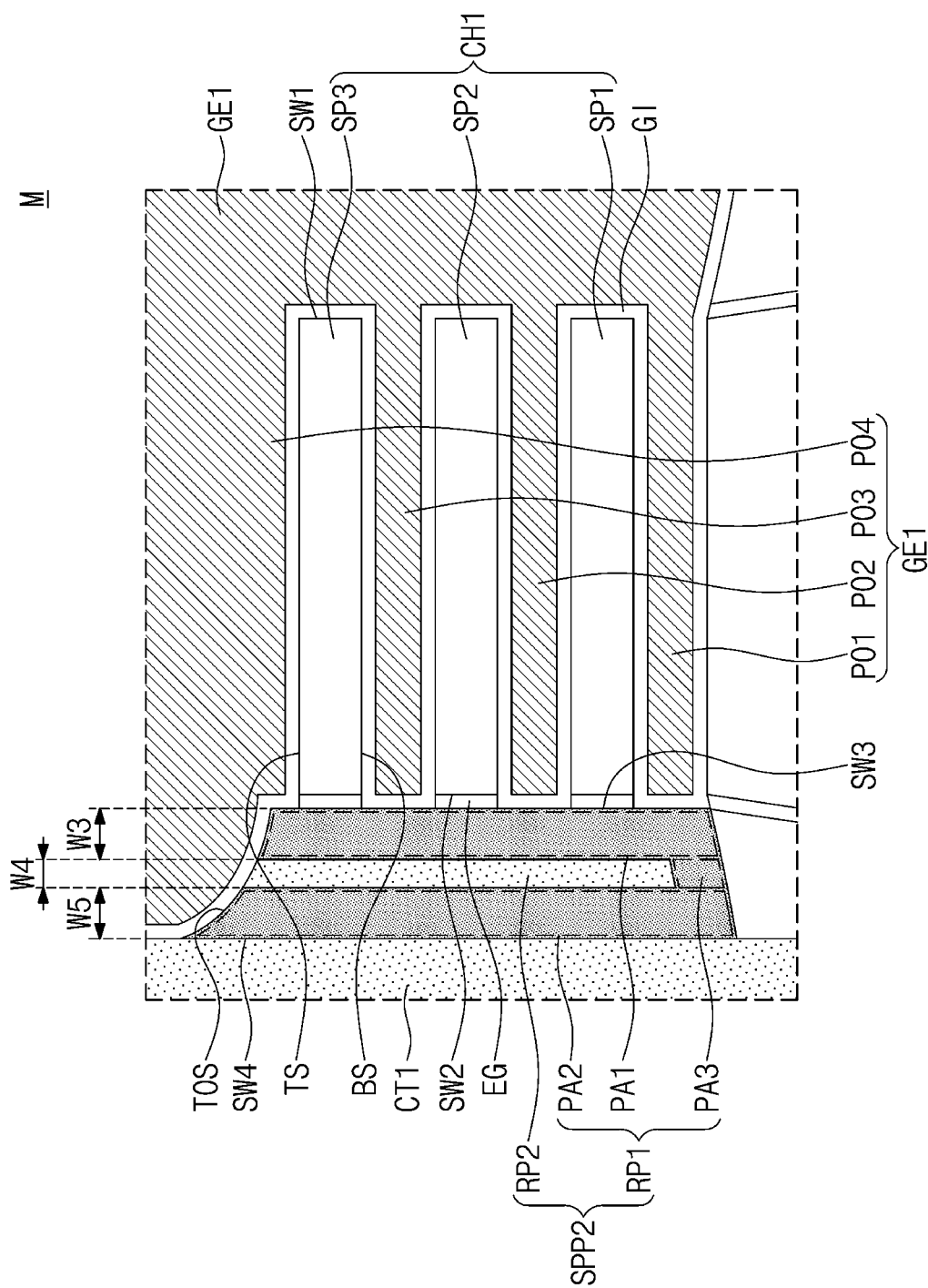
FIG. 6 is an enlarged sectional view illustrating an example of a portion 'M' of FIG. 5D.

In an embodiment, referring to FIGS. 5A and 5C, an upper region of the active contact AC adjacent to the gate contact GC may be at least partially filled with an upper insulating pattern UIP. A bottom surface of the upper insulating pattern UIP may be lower than a bottom surface of the gate contact GC where the substrate 100 provides a base reference surface. In other words, a top surface of the active contact AC adjacent to the gate contact GC may be formed at a level, which is lower than the bottom surface of the gate contact GC, by the upper insulating pattern UIP where the substrate 100 provides a base reference surface. Accordingly, it may be possible to reduce the likelihood or prevent the gate contact GC and the active contact AC, which are adjacent to each other, from being in physical contact with each other and thereby to prevent a short circuit issue from occurring.

Each of the active and gate contacts AC and GC may include a conductive pattern FM and a barrier pattern BM at least partially enclosing the conductive pattern FM. For example, the conductive pattern FM may be formed of or include one or more metallic materials (e.g., aluminum, copper, tungsten, molybdenum, and cobalt). The barrier pattern BM may be on and at least partially cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, and/or platinum. The metal nitride layer may be formed of or include at least one of titanium nitride (TiN), tantalum nitride (TaN), tungsten nitride (WN), nickel nitride (NiN), cobalt nitride (CoN), and/or platinum nitride (PtN).

A first metal layer M1 may be provided in the third interlayer insulating layer 130. For example, the first metal layer M1 may include the first power line M1_R1, the second power line M1_R2, the third power line M1_R3, and first interconnection lines MU. The interconnection lines M1_R1, M1_R2, M1_R3, and M1_I of the first metal layer M1 may extend in the second direction D2 to be parallel to each other.

In detail, the first and second power lines M1_R1 and M1_R2 may be provided on the third and fourth borders BD3 and BD4 of the first single height cell SHC1, respectively. The first power line M1_R1 may extend along the third border BD3 and in the second direction D2. The second power line M1_R2 may extend along the fourth border BD4 and in the second direction D2.

The first interconnection lines M1_I of the first metal layer M1 may be arranged with a second pitch in the first direction D1. The second pitch may be smaller than the first pitch. A line width of each of the first interconnection lines M1_I may be smaller than a line width of each of the first to third power lines M1_R1, M1_R2, and M1_R3.

The first metal layer M1 may further include first vias VI1 The first vias VI1 may be respectively provided below the interconnection lines M1_R1, M1_R2, M1_R3, and M1_I of the first metal layer M1. The active or gate contact AC or GC and the interconnection line of the first metal layer M1 may be electrically connected to each other through the first via VI1.

The interconnection line of the first metal layer M1 and the first via VI1 thereunder may be formed by separate processes. For example, the interconnection line and the first via VI1 of the first metal layer M1 may be separately formed by respective single damascene processes. The semiconductor device according to the present embodiment may be fabricated using a sub-20 nm process.

A second metal layer M2 may be provided in the fourth interlayer insulating layer 140. The second metal layer M2 may include a plurality of second interconnection lines M2_I. The second interconnection lines M2_I may extend in the first direction D1 and parallel to each other. The second metal layer M2 may further include second vias VI2, which are respectively provided below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from that of the second metal layer M2. Although not shown, a plurality of metal layers (e.g., M3, M4, M5, and so forth) may be additionally stacked on the fourth interlayer insulating layer 140. Each of the stacked metal layers may include interconnection lines, which are used as routing paths between cells.

The gate cutting patterns CT1 and CT2, the spacer patterns SPP1 to SPP3, and a first gate electrode GE1, which is one of the gate electrodes GE, will be described in more detail with reference to FIG. 5D.

The first gate cutting pattern CT1 penetrating the first gate electrode GE1 may be provided on the third border BD3 between the first and second PMOSFET regions PR1 and PR2. The second gate cutting pattern CT2 penetrating the first gate electrode GE1 may be provided on the fourth border BD4 adjacent to the first NMOSFET region NR1.

A first spacer pattern SPP1 may be provided between the first gate cutting pattern CT1 and the first channel pattern CH1 on the second PMOSFET region PR2. A second spacer pattern SPP2 may be provided between the first gate cutting pattern CT1 and the first channel pattern CH1 on the first PMOSFET region PR1. A third spacer pattern SPP3 may be provided between the second gate cutting pattern CT2 and the second channel pattern CH2 on the first NMOSFET region NR1.

In an embodiment, each of the first to third semiconductor patterns SP1, SP2, and SP3 of the first channel pattern CH1 on the first PMOSFET region PR1 may include the top surface TS, a first side surface SW1, a second side surface SW2 opposite to the first side surface SW1, and the bottom surface BS. The second side surface SW2 may correspond to the outermost side surface of the semiconductor pattern. The gate electrode GE may be on and at least partially cover the top surface TS, the first side surface SW1, and the bottom surface BS. The gate electrode GE may not be on and may not cover the second side surface SW2. The top surface TS, the bottom surface BS, and the first side surface SW1 may be at least partially covered with the gate insulating layer GI. The top surface TS, the bottom surface BS, and the first side surface SW1 may face the gate electrode GE with the gate insulating layer GI interposed therebetween. The second side surface SW2 may not be covered with the gate insulating layer GI. The second side surface SW2 may be at least partially covered with an etch stop layer EG.

Each of the first to third spacer patterns SPP1 to SPP3 may include a first remaining pattern RP1 and a second remaining pattern RP2. The first remaining pattern RP1 may be adjacent to the second side surface SW2 of each of the first to third semiconductor patterns SP1, SP2, and SP3. The etch stop layer EG may be interposed between the first remaining pattern RP1 and the second side surface SW2. In addition, the first remaining pattern RP1 may be adjacent to at least one of the first or second gate cutting pattern CT1 or CT2. As an example, the first remaining pattern RP1 may be formed of or include polysilicon. The second remaining pattern RP2 may be provided on the first remaining pattern RP1. The second remaining pattern RP2 may be spaced apart from the first gate cutting pattern CT1 or the second gate cutting pattern CT2 by the first remaining pattern RP1. The second remaining pattern RP2 may be spaced apart from the first channel pattern CH1 or the second channel pattern CH2 by the first remaining pattern RP1. As an example, the second remaining pattern RP2 may be formed of or include at least one of silicon nitride and/or silicon oxide. The first and second remaining patterns RP1 and RP2 may be formed of or include different materials from each other.

The second spacer pattern SPP2 may include a third side surface SW3 and a fourth side surface SW4, which are opposite to each other. The third side surface SW3 of the second spacer pattern SPP2 may be in direct physical contact with the etch stop layer EG. The fourth side surface SW4 of the second spacer pattern SPP2 may be in direct physical contact with the first gate cutting pattern CT1. A portion of the third side surface SW3 of the second spacer pattern SPP2, which is not in physical contact with the etch stop layer EG, may be at least partially covered with the gate insulating layer GI.

The first and third spacer patterns SPP1 and SPP3 may be configured to have substantially the same features as the second spacer pattern SPP2 described above.

The first gate electrode GE1 on the first single height cell SHC1 may include an upper portion including a first extended portion EXP1, a second extended portion EXP2, and a main portion MIP therebetween. The first extended portion EXP1 may be provided on and may vertically overlap (D3 direction) the second spacer pattern SPP2. The first extended portion EXP1 may be adjacent to the first gate cutting pattern CT1 with the gate insulating layer GI interposed therebetween.

The second extended portion EXP2 may be provided on and may vertically overlap (D3 direction) the third spacer pattern SPP3. The second extended portion EXP2 may be adjacent to the second gate cutting pattern CT2 with the gate insulating layer GI interposed therebetween.

The main portion MIP may be a portion of the first gate electrode GE1 on and at least partially covering the first and second channel patterns CH1 and CH2. The main portion MIP may have a first length L1 in the first direction D1. The first length L1 may be smaller than a second length L2, which is a distance from the first gate cutting pattern CT1 to the second gate cutting pattern CT2. Due to the presence of the second and third spacer patterns SPP2 and SPP3, the length (i.e., L1) of the main portion MIP of the first gate electrode GE1 may be smaller than the largest length (i.e., L2) of the first gate electrode GE1.

The first gate electrode GE1 may further include a first protruding portion PTP1 on the first extended portion EXP1 and a second protruding portion PTP2 on the second extended portion EXP2. The first protruding portion PTP1 may be adjacent to the first gate cutting pattern CT1 with the gate insulating layer GI interposed therebetween. The second protruding portion PTP2 may be adjacent to the second gate cutting pattern CT2 with the gate insulating layer GI interposed therebetween. A height of a top surface of the first protruding portion PTP1 may increase with decreasing distance to the first gate cutting pattern CT1. A height of a top surface of the second protruding portion PTP2 may increase with decreasing distance to the second gate cutting pattern CT2. In an embodiment, although not shown, at least one of the first or second protruding portion PTP1 or PTP2 may extend to a region on the main portion MIP.

The gate electrode GE of the semiconductor device according to the present embodiment may have a relatively small length (i.e., the first length L1). Such a reduction of the length of the gate electrode GE may lead to a reduction of a volume of the gate electrode GE. Furthermore, a parasitic capacitance between the gate electrode GE and the active contact AC adjacent thereto may be reduced. The reduction of the parasitic capacitance may make it possible to increase an operation speed of the semiconductor device and to improve electrical characteristics of the semiconductor device.

According to an embodiment of the inventive concept, because the spacer patterns SPP1 to SPP3 are provided, the distances between the gate cutting patterns CT1 and CT2 and the channel patterns CH1 and CH2 may be increased. Accordingly, it may be possible to reduce the likelihood or prevent the protruding portions PTP1 and PTP2 of the gate electrode GE from being in physical contact with the active contact AC adjacent thereto or to reduce the likelihood or prevent a short circuit issue between the gate electrode GE and the active contact AC. As a result, it may be possible to improve the electrical characteristics of the semiconductor device.

Hereinafter, the gate cutting patterns CT1 and CT2, the spacer patterns SPP1 to SPP3, and the second gate electrode GE2, which is one of the gate electrodes GE, will be described in more detail with reference to FIG. 5E.

The first gate cutting pattern CT1 penetrating the second gate electrode GE2 may be provided on the third border BD3 between the first and second PMOSFET regions PR1 and PR2. The second gate cutting pattern CT2 penetrating the second gate electrode GE2 may be provided on the fourth border BD4 adjacent to the first NMOSFET region NR1.

The first spacer pattern SPP1 may be provided between the first gate cutting pattern CT1 and the first channel pattern CH1 on the second PMOSFET region PR2. The third spacer pattern SPP3 may be provided between the second gate cutting pattern CT2 and the second channel pattern CH2 on the first NMOSFET region NR1. Meanwhile, in the present embodiment, the second spacer pattern SPP2 may be omitted from the region between the first gate cutting pattern CT1 and the first channel pattern CH1 on the first PMOSFET region PR1.

Because the second spacer pattern SPP2 is omitted, the second gate electrode GE2 may be provided to be on and at least partially cover all of the top surface TS, the bottom surface BS, the first side surface SW1, and the second side surface SW2 of each of the first to third semiconductor patterns SP1, SP2, and SP3. In other words, the second gate electrode GE2 on the first PMOSFET region PR1 may have a gate-all-around structure bordering or surrounding a channel region.

Figure 5D:
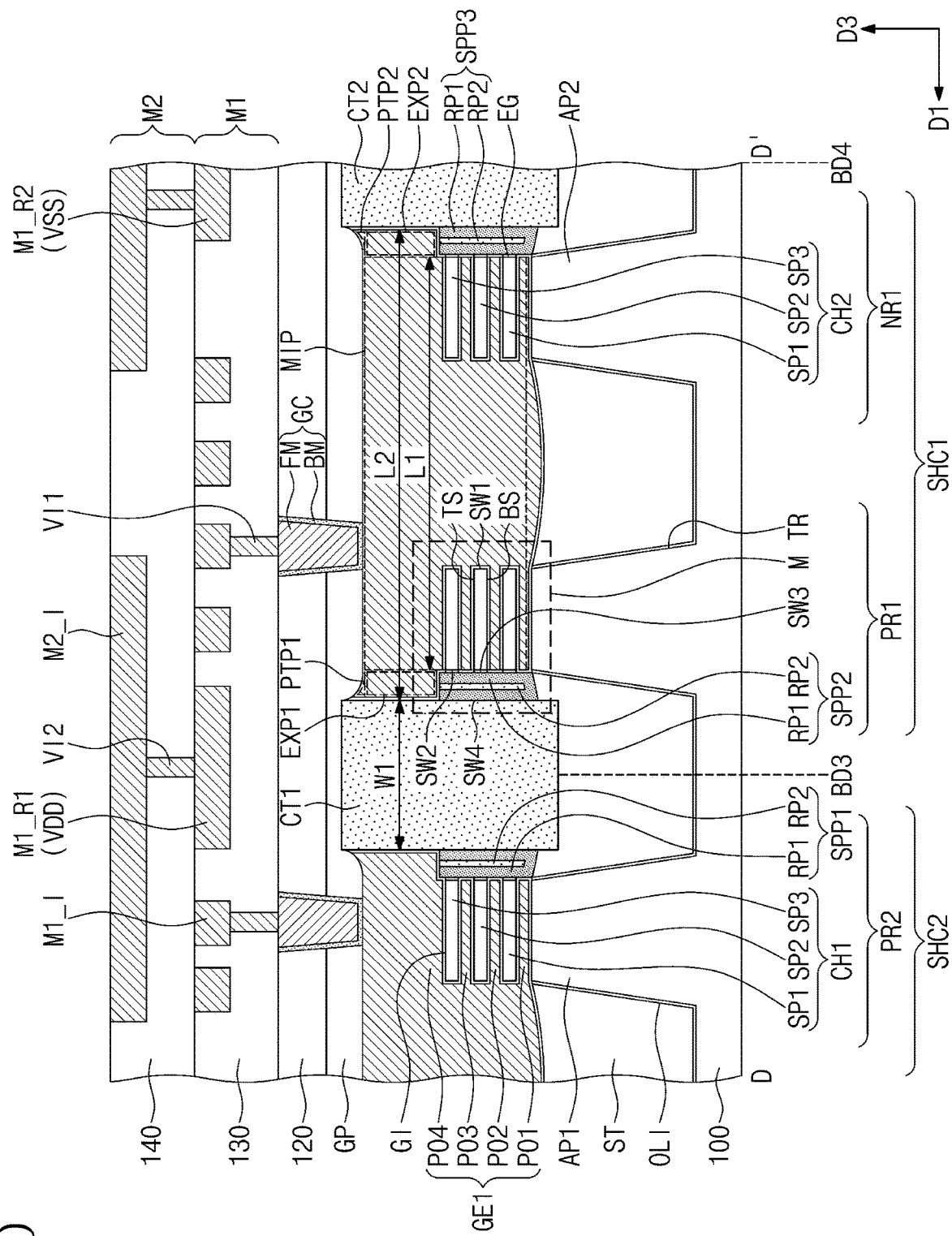

A width W2 of the first gate cutting pattern CT1 penetrating the second gate electrode GE2 may be smaller than a width W1 of the first gate cutting pattern CT1 penetrating the first gate electrode GE1 (e.g., see FIG. 5D). In the case where the width of the first gate cutting pattern CT1 is reduced to increase the distance DI1 between the first gate cutting pattern CT1 and the first channel pattern CH1 on the first PMOSFET region PR1, the second spacer pattern SPP2 may be omitted.

In detail, a distance between the first gate cutting pattern CT1 and the first channel pattern CH1 on the first PMOSFET region PR1 may be the first distance DI1. A distance between the second gate cutting pattern CT2 and the second channel pattern CH2 on the first NMOSFET region NR1 may be the second distance DI2. The first distance DI1 may be larger than the second distance DI2. Because the first distance DI1 has a relatively large value, the second spacer pattern SPP2 may not be formed between the first gate cutting pattern CT1 and the first channel pattern CH1 on the first PMOSFET region PR1. Because the second distance DI2 has a relatively small value, the third spacer pattern SPP3 may be formed between the second gate cutting pattern CT2 and the second channel pattern CH2 on the first NMOSFET region NR1.

According to an embodiment of the inventive concept, by adjusting a distance between the gate cutting pattern CT and the channel pattern CH1 or CH2, it may be possible to control whether the spacer patterns SPP1 to SPP3 are formed and to control sizes of the spacer patterns SPP1 to SPP3.

Figure 5E:
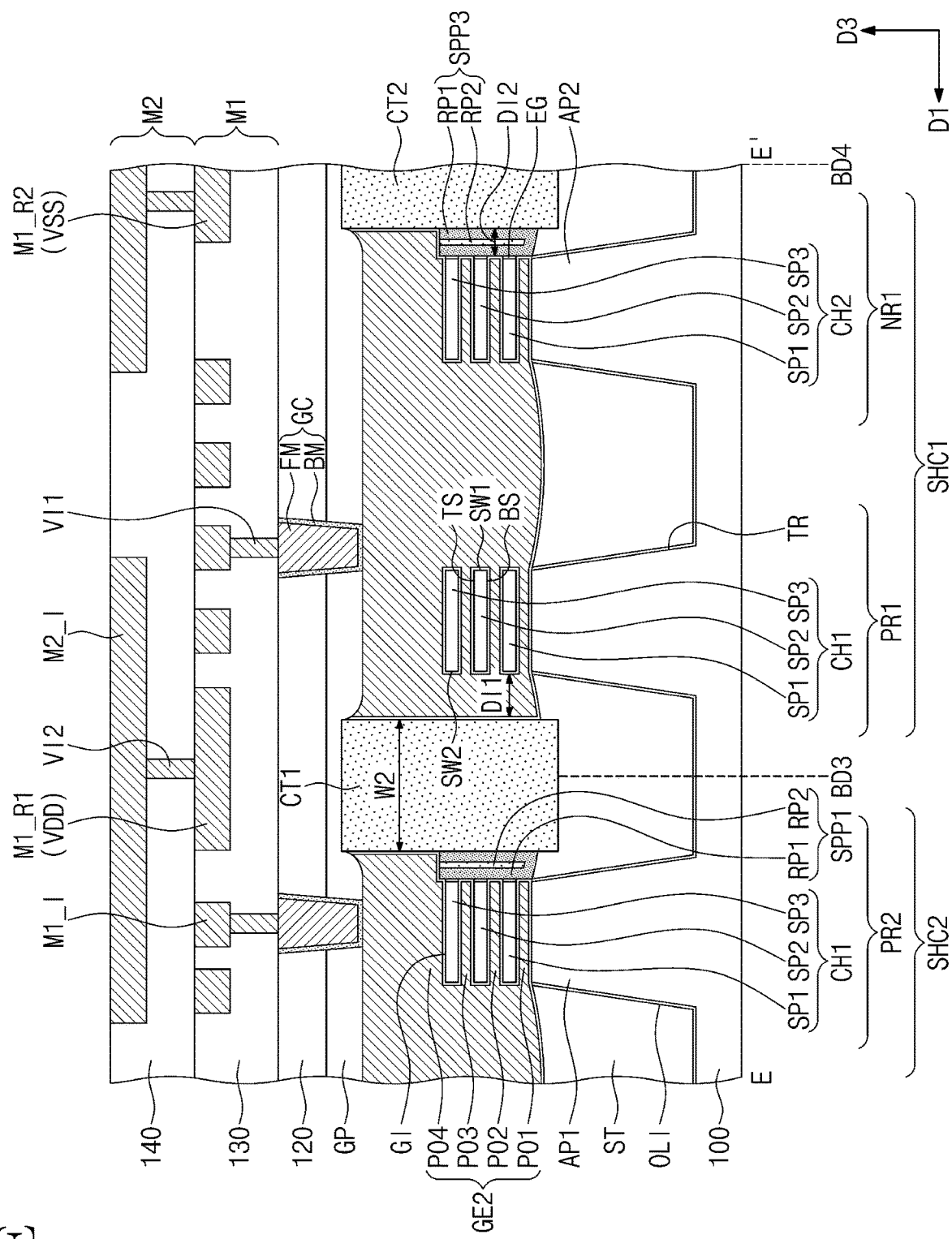

In the case where, as shown in FIG. 5E, the second gate electrode GE2 on the first PMOSFET region PR1 has a gate-all-around structure bordering or surrounding the channel pattern, the second gate electrode GE2 may have improved channel controllability. However, if the second gate electrode GE2 has an increased length and an increased volume, the parasitic capacitance described above may be increased. Thus, according to an embodiment of the inventive concept, in a transistor region, in which the operation speed rather than the channel controllability is more important, the spacer patterns SPP1 to SPP3 may be provided to reduce the length of the gate electrode GE, and in a transistor region, in which the channel controllability rather than the operation speed is more important, the spacer patterns SPP1 to SPP3 may be omitted to realize the gate electrode GE of the gate-all-around structure.

An example of the second spacer pattern SPP2 will be described in more detail with reference to FIG. 6. The second spacer pattern SPP2 may include the first remaining pattern RP1 and the second remaining pattern RP2 on the first remaining pattern RP1.

The first remaining pattern RP1 may include a first pattern PA1, which is vertically (D3 direction) extended and is adjacent to the second side surface SW2 of each of first to third semiconductor patterns SP1 to SP3, a second pattern PA2, which is interposed between the first gate cutting pattern CT1 and the second remaining pattern RP2 and is vertically (D3 direction) extended, and a third pattern PA3, which is provided to connect the first pattern PA1 to the second pattern PA2. As an example, the first remaining pattern RP1 may have a U-shaped section. The first pattern PA1 may be in physical contact with the etch stop layer EG and a side surface of the second remaining pattern RP2. The second pattern PA2 may be in physical contact with the first gate cutting pattern CT1 and an opposite side surface of the second remaining pattern RP2. The third pattern PA3 may be in physical contact with a bottom surface of the second remaining pattern RP2. Side and bottom surfaces of the second remaining pattern RP2 may be bordered or surrounded by the first remaining pattern RP1.

A width of the first pattern PA1 may be a third width W3. A width of the second remaining pattern RP2 may be a fourth width W4. A width of the second pattern PA2 may be a fifth width W5. Each of the third and fifth widths W3 and W5 may be larger than the fourth width W4. The third and fourth widths W3 and W4 may be equal to or different from each other.

In the case where the second remaining pattern RP2 is provided, a width of the first remaining pattern RP1 may be reduced, compared with the case that the second remaining pattern RP2 is not provided, as will be described below. In other words, the third width W3 and the fifth width W5, which are the widths of the first pattern PA1 and the second pattern PA2, respectively, may be reduced. Accordingly, the spacer patterns SPP1 to SPP3 may not be removed, even when a distance between the first gate cutting pattern CT1 and the channel pattern CH1 or CH2 has a relatively large value. Accordingly, it may be possible to reduce the likelihood or prevent the protruding portions PTP1 and PTP2 of the gate electrode GE from being in physical contact with the active contact AC adjacent thereto or to reduce the likelihood or prevent a short circuit issue between the gate electrode GE and the active contact AC. As a result, electrical characteristics of the semiconductor device may be improved.

A top surface TOS of the second spacer pattern SPP2 may have a concave profile. As an example, a height of the top surface TOS of the second spacer pattern SPP2 may increase with increasing distance from the third semiconductor pattern SP3 in a direction toward the first gate cutting pattern CT1. In another embodiment, the top surface TOS of the second spacer pattern SPP2 may have a generally flat profile.

Figure 7:
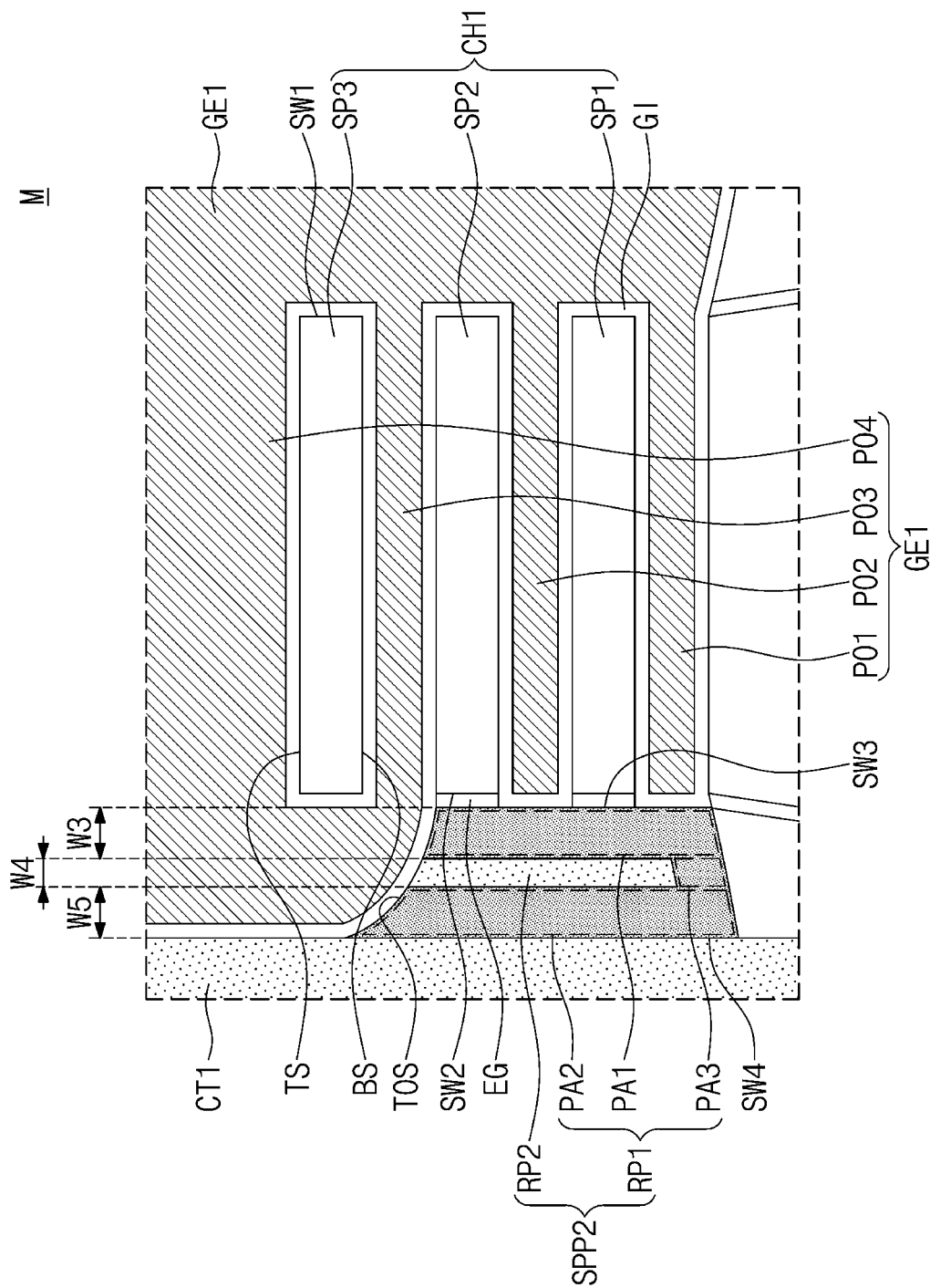
FIG. 7 is an enlarged sectional view illustrating another example of the portion 'M' of FIG. 5D.

FIG. 7 is an enlarged sectional view illustrating another example of the portion 'M' of FIG. 5D. Referring to FIG. 7, the top surface TOS of the second spacer pattern SPP2 may be lower than the bottom surface BS of the third semiconductor pattern SP3 with the substrate 100 providing a base reference plane. In other words, the second spacer pattern SPP2 may not be adjacent to the second side surface SW2 of the third semiconductor pattern SP3.

The first gate electrode GE1 may be on and at least partially cover all of the top surface TS, the bottom surface BS, the first side surface SW1, and the second side surface SW2 of the third semiconductor pattern SP3. The first gate electrode GE1 may have a gate-all-around structure completely bordering or surrounding the third semiconductor pattern SP3. However, the first gate electrode GE1 may not be on and may not cover the second side surfaces SW2 of the first and second semiconductor patterns SP1 and SP2.

In the present embodiment, by adjusting the height of the top surface TOS of the second spacer pattern SPP2, the first gate electrode GE1 may be configured to completely border or surround at least one of the first to third semiconductor patterns SP1, SP2, and SP3. Thus, it may be possible to increase an operation speed of a transistor without a significant reduction of the channel controllability.

Figure 8:
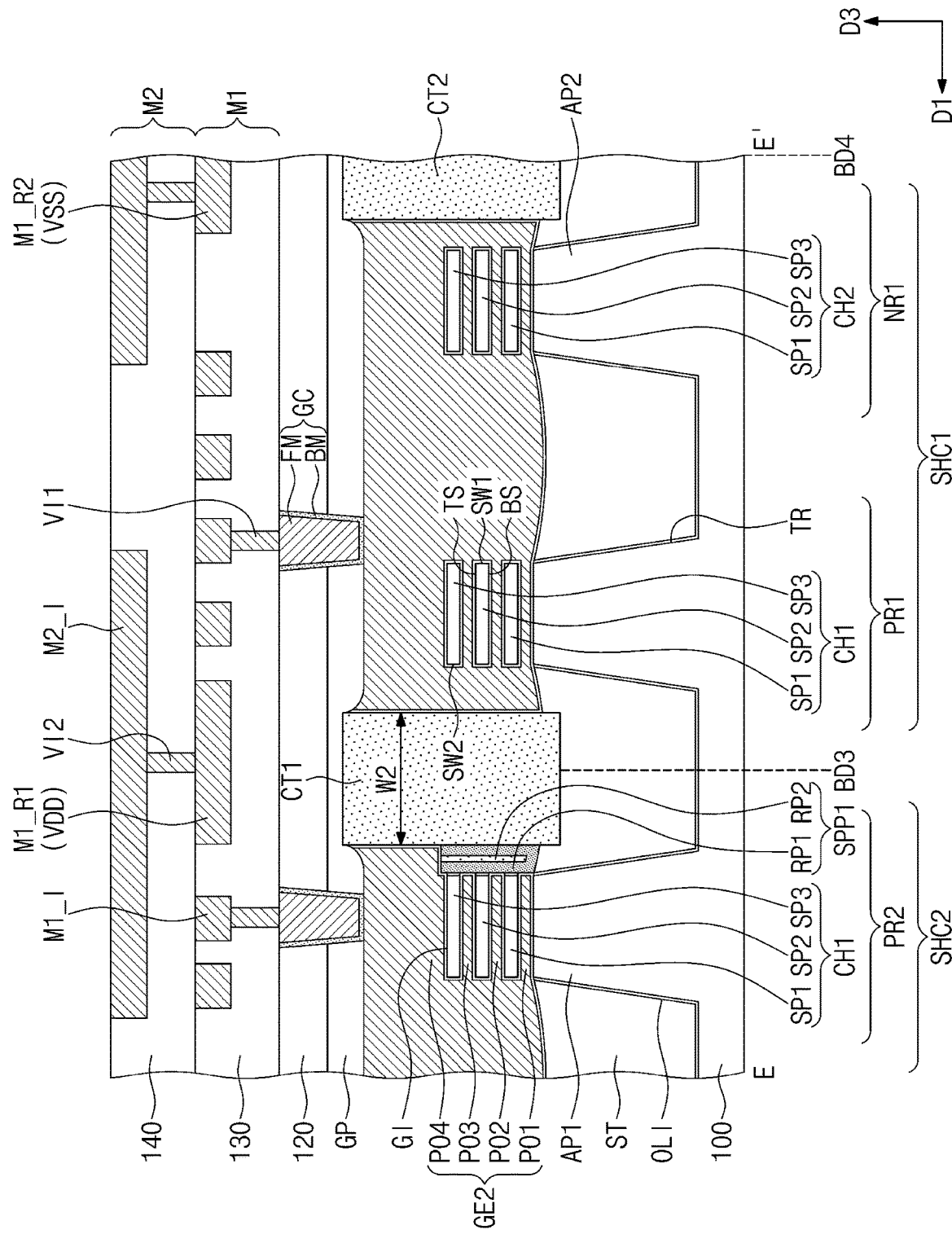
FIG. 8 is a sectional view, which is taken along a line E-E' of FIG. 4, that illustrates a semiconductor device according to an embodiment of the inventive concept.

FIG. 8 is a sectional view, which is taken along a line E-E' of FIG. 4, that illustrates a semiconductor device according to an embodiment of the inventive concept. In the following description, an element previously described with reference to FIGS. 4 and 5A to 5E may be identified by the same reference number without repeating an overlapping description thereof.

Referring to FIG. 8, the first spacer pattern SPP1 may be provided between the first gate cutting pattern CT1 and the first channel pattern CH1 on the second PMOSFET region PR2. Meanwhile, in the present embodiment, the second spacer pattern SPP2 may be omitted in the region between the first gate cutting pattern CT1 and the first channel pattern CH1 on the first PMOSFET region PR1. The third spacer pattern SPP3 may be omitted in the region between the second gate cutting pattern CT2 and the second channel pattern CH2 on the first NMOSFET region NR1.

If, for the first single height cell SHC1, the channel controllability is a more important cell property than the operation speed, the spacer patterns SPP2 and SPP3 may be omitted from only the first single height cell SHC1. Thus, the second gate electrode GE2 on the first single height cell SHC1 may be formed to have a gate-all-around structure.

FIGS. 9A to 19D are sectional views illustrating a method of fabricating a semiconductor device, according to an embodiment of the inventive concept. In detail, FIGS. 9A, 10A, 11A, 12A, 14A, 15A, 16A, 17A, 18A, and 19A are sectional views taken along a line A-A' of FIG. 4. FIGS. 15B, 16B, 17B, 18B, and 19B are sectional views taken along a line B-B' of FIG. 4. FIGS. 15C, 16C, 17C, 18C, and 19C are sectional views taken along a line C-C' of FIG. 4. FIGS. 9B, 10B, 11B, 12B, 13, 14B, 15D, 17D, 18D, and 19D are sectional views taken along a line D-D' of FIG. 4.

Figure 9A:
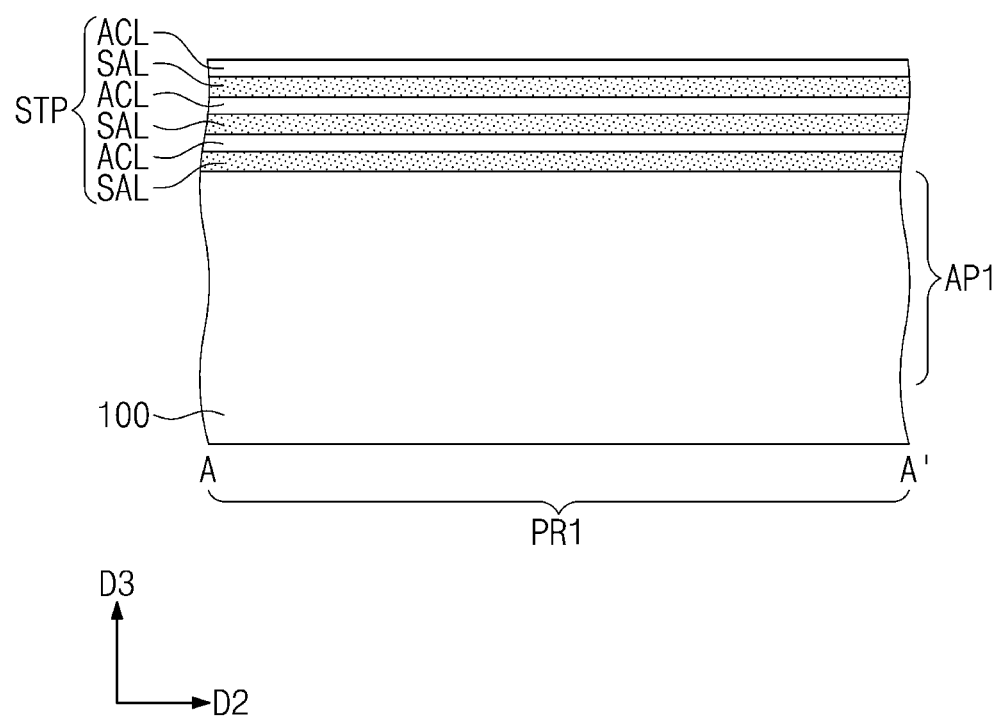

Referring to FIGS. 9A and 9B, the substrate 100 including the first and second PMOSFET regions PR1 and PR2 and the first and second NMOSFET regions NR1 and NR2 may be provided. Sacrificial layers SAL and active layers ACL may be alternately stacked on the substrate 100. The sacrificial layers SAL may be formed of or include at least one of silicon (Si), germanium (Ge), or silicon-germanium (SiGe), and the active layers ACL may be formed of or include at least one of silicon (Si), germanium (Ge), or silicon-germanium (SiGe) but may be formed of a material different from the sacrificial layers SAL. For example, the sacrificial layers SAL may be formed of or include silicon-germanium (SiGe), and the active layers ACL may be formed of and/or include silicon (Si).

Mask patterns may be respectively formed on the first and second PMOSFET regions PR1 and PR2 and the first and second NMOSFET regions NR1 and NR2 of the substrate 100. The mask pattern may be a line- or bar-shaped pattern extending in the second direction D2.

A patterning process using the mask patterns as an etch mask may be performed to form the trench TR defining the first and second active patterns AP1 and AP2. The first active pattern AP1 may be formed on each of the first and second PMOSFET regions PR1 and PR2. The second active pattern AP2 may be formed on each of the first and second NMOSFET regions NR1 and NR2.

A stacking pattern STP may be formed on each of the first and second active patterns AP1 and AP2. The stacking pattern STP may include the sacrificial layers SAL and the active layers ACL, which are alternately stacked. The stacking pattern STP may be formed along with the first and second active patterns AP1 and AP2, during the patterning process.

The device isolation layer ST may be formed to at least partially fill the trench TR. In detail, an insulating layer may be formed on the substrate 100 to be on and at least partially cover the first and second active patterns AP1 and AP2 and the stacking patterns STP. The device isolation layer ST may be formed by recessing the insulating layer until the stacking patterns STP are exposed.

The device isolation layer ST may be formed of or include one or more insulating materials (e.g., silicon oxide). The stacking patterns STP may protrude above the device isolation layer ST and may be exposed to the outside of the device isolation layer ST. In other words, the stacking patterns STP may protrude vertically (D3 direction) above the device isolation layer ST.

Figure 10A:
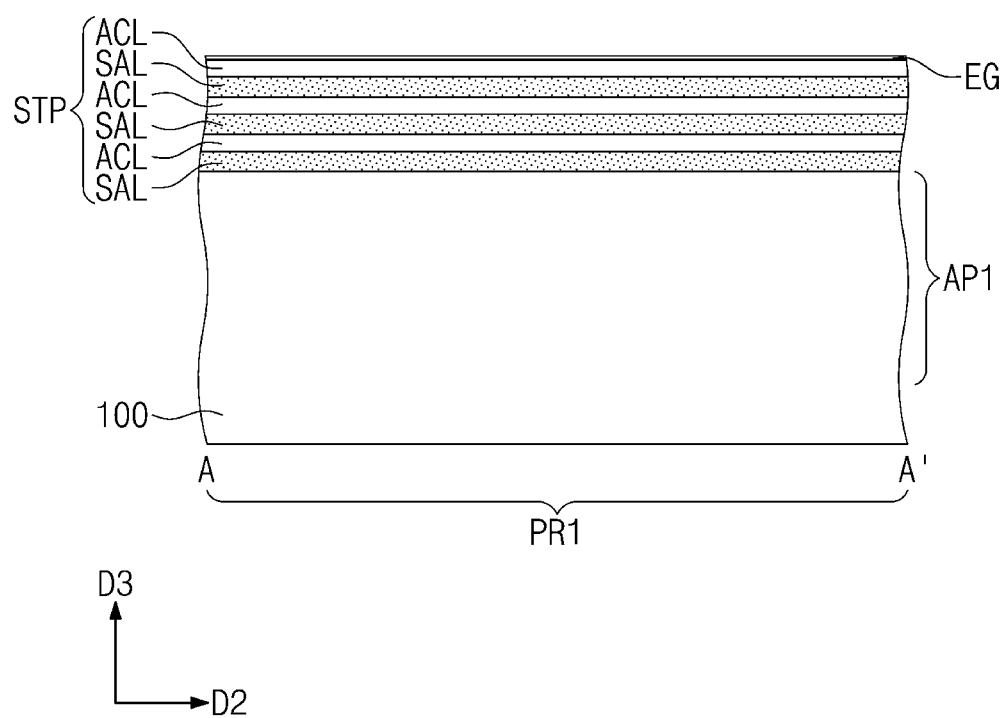
Figure 10B:
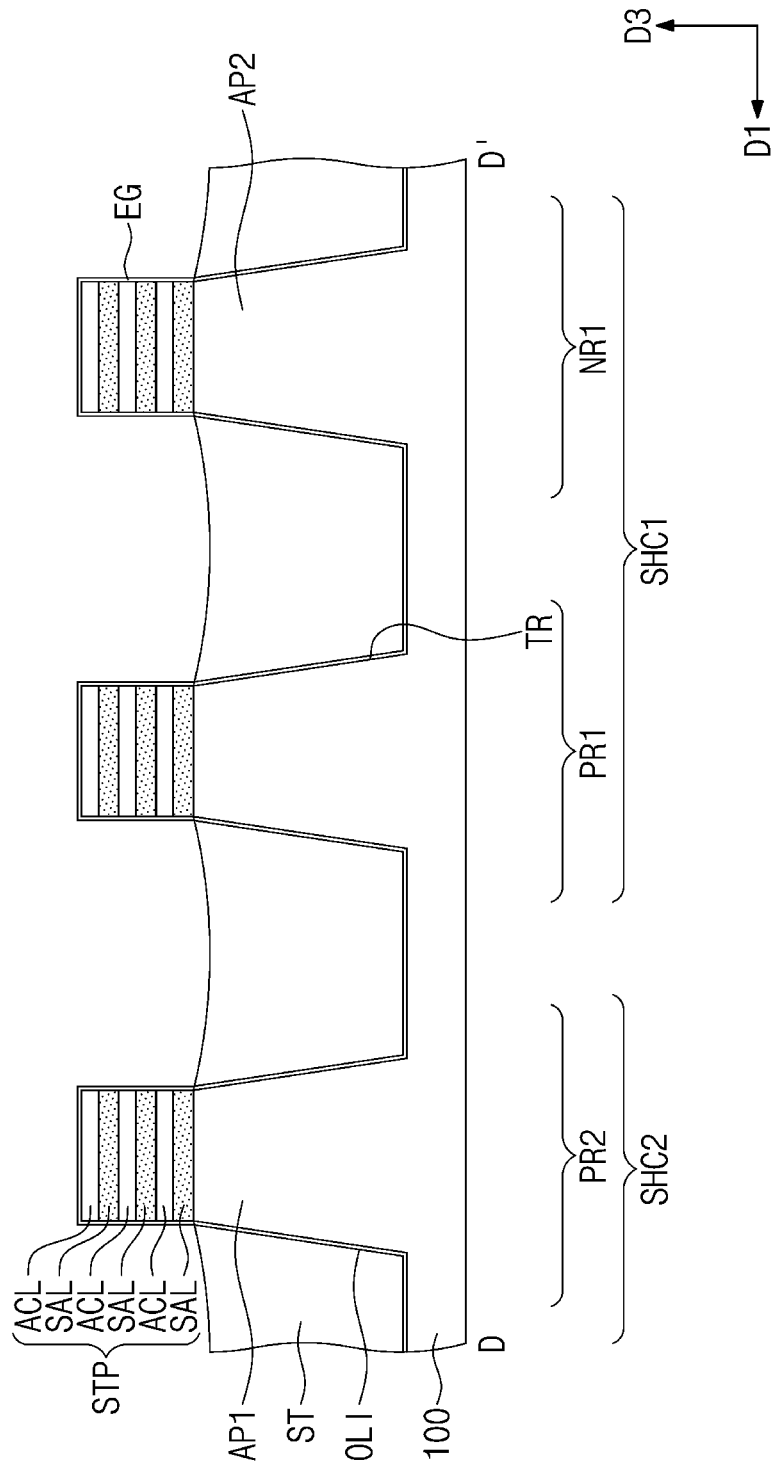

Referring to FIGS. 10A and 10B, the etch stop layer EG may be formed on the stacking patterns STP. The etch stop layer EG may be on and at least partially cover side and top surfaces of each of the stacking patterns STP. The etch stop layer EG may not extend to a region on the device isolation layer ST. In another embodiment, the etch stop layer EG may extend to a region on the device isolation layer ST. In an embodiment, the etch stop layer EG may include a silicon oxide layer or a silicon oxynitride layer. The etch stop layer EG may be used to adjust a threshold voltage of a transistor and to prevent the active layers ACL from being removed by an etching process.

Figure 11A:
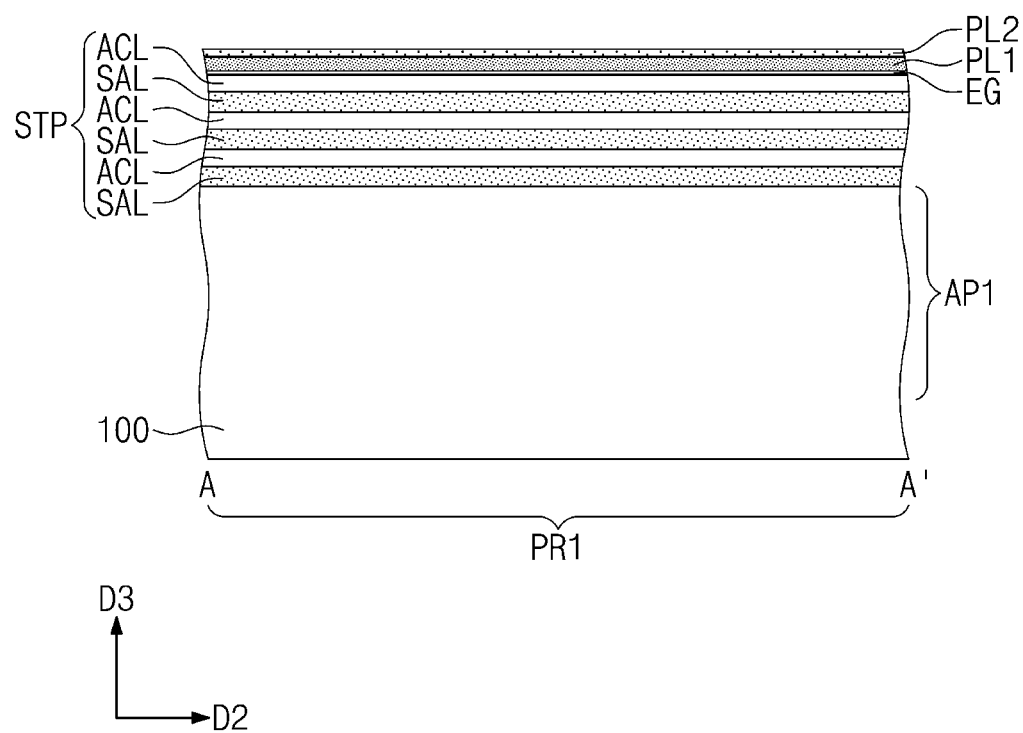
Figure 11B:
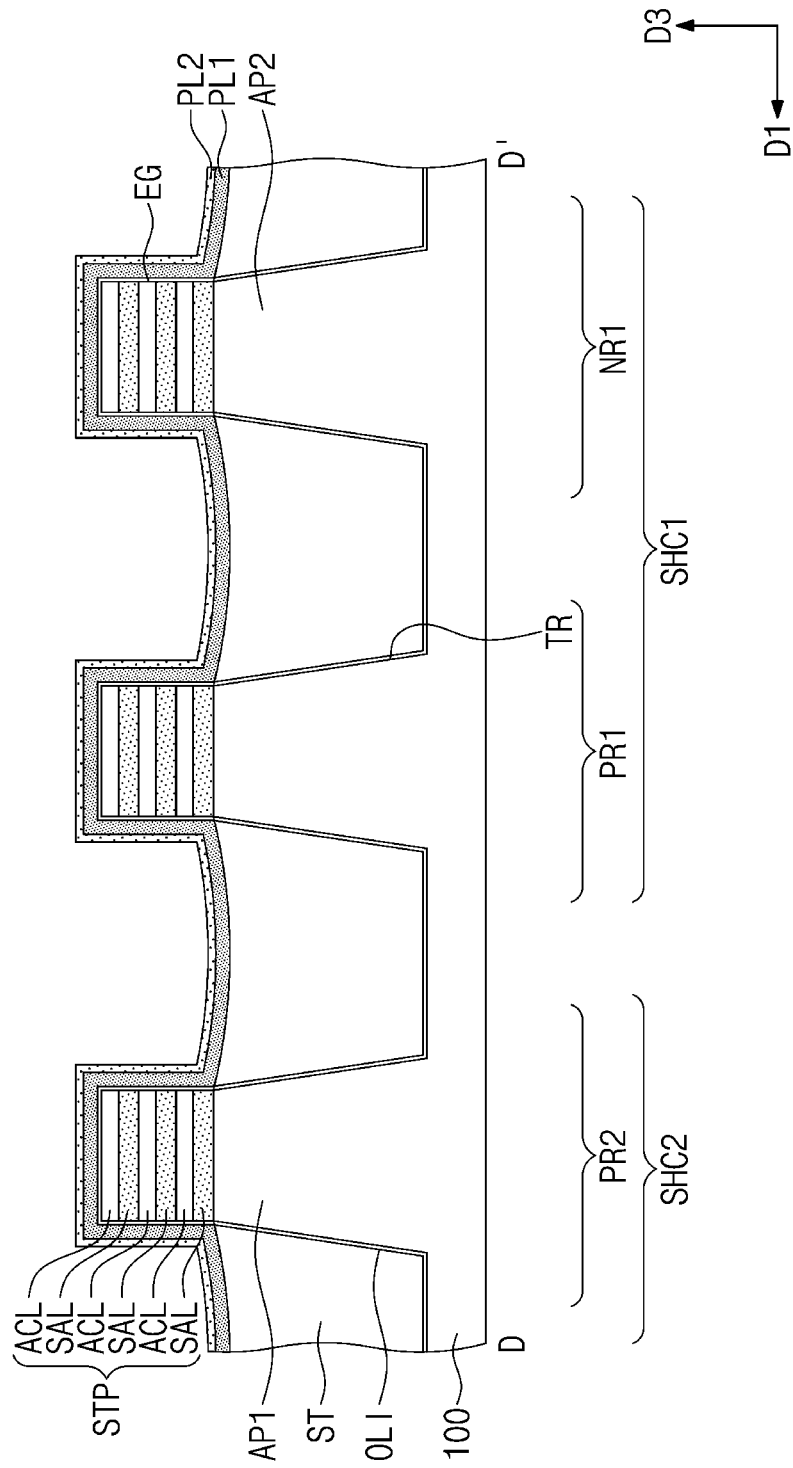

Referring to FIGS. 11A and 11B, a first sacrificial layer PL1 and a second sacrificial layer PL2 may be sequentially formed on the etch stop layer EG. The first sacrificial layer PL1 may conformally extend along the side and top surfaces of each of the stacking patterns STP and the top surface of the device isolation layer ST. The second sacrificial layer PL2 may be provided on the first sacrificial layer PL1 and may conformally extend along the side and top surfaces of each of the stacking patterns STP and the top surface of the device isolation layer ST. The first and second sacrificial layers PL1 and PL2 may be formed of or include different materials from each other. As an example, the first sacrificial layer PL1 may be formed of or include polysilicon, and the second sacrificial layer PL2 may be formed of or include at least one of silicon nitride and/or silicon oxide. A thickness of the first sacrificial layer PL1 may be larger than a thickness of the second sacrificial layer PL2.

Figure 12A:
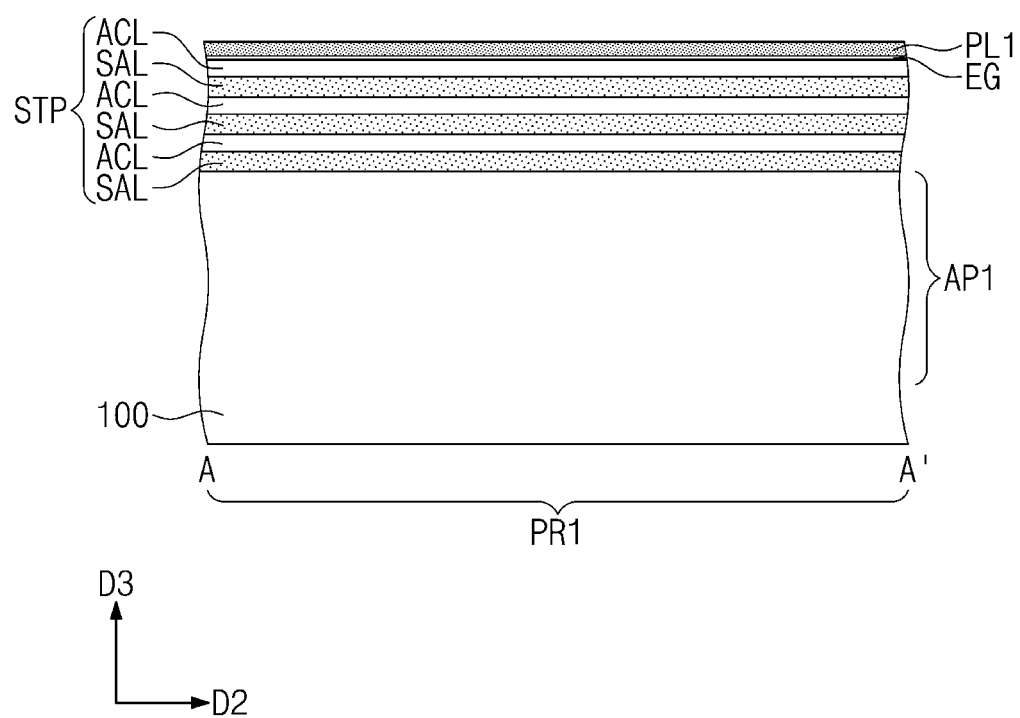
Figure 12B:
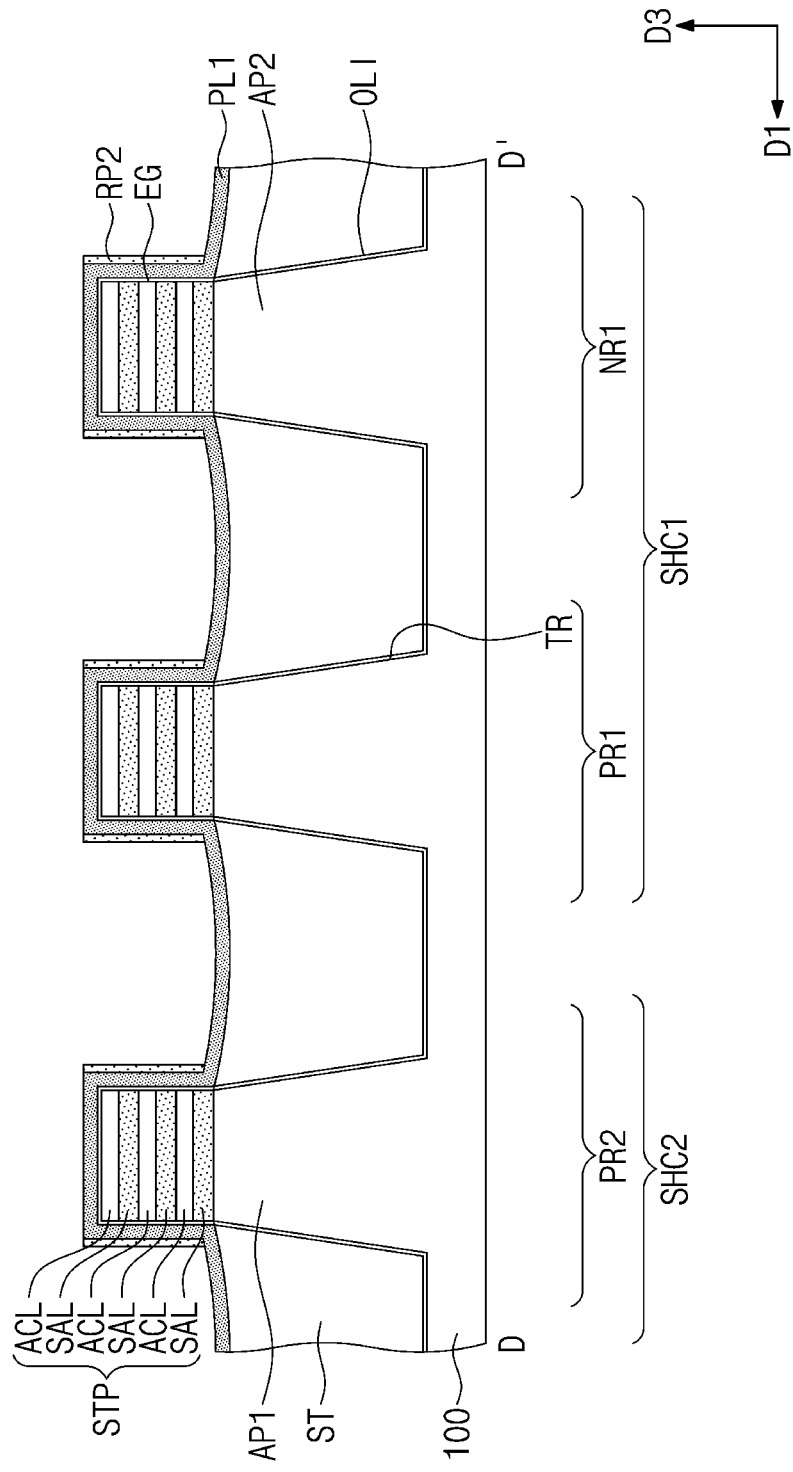

Referring to FIGS. 12A and 12B, an etching process may be performed to etch the second sacrificial layer PL2. The second remaining patterns RP2 may be formed by removing a portion of the second sacrificial layer PL2. The etching process may be performed using an etch-back process. Portions of the second sacrificial layer PL2, which are placed on the top surface of each of the stacking patterns STP and the top surface of the device isolation layer ST, may be removed by the etching process. The second remaining patterns RP2 may be vertically-extending portions of the second sacrificial layer PL2, which are provided on the first sacrificial layer PL1.

Figure 13:
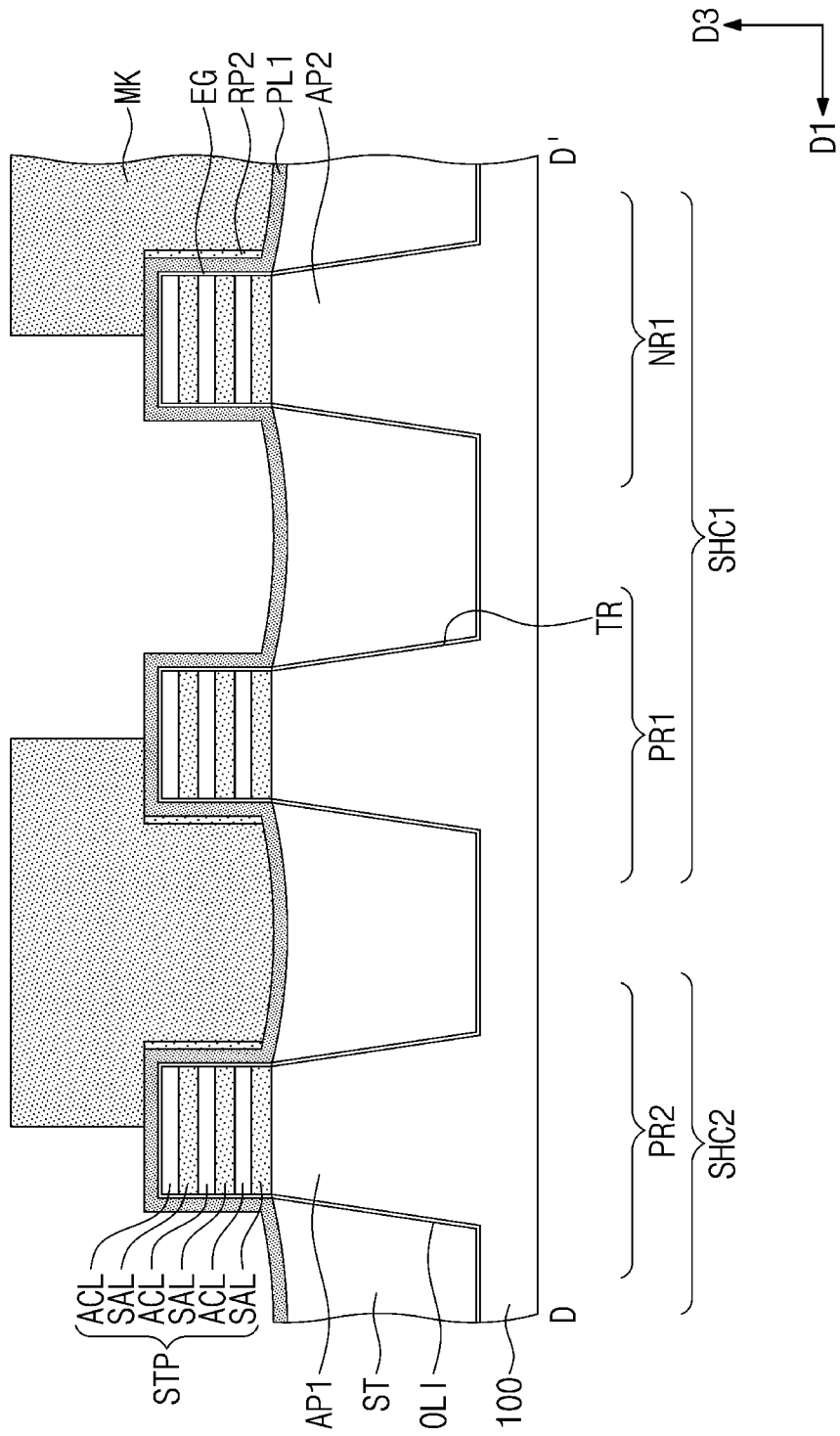

Referring to FIG. 13, masks MK may be partially formed on the first sacrificial layer PL1. An etching process using the masks MK as an etch mask may be performed to selectively remove a portion of the second remaining patterns RP2. The etching process may be a wet etching process that is performed to selectively etch the second remaining patterns RP2. As a result of the etching process, the second remaining patterns RP2 may be left on regions for only the spacer patterns SPP1, SPP2, and SPP3, which will be described below. After the etching process is finished, the masks MK may be removed.

Figure 14A:
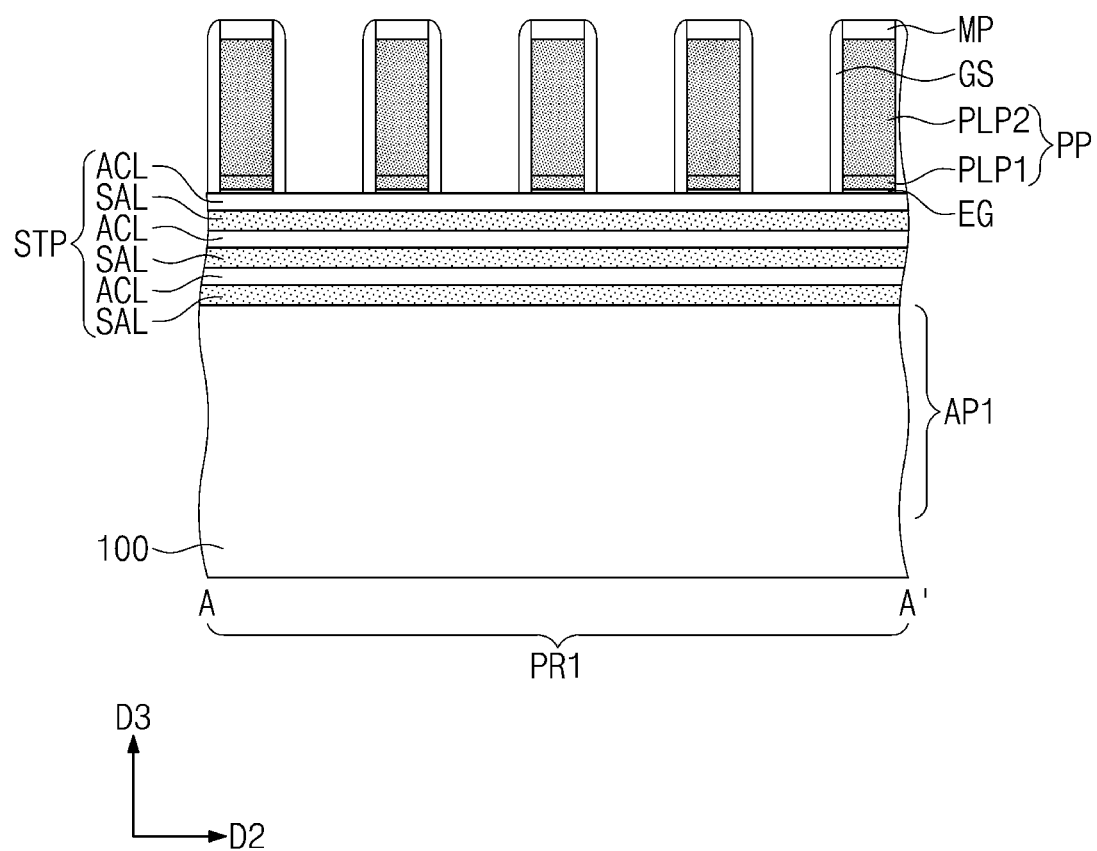
Figure 14B:
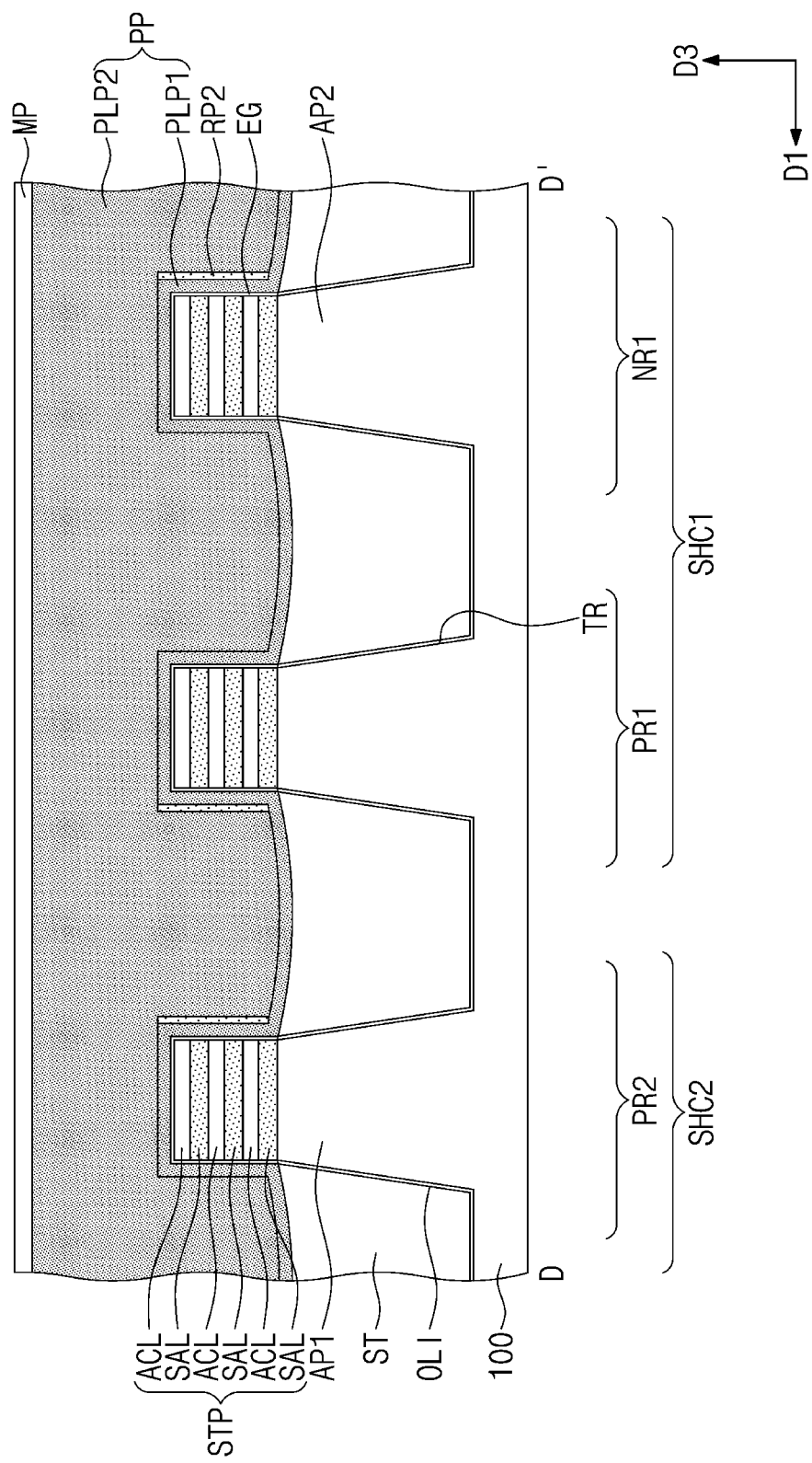
Figure 15A:
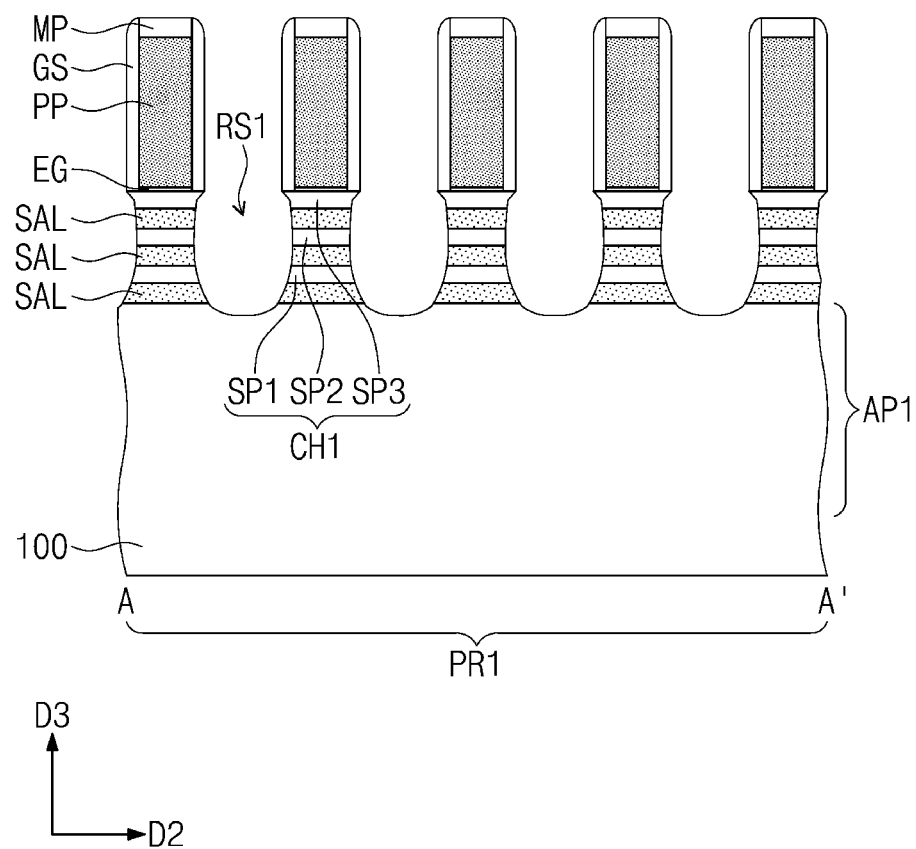
Figure 15B:
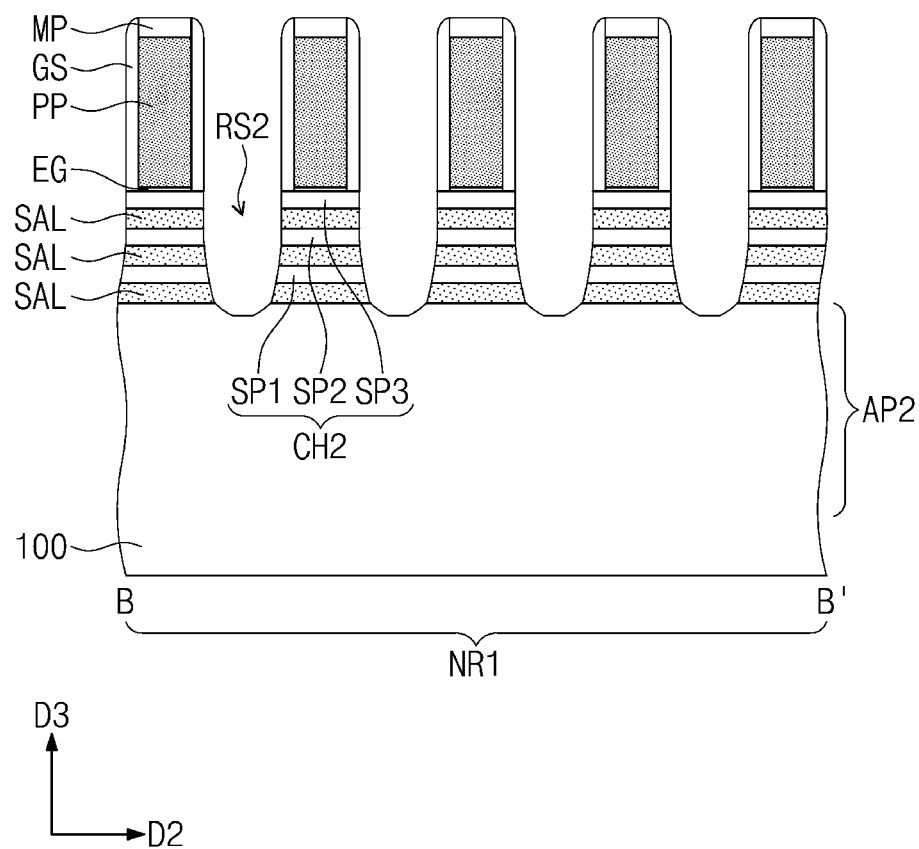
Figure 15C:
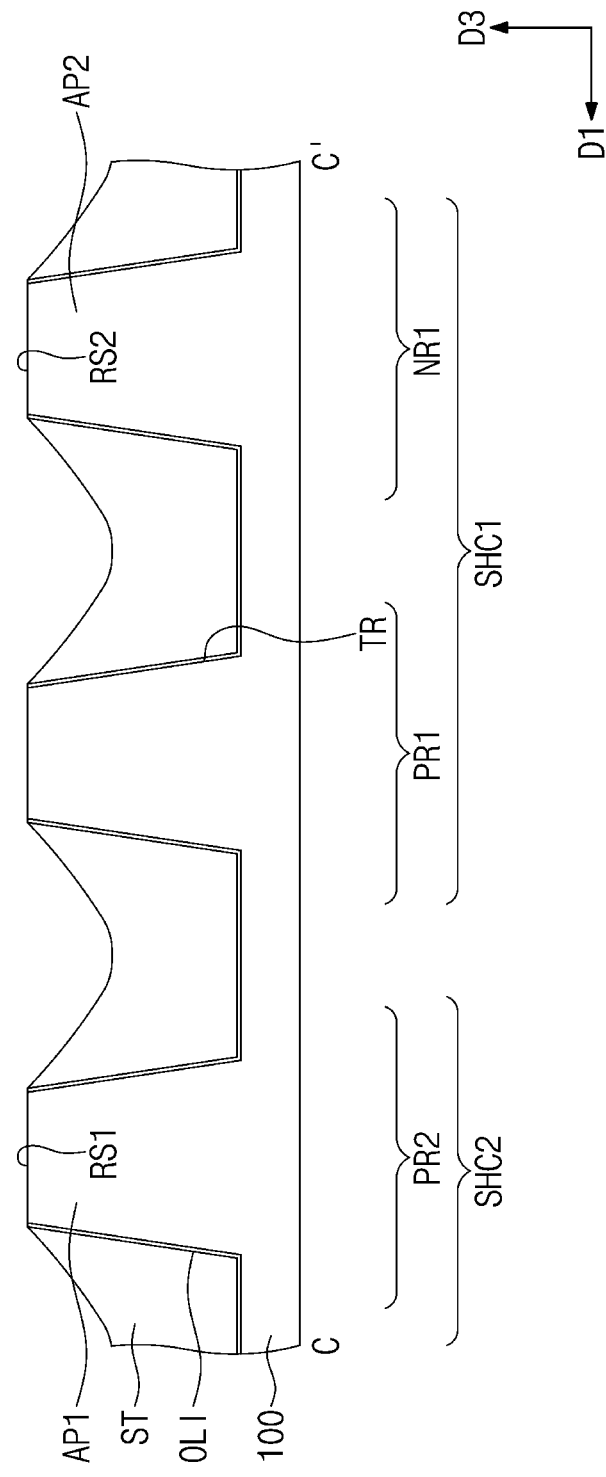
Figure 15D:
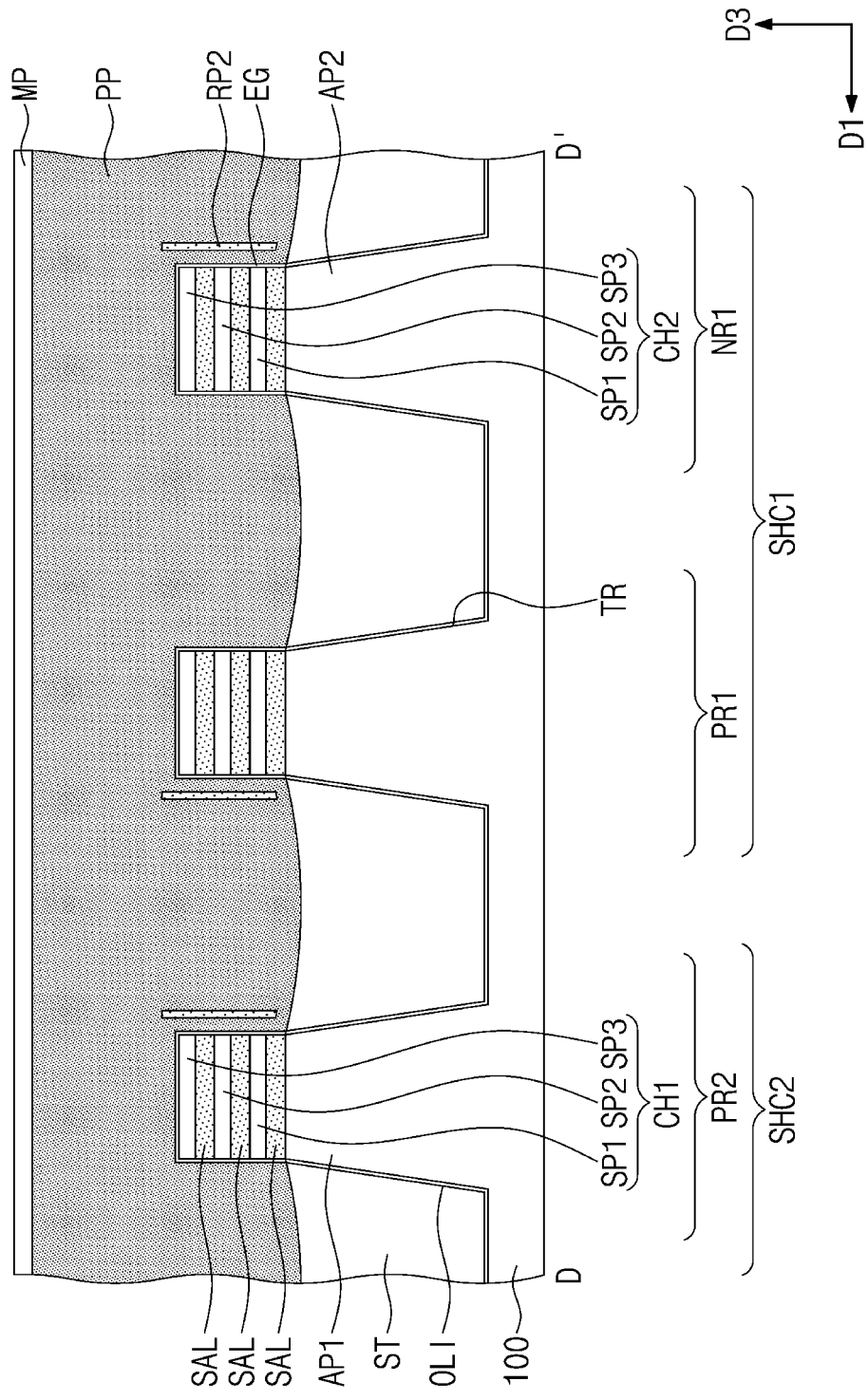

Referring to FIGS. 14A and 14B, a third sacrificial layer (not shown) may be additionally formed on the first sacrificial layer PL1. The third sacrificial layer may be formed of or include the same material as the first sacrificial layer PL1. As an example, the third sacrificial layer may be formed of or include polysilicon. The third sacrificial layer may be formed to be on and at least partially cover the entire top surface of the substrate 100. The third sacrificial layer may be on and at least partially cover the second remaining patterns RP2.

Sacrificial gate patterns PP may be formed on the substrate 100 to cross the stacking patterns STP. Each of the sacrificial gate patterns PP may be a line- or bar-shaped pattern extending in the first direction D1. The sacrificial gate patterns PP may be arranged with a specific pitch in the second direction D2.

In detail, the formation of the sacrificial gate patterns PP may include forming hard mask patterns MP on the third sacrificial layer and patterning the third sacrificial layer and the first sacrificial layer PL1 using the hard mask patterns MP as an etch mask.

The first sacrificial layer PL1 may be patterned to form a first sacrificial pattern PLP1. The third sacrificial layer may be patterned to form a second sacrificial pattern PLP2. The first and second sacrificial patterns PLP1 and PLP2 may constitute the sacrificial gate pattern PP. Because the first and second sacrificial patterns PLP1 and PLP2 include the same material, there may be no observable interface therebetween, unlike that shown in the drawings.

The etch stop layer EG may be partially removed using the hard mask patterns MP as an etch mask. For example, a portion of the etch stop layer EG, which may be on and at least partially covered with the first sacrificial pattern PLP1, may be left, but the remaining portion of the etch stop layer EG, which is not at least partially covered with the first sacrificial pattern PLP1, may be removed.

A pair of the gate spacers GS may be formed on opposite side surfaces of each of the sacrificial gate patterns PP. The formation of the gate spacers GS may include conformally forming a gate spacer layer on the substrate 100 and anisotropically etching the gate spacer layer. The gate spacer layer may be formed of or include at least one of SiCN, SiCON, and/or SiN. In other embodiments, the gate spacer layer may include at least two layers, each of which is formed of at least one of SiCN, SiCON, and/or SiN; that is, the gate spacer layer may have a multi-layered structure.

Referring to FIGS. 15A to 15D, the first recesses RS1 may be formed in the stacking pattern STP on the first active pattern AP1. The second recesses RS2 may be formed in the stacking pattern STP on the second active pattern AP2. During the formation of the first and second recesses RS1 and RS2, the device isolation layer ST, which is located at both sides of each of the first and second active patterns AP1 and AP2, may be further recessed (e.g., see FIG. 15C).

In detail, the first recesses RS1 may be formed by etching the stacking pattern STP on the first active pattern AP1 using the hard mask patterns MP and the gate spacers GS as an etch mask. The first recess RS1 may be formed between a pair of the sacrificial gate patterns PP. The second recesses RS2 in the stacking pattern STP on the second active pattern AP2 may be formed by the same method as that for the first recesses RS1.

The first to third semiconductor patterns SP1, SP2, and SP3, which are sequentially stacked between adjacent ones of the first recesses RS1, may be formed from the active layers ACL. Similarly, the first to third semiconductor patterns SP1, SP2, and SP3, which are sequentially stacked between adjacent ones of the second recesses RS2, may be formed from the active layers ACL. The first to third semiconductor patterns SP1, SP2, and SP3 between the adjacent ones of the first recesses RS1 may constitute the first channel pattern CH1 The first to third semiconductor patterns SP1, SP2, and SP3 between the adjacent ones of the second recesses RS2 may constitute the second channel pattern CH2.

Figure 16A:
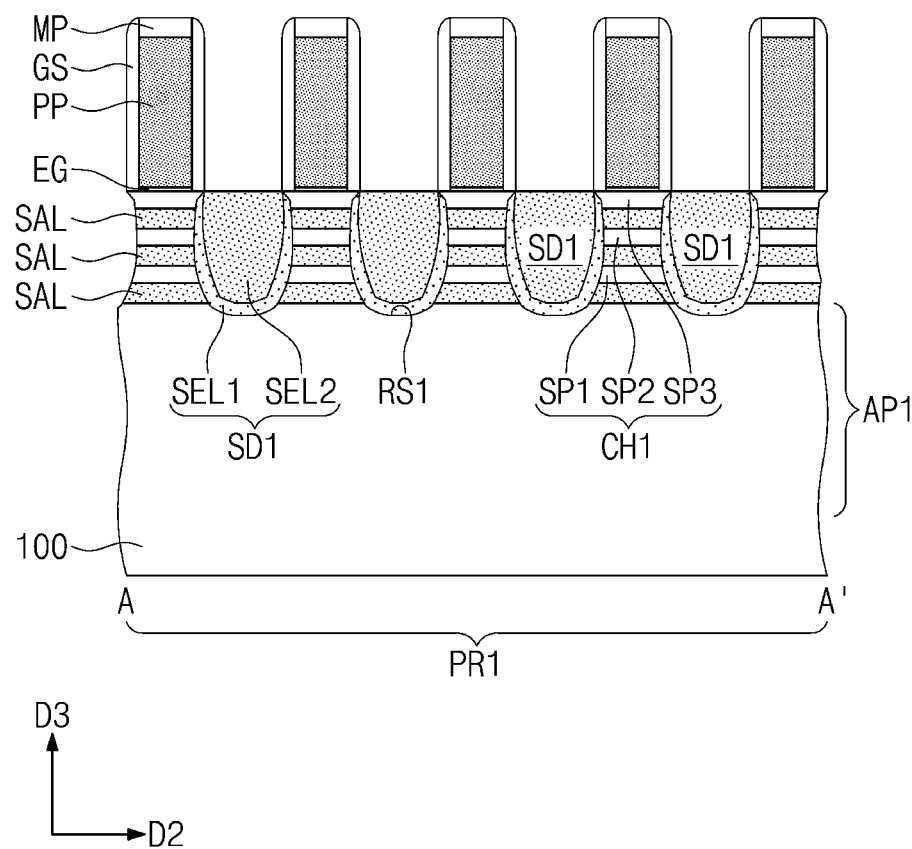
Figure 16B:
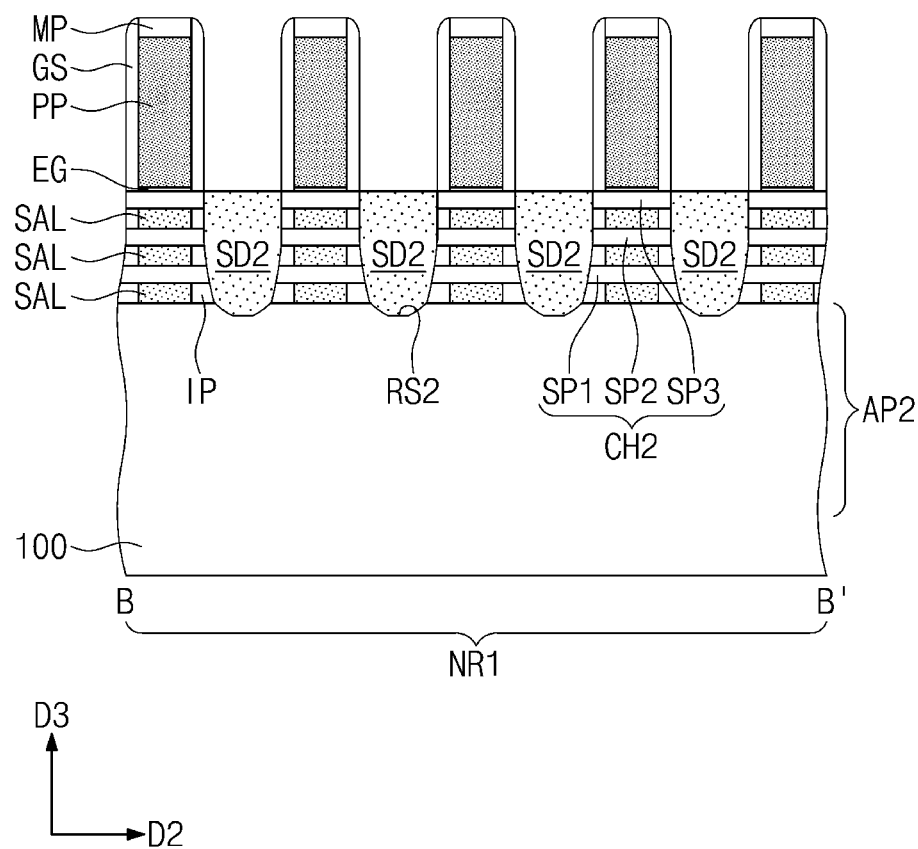
Figure 16C:
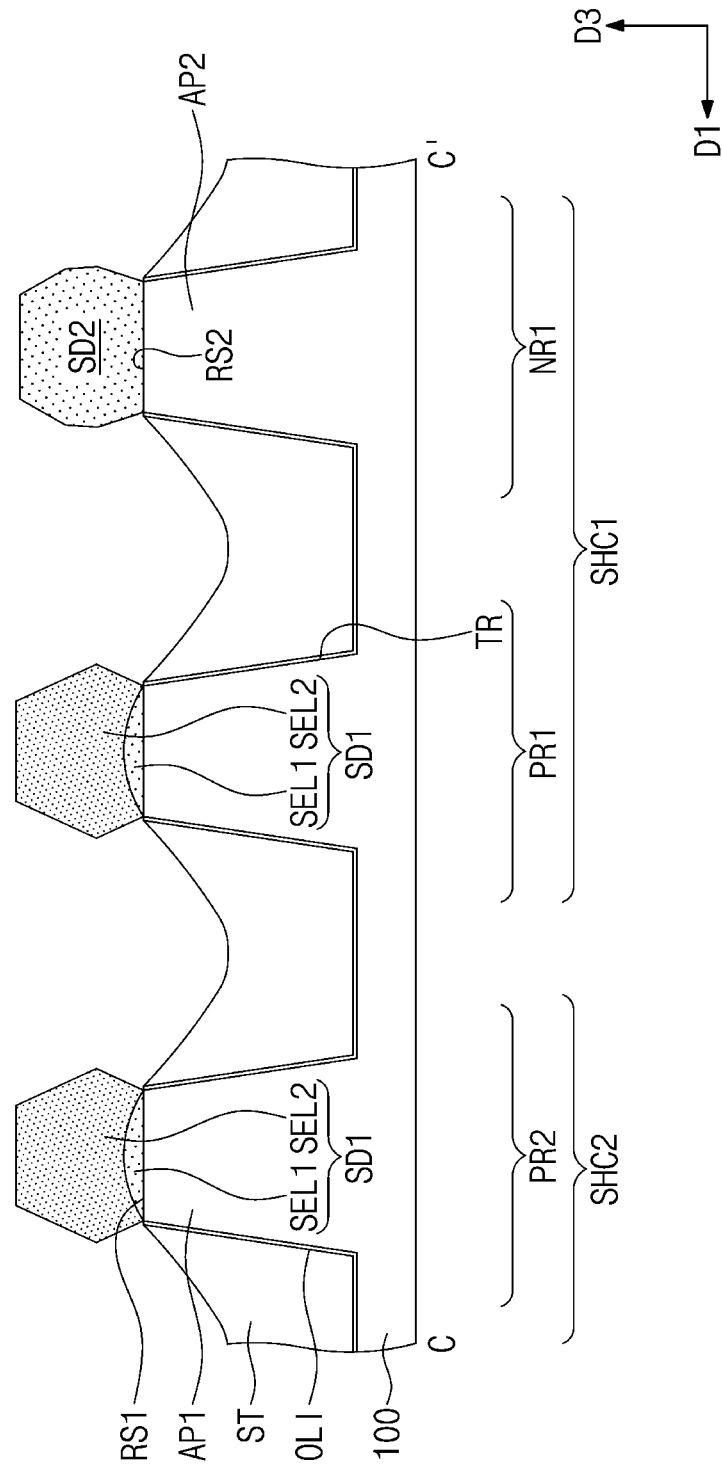
Figure 17A:
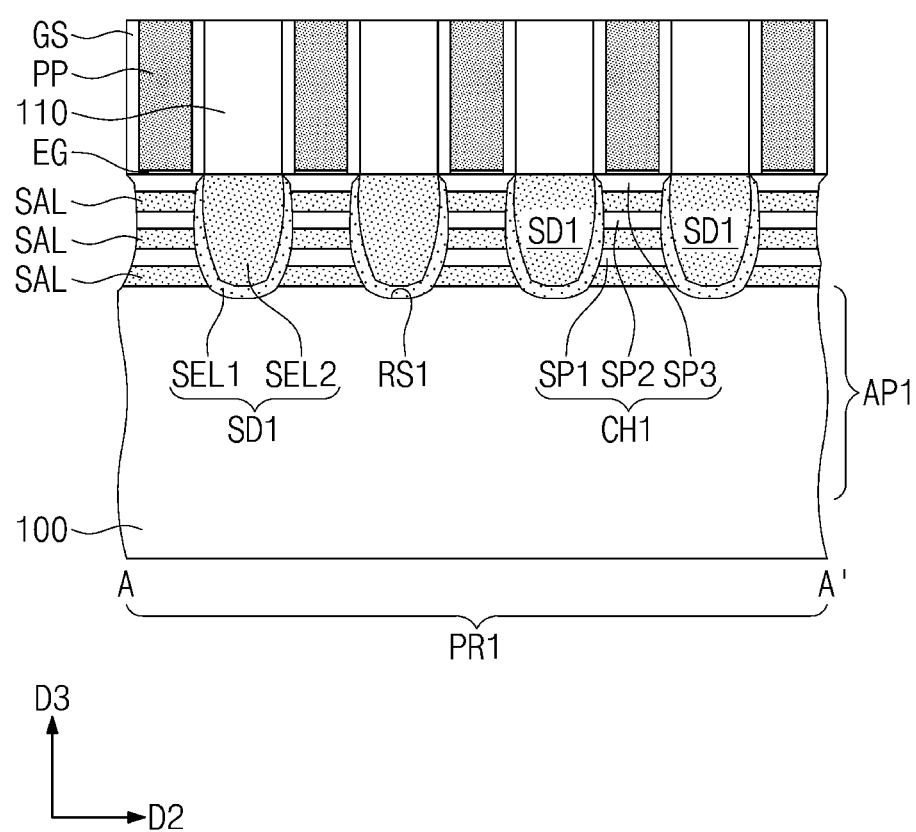
Figure 17B:
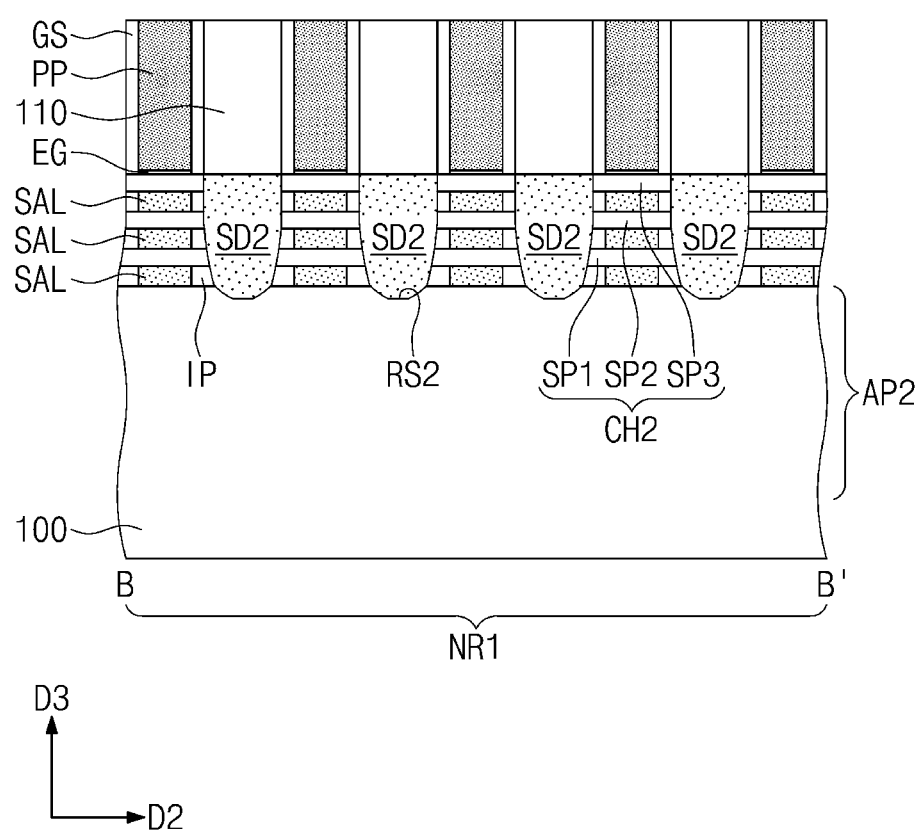
Figure 17C:
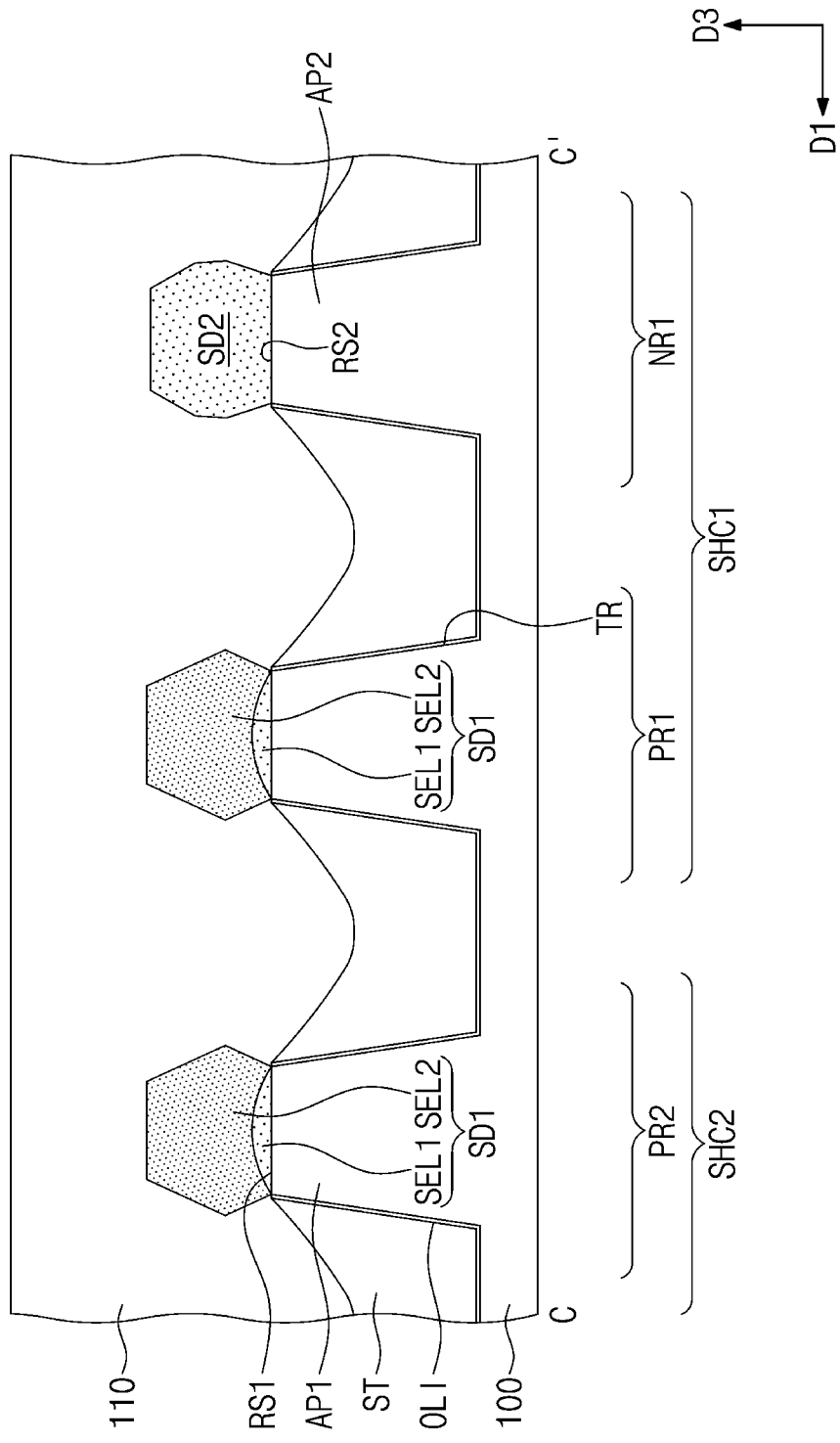
Figure 17D:
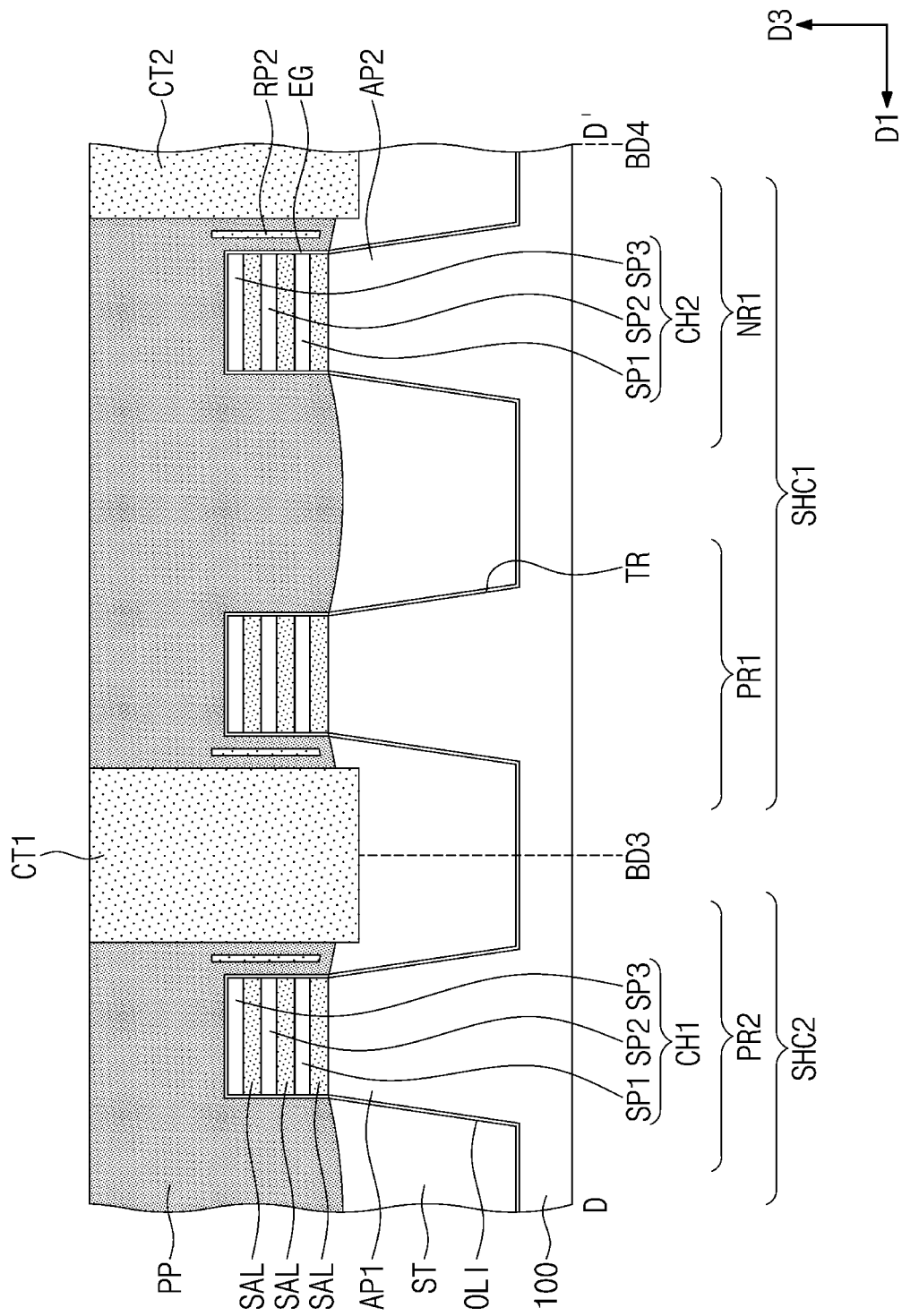
Figure 18A:
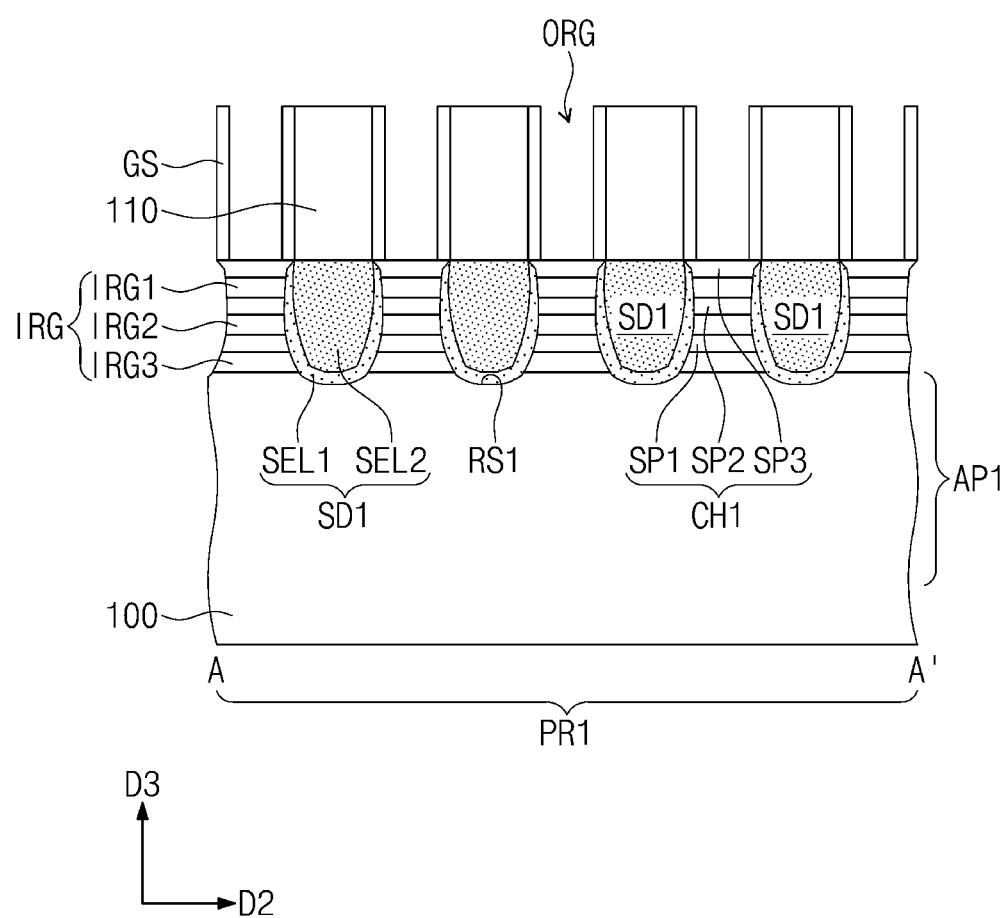
Figure 18B:
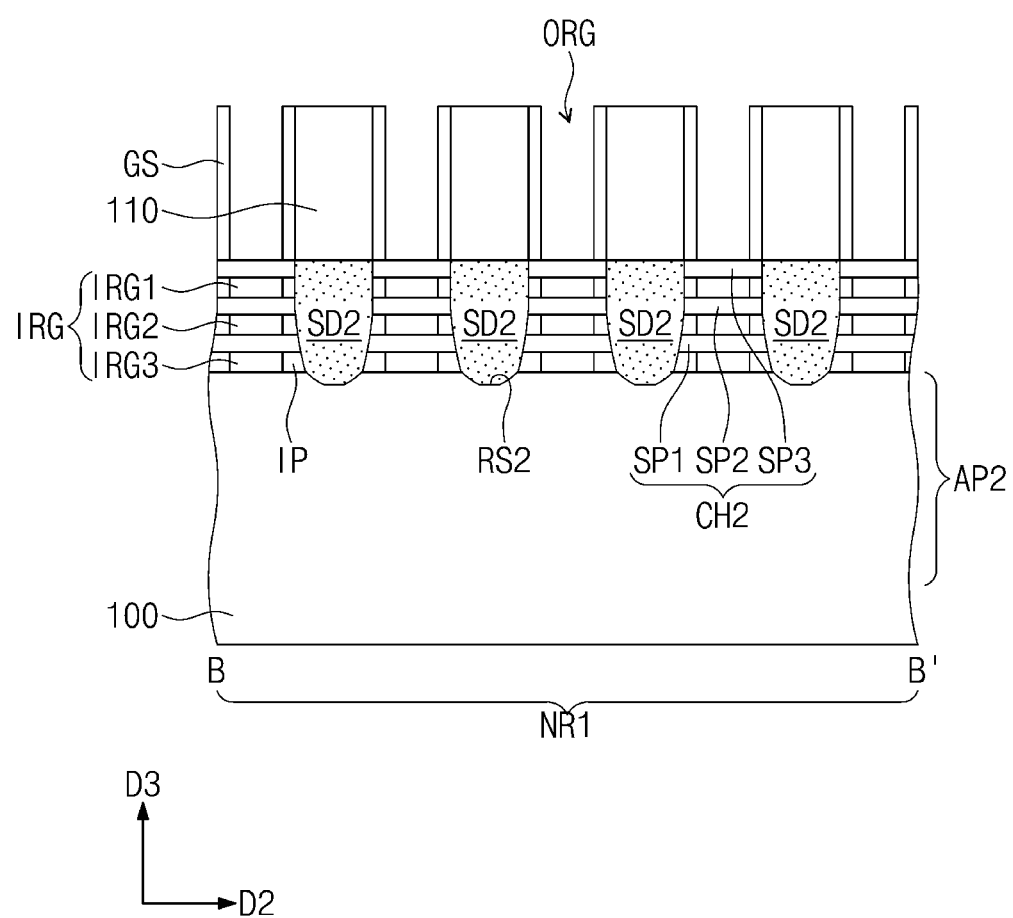
Figure 18C:
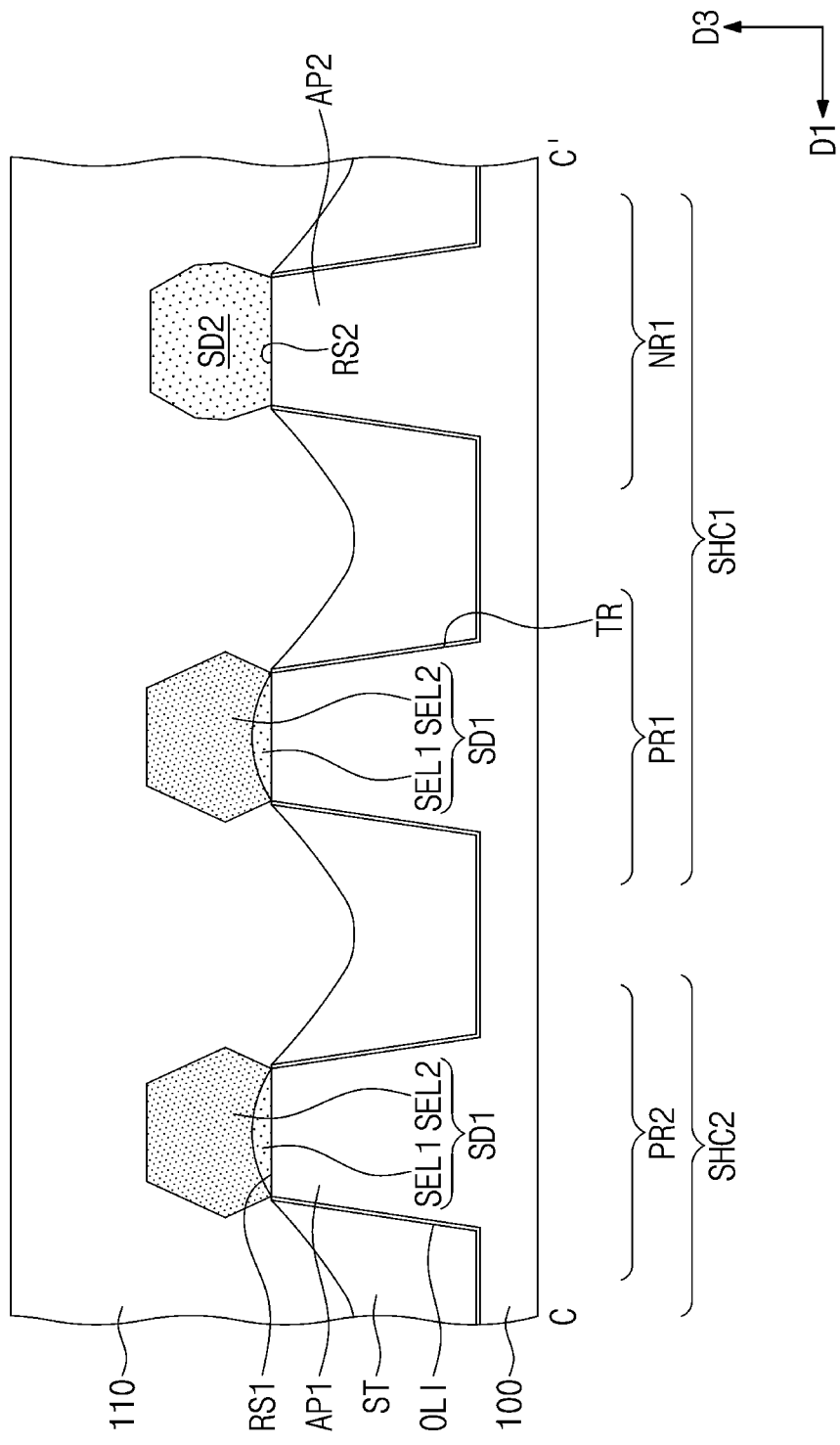
Figure 18D:
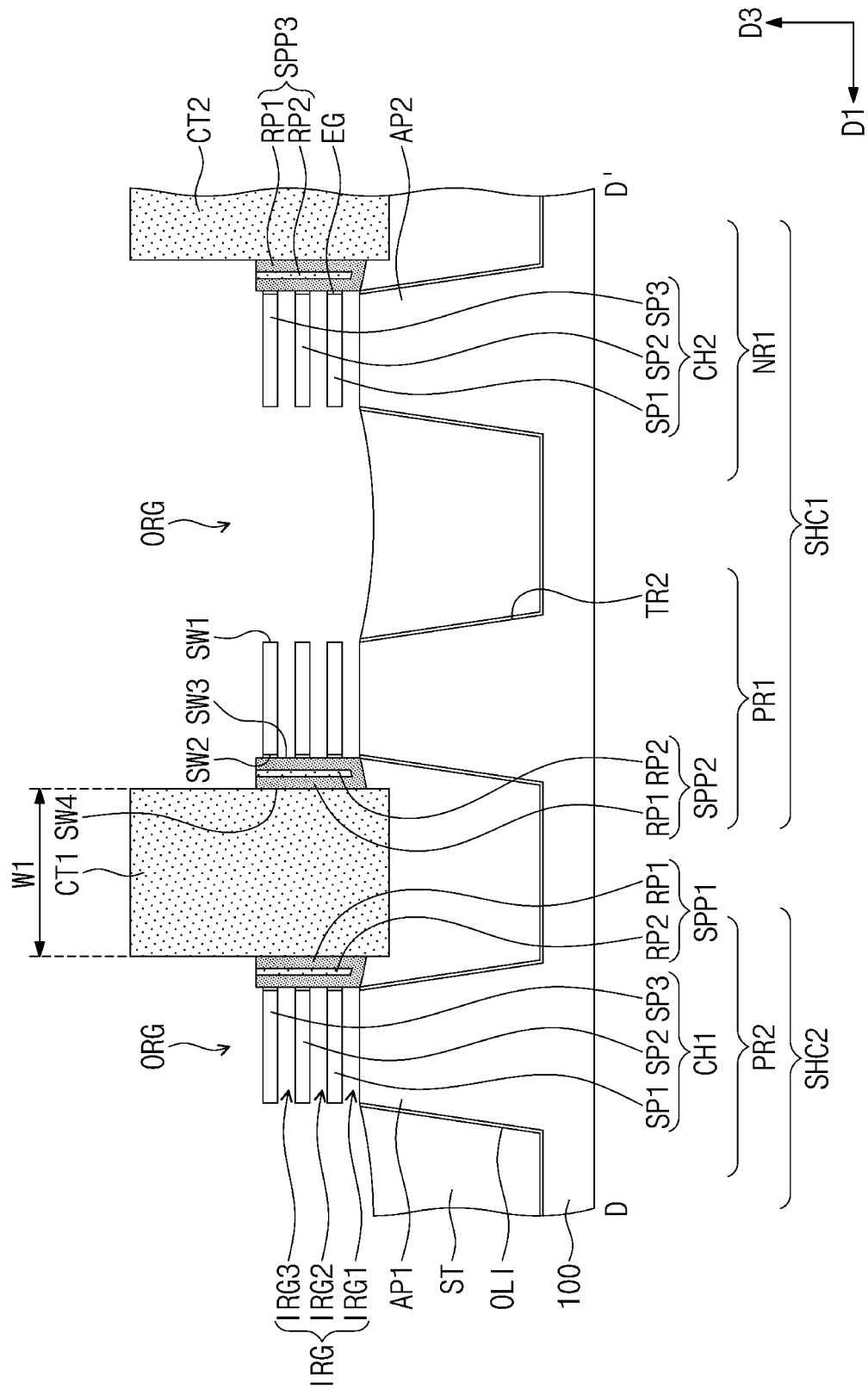
Figure 19A:
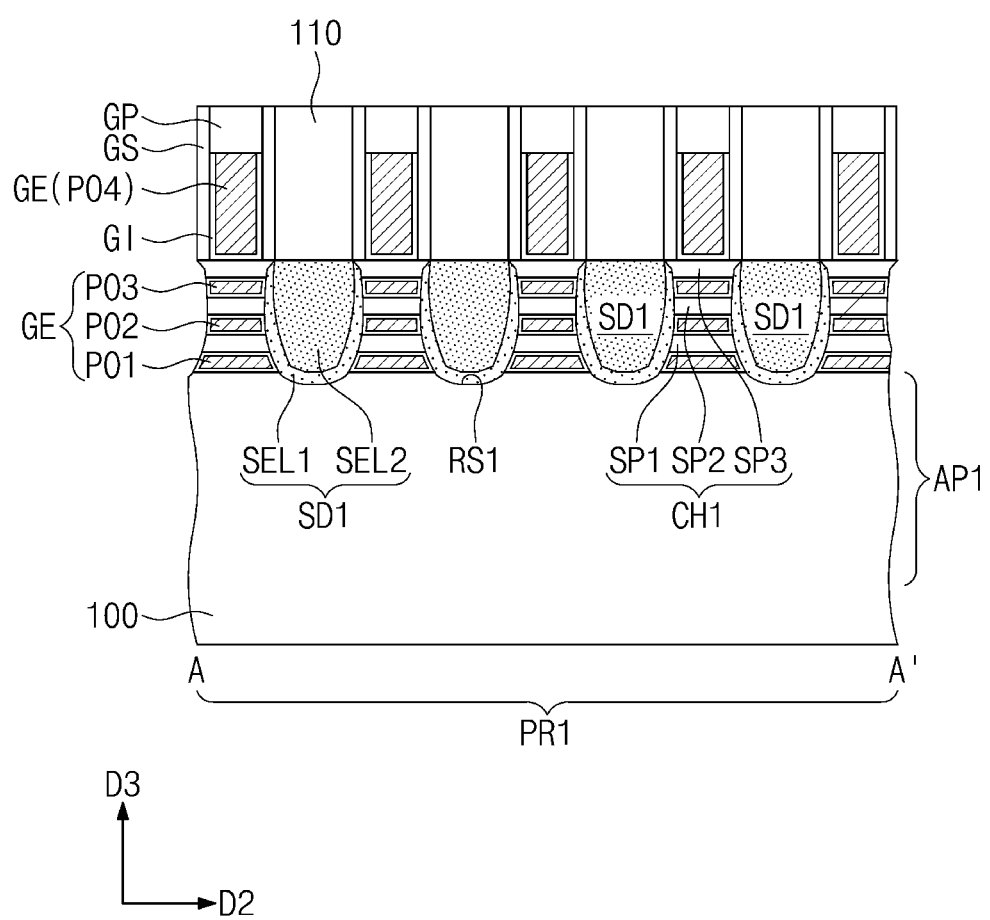
Figure 19B:
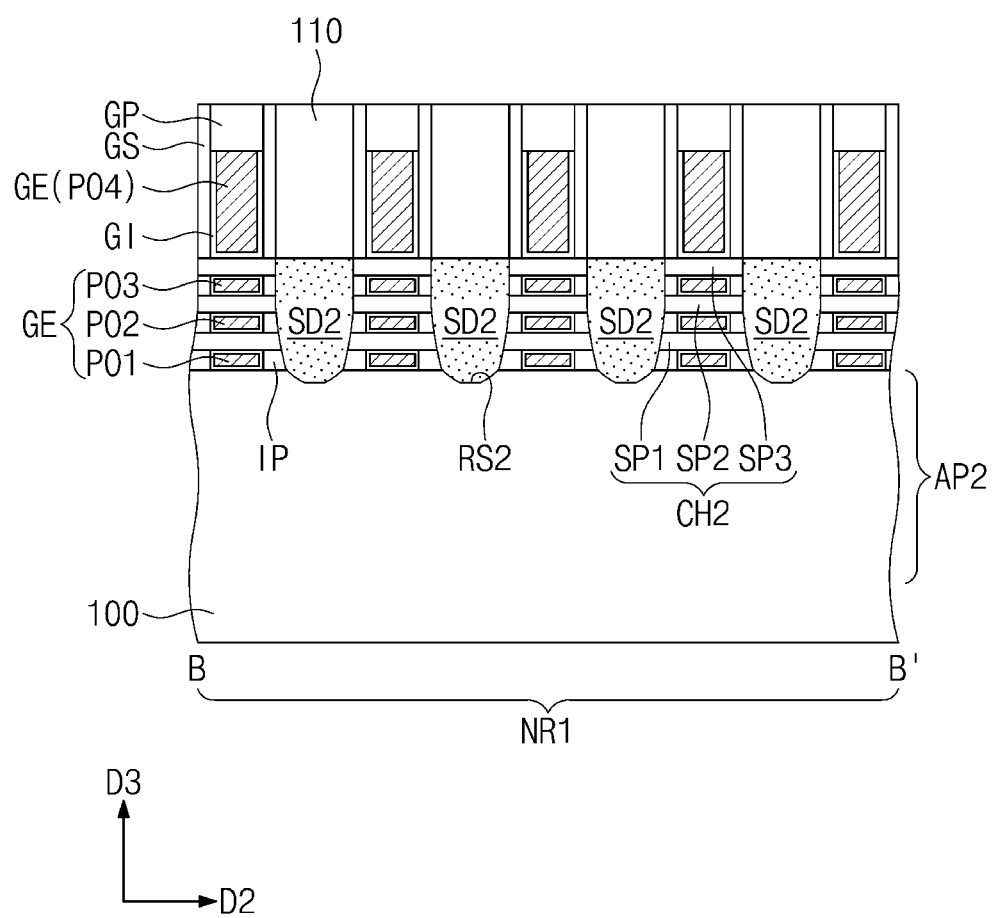
Figure 19C:
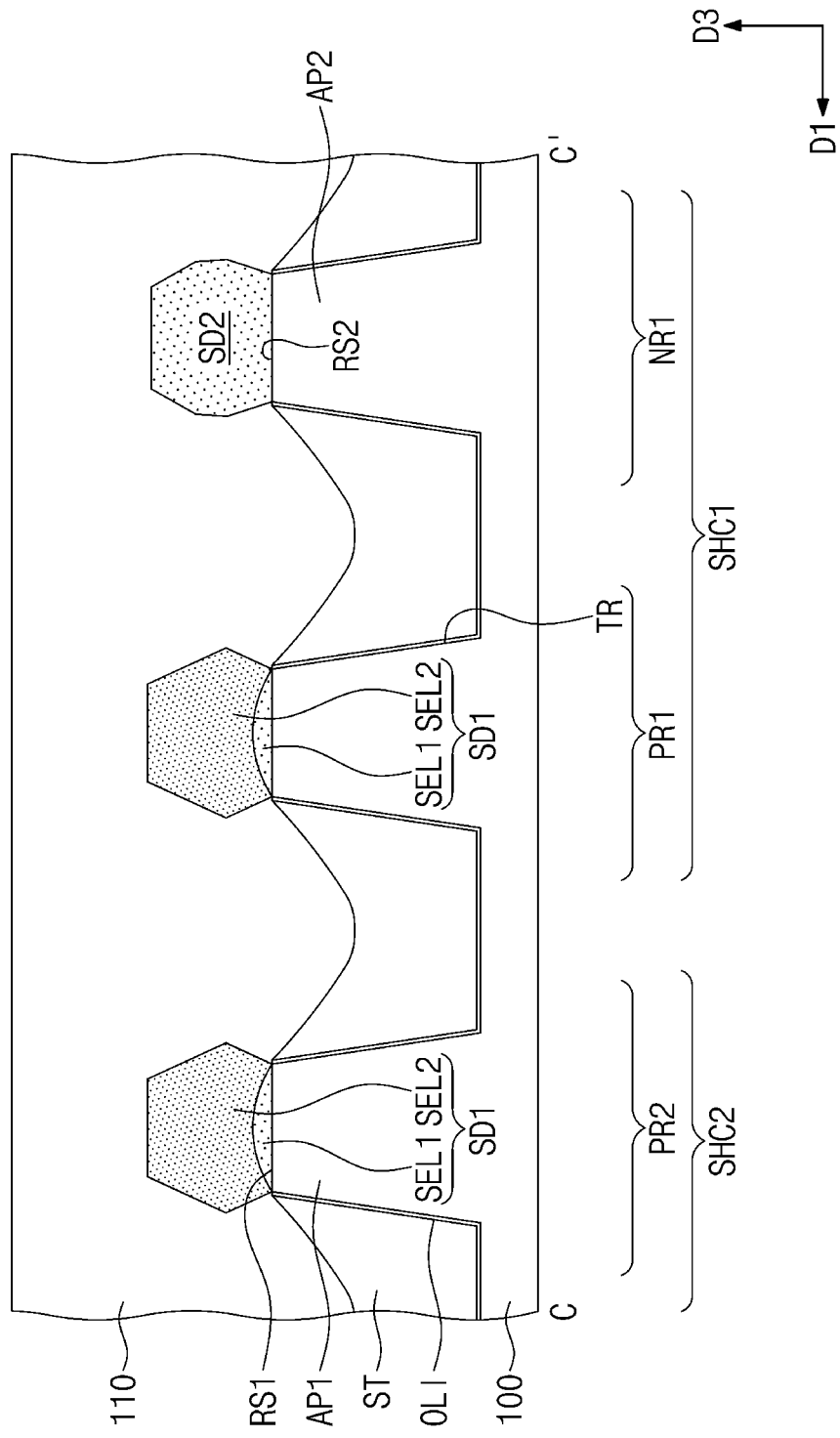
Figure 19D:
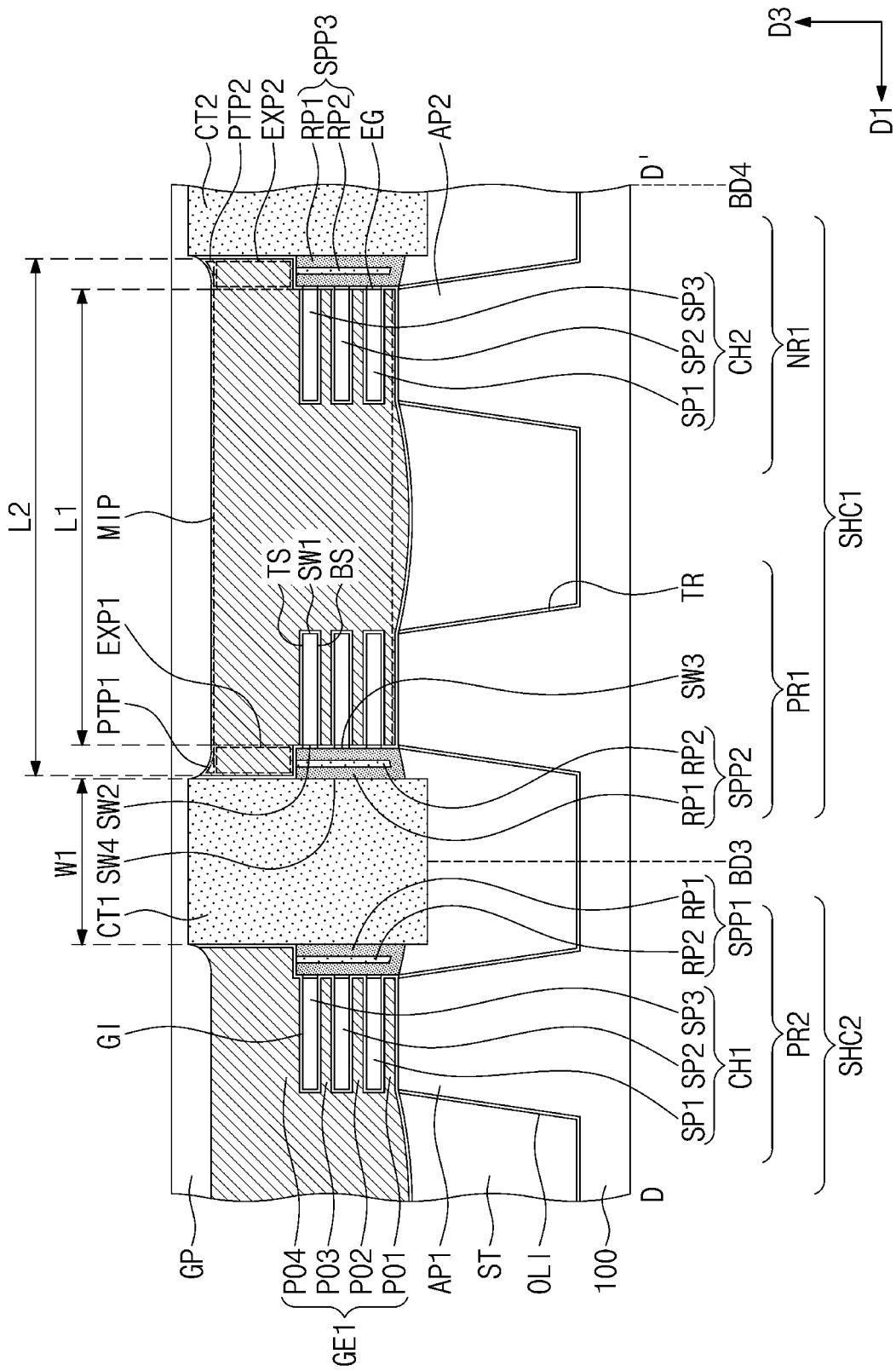

Referring to FIGS. 16A to 16C, the first source/drain patterns SD1 may be formed in the first recesses RS1, respectively. Specifically, a first SEG process, in which an inner surface of the first recess RS1 is used as a seed layer, may be performed to form a first semiconductor layer SEL1 The first semiconductor layer SEL1 may be grown using first to third semiconductor patterns SP1, SP2, and SP3 and the substrate 100, which are exposed through the first recess RS1, as a seed. As an example, the first SEG process may include a chemical vapor deposition (CVD) process or a molecular beam epitaxy (MBE) process.

The first semiconductor layer SEL1 may be formed of or include a semiconductor material (e.g., SiGe) having a lattice constant greater than that of the substrate 100. The first semiconductor layer SEL1 may be formed to have a relatively low germanium concentration. In other embodiments, the first semiconductor layer SEL1 may contain only silicon (Si) but not germanium (Ge). The germanium concentration of the first semiconductor layer SEL1 may range from 0 at % to 10 at %.

The second semiconductor layer SEL2 may be formed by performing a second SEG process on the first semiconductor layer SEL1 The second semiconductor layer SEL2 may be formed to partially or completely fill the first recess RS1. The second semiconductor layer SEL2 may be provided to have a relatively high germanium concentration. As an example, the germanium concentration of the second semiconductor layer SEL2 may range from 30 at % to 70 at %.

The first and second semiconductor layers SEL1 and SEL2 may constitute the first source/drain pattern SD1. The first and second semiconductor layers SEL1 and SEL2 may be doped with impurities in situ during the first and second SEG processes. In other embodiments, the first source/drain pattern SD1 may be doped with impurities after the formation of the first source/drain pattern SD1. The first source/drain pattern SD1 may be doped to have a first conductivity type (e.g., p-type).

The second source/drain patterns SD2 may be formed in the second recesses RS2, respectively. In detail, the second source/drain pattern SD2 may be formed by a third SEG process in which an inner surface of the second recess RS2 is used as a seed layer. In an embodiment, the second source/drain pattern SD2 may be formed of or include the same semiconductor material (e.g., Si) as the substrate 100. The second source/drain pattern SD2 may be doped to have a second conductivity type (e.g., n-type). The inner spacers IP may be respectively formed between the second source/drain pattern SD2 and the sacrificial layers SAL.

Referring to FIGS. 17A to 17D, the first interlayer insulating layer 110 may be formed to be on and at least partially cover the first and second source/drain patterns SD1 and SD2, the hard mask patterns MP, and the gate spacers GS. In an embodiment, the first interlayer insulating layer 110 may be formed of or include silicon oxide.

The first interlayer insulating layer 110 may be planarized to expose top surfaces of the sacrificial gate patterns PP. The planarization of the first interlayer insulating layer 110 may be performed using an etch-back or chemical-mechanical polishing (CMP) process. All of the hard mask patterns MP may be removed during the planarization process. Thus, the top surface of the first interlayered insulating layer 110 may be generally coplanar with the top surfaces of the sacrificial gate patterns PP and the gate spacers GS.

A photolithography process may be performed to selectively open a portion of the sacrificial gate pattern PP. For example, a portion of the sacrificial gate pattern PP on the third and fourth borders BD3 and BD4 of the first single height cell SHC1 may be selectively opened. The opened portion of the sacrificial gate pattern PP may be selectively etched to form empty spaces. Thereafter, the gate cutting pattern CT1 and CT2 may be formed by at least partially filling the empty spaces with an insulating material.

Referring to FIGS. 18A to 18D, the exposed sacrificial gate patterns PP may be selectively removed. As a result of the removal of the sacrificial gate patterns PP, an outer region ORG may be formed to expose the first and second channel patterns CH1 and CH2.

The removal of the sacrificial gate patterns PP may include a wet etching process, which is performed using an etching solution capable of etching polysilicon. Here, in the case where the distance between the gate cutting pattern CT1 or CT2 and the channel pattern CH1 or CH2 is relatively large, the etching solution may be supplied into regions between the gate cutting pattern CT1 or CT2 and the channel pattern CH1 or CH2 to fully remove the sacrificial gate pattern PP formed of polysilicon. However, in the case where the distance between the gate cutting pattern CT1 or CT2 and the channel pattern CH1 or CH2 is small, it may be difficult to supply the etching solution to the sacrificial gate pattern PP formed of polysilicon, and in this case, a portion of the sacrificial gate pattern PP may be left to form the first remaining pattern RP1. Accordingly, the spacer patterns SPP1 to SPP3 including the first and second remaining patterns RP1 and RP2 may be formed.

According to an embodiment of the inventive concept, because the second remaining pattern RP2 is provided, it may be possible to reduce a thickness of the sacrificial gate pattern PP formed between the gate cutting pattern CT1 or CT2 and the channel pattern CH1 or CH2. In other words, the width of the sacrificial gate pattern PP may be small, compared with the case that the second remaining pattern RP2 is not provided. Accordingly, the first remaining pattern RP1 may be formed, even when the distance between the first gate cutting pattern CT1 and the channel pattern CH1 or CH2 is relatively large.

The first spacer pattern SPP1 may be formed between the first gate cutting pattern CT1 and the first channel pattern CH1 on the second PMOSFET region PR2. The second spacer pattern SPP2 may be formed between the first gate cutting pattern CT1 and the first channel pattern CH1 on the first PMOSFET region PR1. The third spacer pattern SPP3 may be formed between the second gate cutting pattern CT2 and the second channel pattern CH2 on the first NMOSFET region NR1.

The sacrificial layers SAL exposed through the outer region ORG may be selectively removed to form inner regions IRG. In detail, an etching process of selectively etching only the sacrificial layers SAL may be performed to remove only the sacrificial layers SAL and to leave the first to third semiconductor patterns SP1, SP2, and SP3. The etching process may be chosen to exhibit a high etch rate for a material (e.g., SiGe) having a relatively high germanium concentration. A portion of the etch stop layer EG may also be removed when the sacrificial layers SAL are removed. A portion of the etch stop layer EG, which is interposed between the spacer patterns SPP1 to SPP3 and the channel pattern CH1 or CH2, may not be removed.

Referring back to FIG. 18D, empty regions, which are formed by removing the sacrificial layers SAL, may be formed as first to third inner regions IRG1, IRG2, and IRG3, respectively. In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3. Even when the first to third inner regions IRG1, IRG2, and IRG3 are formed, the first to third semiconductor patterns SP1, SP2, and SP3 may not collapse down, due to the presence of the spacer patterns SPP1 to SPP3, and the shapes of the first to third semiconductor patterns SP1, SP2, and SP3 may be maintained as they are.

Referring to FIGS. 19A to 19D, the gate insulating layer GI may be conformally formed on the exposed first to third semiconductor patterns SP1, SP2, and SP3. The gate electrode GE may be formed on the gate insulating layer GI.

The gate electrode GE may include the first to third portions PO1, PO2, and PO3, which are respectively formed in the first to third inner regions IRG1, IRG2, and IRG3, and the fourth portion PO4, which is formed in the outer region ORG.

The gate electrode GE may be recessed and may have a reduced height. During the recessing of the gate electrode GE, upper portions of the first and second gate cutting patterns CT1 and CT2 may also be partially recessed. The gate capping pattern GP may be formed on the recessed gate electrode GE.

Referring back to FIGS. 4 and 5A to 5E, the second interlayer insulating layer 120 may be formed on the first interlayer insulating layer 110. The active contacts AC may penetrate the second interlayer insulating layer 120 and the first interlayer insulating layer 110 and may be electrically connected to the first and second source/drain patterns SD1 and SD2. The gate contact GC may penetrate the second interlayer insulating layer 120 and the gate capping pattern GP and to be electrically connected to the gate electrode GE.

A pair of the division structures DB may be formed at both sides of each of the first and second single height cells SHC1 and SHC2. The division structure DB may penetrate the second interlayer insulating layer 120 and the gate electrode GE and may extend into the active pattern AP1 or AP2.

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

Figure 20:
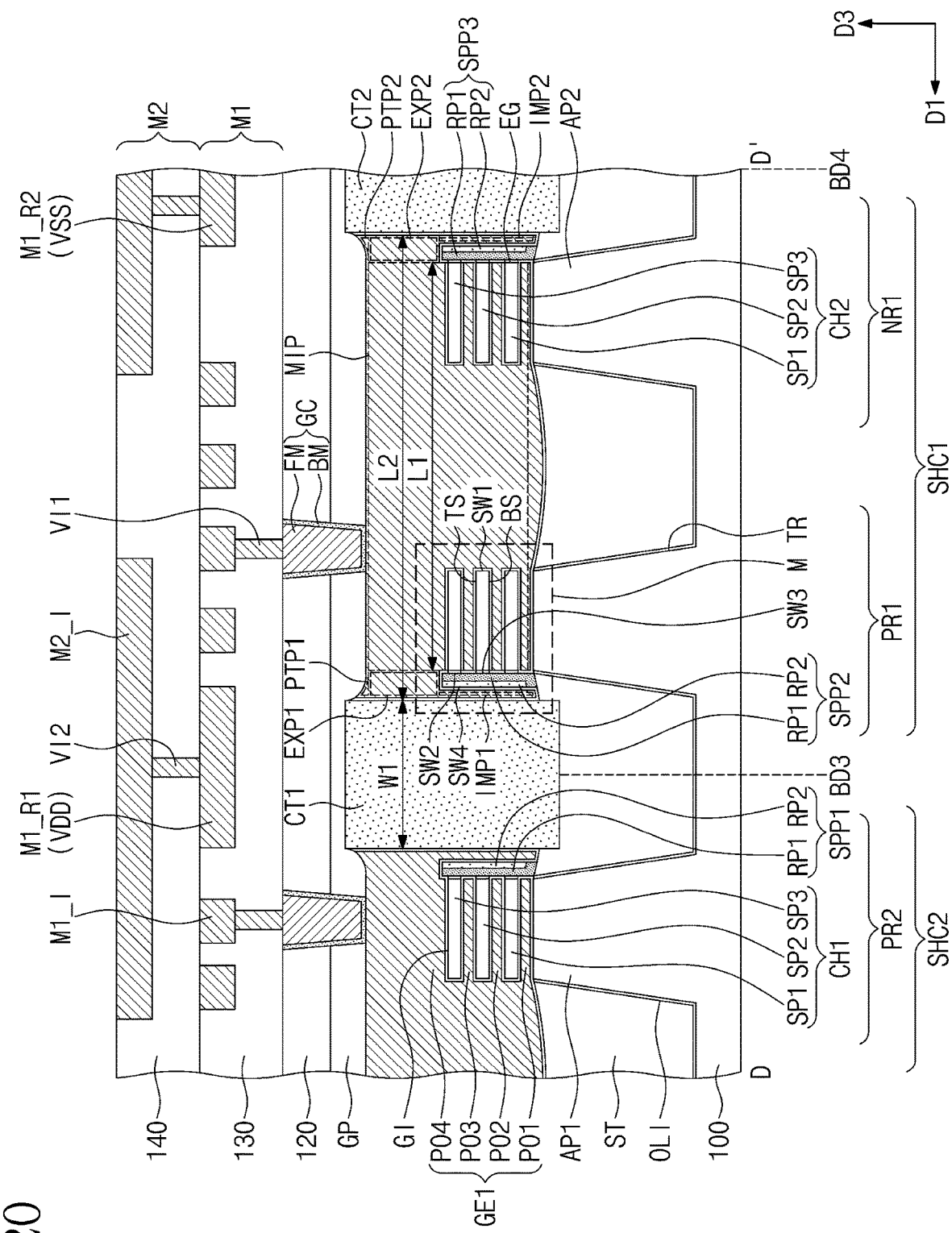
FIG. 20 is a sectional view, which is taken along the line E-E' of FIG. 4, that illustrates a semiconductor device according to an embodiment of the inventive concept.
Figure 21:
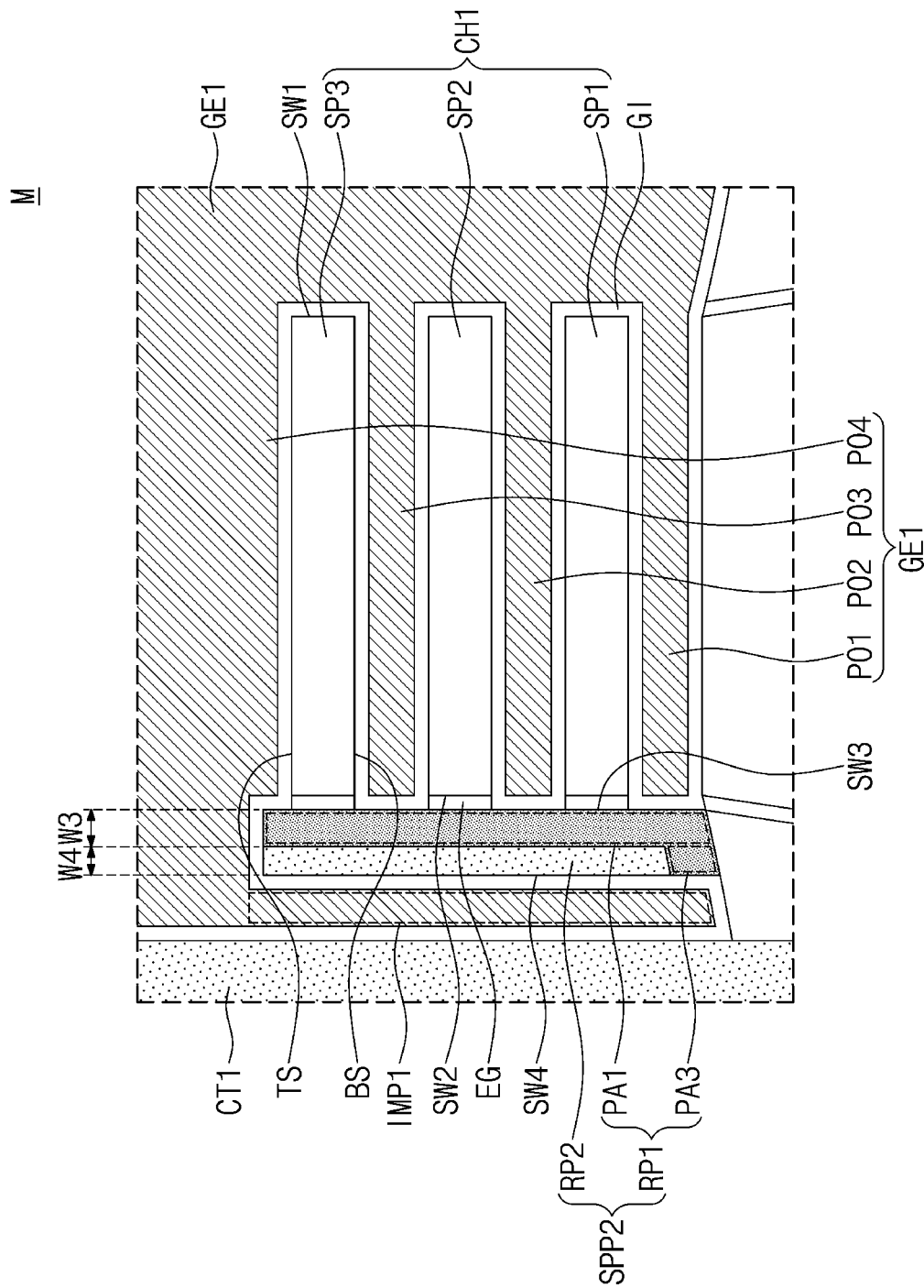
FIG. 21 is an enlarged sectional view illustrating an example of a portion 'M' of FIG. 20.

FIG. 20 is a sectional view, which is taken along the line E-E' of FIG. 4 that illustrates a semiconductor device according to an embodiment of the inventive concept. FIG. 21 is an enlarged sectional view illustrating an example of a portion 'M' of FIG. 20. In the following description, an element previously described with reference to FIGS. 4, 5A to 5E, and 6 may be identified by the same reference number without repeating an overlapping description thereof, for the sake of brevity.

Referring to FIGS. 20 and 21, the spacer patterns SPP1 to SPP3 may include the first remaining pattern RP1 and the second remaining pattern RP2, but the second pattern PA2 of the first remaining pattern RP1 may be omitted. The first gate electrode GE1 may further include a first intervening portion IMP1, which is interposed between the second spacer pattern SPP2 and the first gate cutting pattern CT1, and a second intervening portion IMP2, which is interposed between the third spacer pattern SPP3 and the second gate cutting pattern CT2. The second remaining pattern RP2 of the second spacer pattern SPP2 may be spaced apart from the first gate cutting pattern CT1, with the first intervening portion IMP1 and the gate insulating layer GI interposed therebetween. The first intervening portion IMP1 may vertically (D3 direction) overlap the first extended portion EXP1. The second intervening portion IMP2 may vertically (D3 direction) overlap the second extended portion EXP2.

According to an embodiment of the inventive concept, a semiconductor device may include a spacer pattern, which is provided between a channel pattern and a gate cutting pattern and is used to reduce a length and a volume of a gate electrode. Accordingly, it may be possible to reduce parasitic capacitance between the gate electrode and an active contact and thereby to improve electrical characteristics and an operation speed of the semiconductor device.

In addition, the spacer pattern may include a first remaining pattern and a second remaining pattern, which is formed of or includes a material different from the first remaining pattern. The second remaining pattern may be provided on the first remaining pattern, and this may make it possible to reduce a thickness of the first remaining pattern. Accordingly, even when a distance between the gate cutting pattern and the channel pattern is relatively large, it may be possible to completely remove a sacrificial gate pattern and thereby reduce the risk of the first remaining pattern being imperfectly formed. Accordingly, by separating the gate cutting pattern from the channel pattern by a relatively large distance, it may be possible to reduce the likelihood of or prevent a short circuit issue, which may occur when a protruding portion of the gate electrode is in physical contact with an active contact adjacent thereto, and to reduce the parasitic capacitance between the gate electrode and the active contact. As a result, it may be possible to improve the electrical characteristics of the semiconductor device.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a first active pattern on a substrate;
a pair of first source/drain patterns on the first active pattern and a first channel pattern between the first source/drain patterns, the first channel pattern comprising first semiconductor patterns, which are spaced apart from each other in a stacked formation;
a gate electrode on the first channel pattern;
a first gate cutting pattern adjacent to the first channel pattern that penetrates the gate electrode; and
a first spacer pattern between the first gate cutting pattern and the first channel pattern,
wherein the first spacer pattern comprises:
a first remaining pattern adjacent to an outermost side surface of at least one of the first semiconductor patterns; and
a second remaining pattern on the first remaining pattern,
wherein the second remaining pattern is spaced apart from the first gate cutting pattern,
wherein the gate electrode comprises a first extended portion, which is in an upper portion thereof and overlaps the first spacer pattern in a direction generally perpendicular to a plane defined by the substrate, and a protruding portion, which is on the first extended portion, and
wherein a height of a top surface of the protruding portion increases with decreasing distance to the first gate cutting pattern.

2. The semiconductor device of claim 1, wherein the first and second remaining patterns comprise different materials from each other.

3. The semiconductor device of claim 1, wherein at least one of the first semiconductor patterns comprises a top surface, a bottom surface, a first side surface, and a second side surface opposite to the first side surface,
wherein the second side surface corresponds to the outermost side surface, and
wherein the gate electrode is on the top surface, the bottom surface, and the first side surface, but not on the second side surface.

4. The semiconductor device of claim 3, further comprising an etch stop layer interposed between the first remaining pattern and the second side surface.

5. The semiconductor device of claim 1, wherein a top surface of the first spacer pattern has a concave profile, and
wherein a height of the top surface of the first spacer pattern increases with decreasing distance to the first gate cutting pattern.

6. The semiconductor device of claim 1, wherein a top surface of the first spacer pattern is lower than the uppermost one of the first semiconductor patterns with the substrate providing a base reference plane,
wherein at least one of the first semiconductor patterns is located below the uppermost one of the first semiconductor patterns, and
wherein the gate electrode borders an uppermost one of the first semiconductor patterns.

7. The semiconductor device of claim 1, wherein the first remaining pattern comprises:
a first pattern, which is adjacent to the outermost side surface of at least one of the first semiconductor patterns and extends in a direction generally perpendicular to a plane defined by the substrate;
a second pattern, which is interposed between the first gate cutting pattern and the second remaining pattern and extends in a direction generally perpendicular to a plane defined by the substrate; and
a third pattern, which connects the first pattern to the second pattern and is in physical contact with a bottom surface of the second remaining pattern.

8. The semiconductor device of claim 1, further comprising:
a second active pattern on the substrate;
a pair of second source/drain patterns on the second active pattern and a second channel pattern between the second source/drain patterns, the second channel pattern comprising second semiconductor patterns, which are spaced apart from each other in a stacked formation;
a second gate cutting pattern adjacent to the second channel pattern that penetrates the gate electrode; and
a second spacer pattern between the second gate cutting pattern and the second channel pattern,
wherein the second spacer pattern further comprises:
a third remaining pattern adjacent to an outermost side surface of at least one of the second semiconductor patterns of the second channel pattern; and
a fourth remaining pattern on the third remaining pattern,
wherein the gate electrode further comprises a second extended portion, which is in an upper portion thereof and overlaps the second spacer pattern in a direction generally perpendicular to a plane defined by the substrate.

9. The semiconductor device of claim 1, wherein the gate electrode further comprises an intervening portion interposed between the first gate cutting pattern and the first spacer pattern.

10. A semiconductor device, comprising:
a first active pattern and a second active pattern on a substrate;
a pair of first source/drain patterns on the first active pattern and a first channel pattern between the first source/drain patterns;
a pair of second source/drain patterns on the second active pattern and a second channel pattern between the second source/drain patterns, each of the first and second channel patterns comprising semiconductor patterns, which are spaced apart from each other in a stacked formation;
a gate electrode on the first and second channel patterns;
a first gate cutting pattern adjacent to the first channel pattern that penetrates the gate electrode; and
a first spacer pattern between the first gate cutting pattern and the first channel pattern,
wherein the first spacer pattern comprises:
a first remaining pattern adjacent to an outermost side surface of at least one of the semiconductor patterns; and
a second remaining pattern on the first remaining pattern, wherein the first and second remaining patterns comprise different materials from each other,
wherein the gate electrode comprises a first extended portion, which is in an upper portion thereof and overlaps the first spacer pattern in a direction generally perpendicular to a plane defined by the substrate, and a protruding portion, which is on the first extended portion, and
wherein a height of a top surface of the protruding portion increases with decreasing distance to the first gate cutting pattern.

11. The semiconductor device of claim 10, wherein the second remaining pattern is spaced apart from the first gate cutting pattern.

12. The semiconductor device of claim 10, further comprising:
a second gate cutting pattern adjacent to the second channel pattern that penetrates the gate electrode; and
a second spacer pattern between the second gate cutting pattern and the second channel pattern,
wherein the gate electrode further comprises a second extended portion, which is in the upper portion thereof and overlaps the second spacer pattern in the direction generally perpendicular to the plane defined by the substrate.

13. The semiconductor device of claim 10, wherein the first remaining pattern comprises:
a first pattern, which is adjacent to the outermost side surface of at least one of the semiconductor patterns and extends in the direction generally perpendicular to the plane defined by the substrate;
a second pattern, which is interposed between the first gate cutting pattern and the second remaining pattern and extends in the direction generally perpendicular to the plane defined by the substrate; and
a third pattern, which connects the first pattern to the second pattern and is in physical contact with a bottom surface of the second remaining pattern.

14. The semiconductor device of claim 13, wherein a width of the first pattern is greater than a width of the second remaining pattern.

15. A semiconductor device, comprising:
a first active pattern and a second active pattern on a substrate;
a pair of first source/drain patterns on the first active pattern and a first channel pattern between the first source/drain patterns;
a pair of second source/drain patterns on the second active pattern and a second channel pattern between the second source/drain patterns, each of the first and second channel patterns comprising semiconductor patterns, which are spaced apart from each other in a stacked formation;
a gate electrode on the first and second channel patterns;
a gate insulating layer interposed between the first and second channel patterns and the gate electrode;
a gate spacer on at least one side surface of the gate electrode;
a first gate cutting pattern provided adjacent to the first channel pattern that penetrates the gate electrode;
a second gate cutting pattern adjacent to the second channel pattern that penetrates the gate electrode;
a first spacer pattern between the first gate cutting pattern and the first channel pattern;
a gate capping pattern on the gate electrode and the first and second gate cutting patterns;
an interlayer insulating layer on the gate capping pattern;
an active contact that penetrates the interlayer insulating layer and is electrically connected to at least one of the first and second source/drain patterns;
a gate contact that penetrates the interlayer insulating layer and the gate capping pattern and is electrically connected to the gate electrode;
a first metal layer on the interlayer insulating layer, the first metal layer comprising first and second power lines, which are on the first and second gate cutting patterns, respectively, and first interconnection lines, which are between the first and second power lines, the first interconnection lines being electrically connected to the active contact and the gate contact; and
a second metal layer on the first metal layer,
wherein the second metal layer comprises second interconnection lines, which are electrically connected to the first metal layer,
wherein the first spacer pattern comprises:
a first remaining pattern adjacent to an outermost side surface of at least one of the semiconductor patterns of the first channel pattern; and
a second remaining pattern on the first remaining pattern,
wherein the first and second remaining patterns comprise different materials from each other, and
wherein the second remaining pattern is spaced apart from the first gate cutting pattern.

16. The semiconductor device of claim 15, further comprising:
a second spacer pattern between the second gate cutting pattern and the second channel pattern,
wherein the gate electrode comprises a first extended portion, which is in an upper portion thereof and overlaps the first spacer pattern in a direction generally perpendicular to a plane defined by the substrate, and a second extended portion, which overlaps the second spacer pattern in the direction generally perpendicular to the plane defined by the substrate.

17. The semiconductor device of claim 16, wherein the second spacer pattern comprises:
a third remaining pattern adjacent to an outermost side surface of at least one of the semiconductor patterns of the second channel pattern; and
a fourth remaining pattern on the third remaining pattern,
wherein the fourth remaining pattern is spaced apart from the second gate cutting pattern.

18. The semiconductor device of claim 15, wherein the gate electrode borders each of the semiconductor patterns of the second channel pattern.

19. The semiconductor device of claim 15, wherein the first remaining pattern comprises polysilicon, and
wherein the second remaining pattern comprises silicon nitride.

* * * * *